(12) United States Patent
Liu et al.

(10) Patent No.: US 12,211,433 B2
(45) Date of Patent: Jan. 28, 2025

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cong Liu, Beijing (CN); Binyan Wang, Beijing (CN); Tianyi Cheng, Beijing (CN); Feng Wei, Beijing (CN); Meng Li, Beijing (CN); Shiqian Dai, Beijing (CN); Kaipeng Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/592,002

(22) Filed: Feb. 29, 2024

(65) Prior Publication Data
US 2024/0203330 A1 Jun. 20, 2024

Related U.S. Application Data

(63) Continuation of application No. 18/004,385, filed as application No. PCT/CN2021/097303 on May 31, 2021.

(51) Int. Cl.
G09G 3/32 (2016.01)

(52) U.S. Cl.
CPC ....... *G09G 3/32* (2013.01); *G09G 2300/0426* (2013.01); *G09G 2310/0267* (2013.01); *G09G 2310/0286* (2013.01)

(58) Field of Classification Search
CPC ............. G09G 3/32; G09G 2300/0426; G09G 2310/0267; G09G 2310/0286; G09G 3/3266; H10K 77/10; G02F 1/133
See application file for complete search history.

(56) References Cited

U.S. PATENT DOCUMENTS

2014/0239264 A1* 8/2014 Kwak ................. H10K 59/131
                                                            438/34
2019/0288008 A1   9/2019 Park et al.
(Continued)

FOREIGN PATENT DOCUMENTS

CN        108598118 A    9/2018
CN        110660368 A    1/2020
(Continued)

OTHER PUBLICATIONS

Notice of Allowance dated Nov. 24, 2023 received in U.S. Appl. No. 18/004,385.
(Continued)

*Primary Examiner* — Pegeman Karimi
(74) *Attorney, Agent, or Firm* — Scully, Scott, Murphy & Presser, P.C.

(57) ABSTRACT

A display substrate and a manufacturing method thereof, and a display device are provided. In the display substrate, each signal line includes a first conductive portion; for at least one signal line, the display substrate includes a multi-layer insulating pattern on a side of the first conductive portion away from the base substrate; a first insulating pattern in the multi-layer insulating pattern includes a hollow, and an orthographic projection of the hollow on the base substrate is at least partially in a region surrounded by an orthographic projection of the first conductive portion on the base substrate; and for at least one clock signal line included in the at least one signal line, a ratio between a size of the hollow
(Continued)

in a first direction and a size of a shift register unit in the first direction ranges from ¾ to 1.

20 Claims, 14 Drawing Sheets

(56) References Cited

U.S. PATENT DOCUMENTS

2019/0333433 A1\* 10/2019 Zhu .................... G09G 3/20
2020/0004075 A1   1/2020 Yoshida
2020/0081289 A1   3/2020 Shin et al.
2020/0119127 A1\* 4/2020 Tian .................. G09G 3/3275
2021/0020707 A1\* 1/2021 Choi .................. H10K 59/353

FOREIGN PATENT DOCUMENTS

| CN | 110888277 A   | 3/2020 |
| CN | 112242426 A   | 1/2021 |
| WO | 2021077258 A1 | 4/2021 |

OTHER PUBLICATIONS

Office Action dated Aug. 10, 2033 received in U.S. Appl. No. 18/004,385.

\* cited by examiner

DISPLAY SUBSTRATE AND MANUFACTURING METHOD THEREOF, AND DISPLAY DEVICE

CROSS REFERENCE TO RELATED APPLICATIONS

This application is a continuation application of U.S. patent application Ser. No. 18/004,385 filed on Jan. 5, 2023, which is a U.S. National Phase Entry of International Application No. PCT/CN2021/097303 filed on May 31, 2021. All of the aforementioned patent applications are hereby incorporated by reference in their entireties.

TECHNICAL FIELD

Embodiments of the present disclosure relate to a display substrate and a manufacturing method thereof, and a display device.

BACKGROUND

In the field of display technology, a pixel array of such as a liquid crystal display panel or an organic light-emitting diode (OLED) display panel usually includes a plurality of rows of gate lines and a plurality of columns of data lines interlaced with the gate lines. The driving of the gate line can be realized by a bound integrated driving circuit. In recent years, with the continuous improvement of the preparation technology of amorphous silicon thin film transistors or oxide thin film transistors, a gate driving circuit may also be directly integrated on a thin film transistor array substrate to form a GOA (Gate Driver on Array), so as to drive the gate lines.

SUMMARY

At least an embodiment of the present disclosure provides a display substrate, and the display substrate comprises a base substrate, a first gate driving circuit, and a plurality of signal lines electrically connected to the first gate driving circuit; the base substrate comprises a display region and a peripheral region on at least one side of the display region; the first gate driving circuit and the plurality of signal lines are in the peripheral region of the base substrate; the first gate driving circuit comprises a plurality of cascaded shift register units, and the plurality of signal lines are configured to respectively provide a trigger signal, at least one clock signal, and at least one power signal to the cascaded shift register units; each of the plurality of signal lines comprises a first conductive portion; for at least one signal line in the plurality of signal lines, the display substrate comprises a multi-layer insulating pattern on a side of the first conductive portion of each signal line away from the base substrate, and at least one insulating pattern in the multi-layer insulating pattern covers a surface of a side of the first conductive portion away from the base substrate; the multi-layer insulating pattern comprises at least one first insulating pattern, the first insulating pattern comprises at least one hollow, and an orthographic projection of the at least one hollow on the base substrate is at least partially in a region surrounded by an orthographic projection of the first conductive portion on the base substrate; and a material of the first insulating pattern comprises an organic insulating material.

For example, in the display substrate provided by an embodiment of the present disclosure, the at least one hollow comprises one or more openings penetrating the first insulating pattern.

For example, in the display substrate provided by an embodiment of the present disclosure, the orthographic projection of the at least one hollow on the base substrate is within the region surrounded by the orthographic projection of the first conductive portion on the base substrate.

For example, in the display substrate provided by an embodiment of the present disclosure, for the at least one signal line, each signal line further comprises a second conductive portion, the second conductive portion is on a side of the first conductive portion away from the base substrate and is configured to be electrically connected to the first conductive portion, and at least one insulating pattern in the multi-layer insulating pattern covers a surface of a side of the second conductive portion away from the base substrate.

For example, in the display substrate provided by an embodiment of the present disclosure, for the at least one signal line, the second conductive portion is on a side of the first insulating pattern away from the first conductive portion, and the second conductive portion at least partially overlaps with the at least one hollow in the first insulating pattern in a direction perpendicular to the base substrate.

For example, in the display substrate provided by an embodiment of the present disclosure, the orthographic projection of the at least one hollow on the base substrate is in a region surrounded by an orthographic projection of the second conductive portion on the base substrate.

For example, in the display substrate provided by an embodiment of the present disclosure, for the at least one signal line, an orthographic projection of the second conductive portion on the base substrate is within the region surrounded by the orthographic projection of the first conductive portion on the base substrate.

For example, in the display substrate provided by an embodiment of the present disclosure, the at least one hollow in the first insulating pattern comprises a plurality of hollows, and the plurality of hollows are arranged in parallel and spaced apart from each other along an extending direction of each signal line on the base substrate.

For example, in the display substrate provided by an embodiment of the present disclosure, each signal line extends on the base substrate approximately in a first direction, and a ratio between a size of the hollow in the first direction and a size of a shift register unit in the first gate driving circuit in the first direction ranges from ¼ to 1.

For example, in the display substrate provided by an embodiment of the present disclosure, in a plane parallel to a main surface of the base substrate, a size of the hollow in a second direction different from the first direction is greater than or equal to 2 microns.

For example, the display substrate provided by an embodiment of the present disclosure further comprises a second gate driving circuit in the peripheral region of the base substrate and at least one output signal transmitting line electrically connected to the second gate driving circuit, an orthographic projection of the plurality of signal lines on the base substrate is between an orthographic projection of the first gate driving circuit on the base substrate and an orthographic projection of the second gate driving circuit on the base substrate, the at least one output signal transmitting line is configured to transmit an output signal of the second gate driving circuit to the display region, and each output signal transmitting line is insulated from any one of the plurality of signal lines.

For example, in the display substrate provided by an embodiment of the present disclosure, the second gate driving circuit is on a side of the first gate driving circuit away from the display region.

For example, in the display substrate provided by an embodiment of the present disclosure, the first conductive portion in each signal line and the at least one output signal transmitting line are respectively in different conductive layers of the display substrate.

For example, in the display substrate provided by an embodiment of the present disclosure, an orthographic projection of each of the at least one output signal transmitting line on the base substrate has no overlapping part with an orthographic projection of any one of the at least one hollow on the base substrate.

For example, in the display substrate provided by an embodiment of the present disclosure, the plurality of signal lines comprise a trigger signal line, at least one clock signal line, and at least one power signal line; the trigger signal line is configured to be connected to a first-stage shift register unit in the plurality of cascaded shift register units to provide the trigger signal to the first-stage shift register unit; the at least one clock signal line is configured to provide the at least one clock signal to the plurality of cascaded shift register units; and the at least one power signal line is configured to provide the at least one power signal to the plurality of cascaded shift register units.

For example, in the display substrate provided by an embodiment of the present disclosure, the at least one clock signal line comprises a first clock signal line and a second clock signal line, and the first clock signal line and the second clock signal line are respectively configured to provide a first clock signal or a second clock signal to respective shift register units; and the trigger signal line, the first clock signal line, and the second clock signal line respectively extend along a first direction on the base substrate and are arranged in parallel along a second direction different from the first direction.

For example, in the display substrate provided by an embodiment of the present disclosure, the at least one signal line among the plurality of signal lines comprises the first clock signal line, and for the first clock signal line, a ratio between a size of the hollow in the first direction and a size of a shift register unit in the first gate driving circuit in the first direction ranges from ¾ to 1; and/or the at least one signal line among the plurality of signal lines comprises the second clock signal line, and for the second clock signal line, a ratio between a size of the hollow in the first direction and a size of a shift register unit in the first gate driving circuit in the first direction ranges from ¾ to 1.

For example, in the display substrate provided by an embodiment of the present disclosure, an orthographic projection of the trigger signal line on the base substrate is on a side of an orthographic projection of the first clock signal line and the second clock signal line on the base substrate away from the display region.

For example, in the display substrate provided by an embodiment of the present disclosure, the at least one signal line among the plurality of signal lines comprises the trigger signal line, and for the trigger signal line, a ratio between a size of the hollow in the first direction and a size of a shift register unit in the first gate driving circuit in the first direction ranges from ⅓ to ½.

For example, in the display substrate provided by an embodiment of the present disclosure, a ratio between a width of the first clock signal line in the second direction and a width of the trigger signal line in the second direction is greater than or equal to 1 and less than or equal to 3, and a ratio between a width of the second clock signal line in the second direction and a width of the trigger signal line in the second direction is greater than or equal to 1 and less than or equal to 3.

For example, in the display substrate provided by an embodiment of the present disclosure, an orthographic projection of the at least one power signal line on the base substrate is on a side of an orthographic projection of the first clock signal line and the second clock signal line on the base substrate close to the display region.

For example, in the display substrate provided by an embodiment of the present disclosure, the at least one power signal line comprises a first power signal line extending in the first direction, the orthographic projection of the first clock signal line and the second clock signal line on the base substrate is on a side of an orthographic projection of the first gate driving circuit on the base substrate away from the display region, and an orthographic projection of the first power signal line on the base substrate is between the orthographic projection of the first gate driving circuit on the base substrate and the orthographic projection of the first clock signal line and the second clock signal line on the base substrate.

For example, in the display substrate provided by an embodiment of the present disclosure, a ratio between a width of the first clock signal line in the second direction and a width of the first power signal line in the second direction is greater than or equal to 1 and less than or equal to 3, and a ratio between a width of the second clock signal line in the second direction and a width of the first power signal line in the second direction is greater than or equal to 1 and less than or equal to 3.

At least one embodiment of the present disclosure further provides a display device, and the display device comprises the display substrate according to any one of the embodiments of the present disclosure.

At least one embodiment of the present disclosure further provides a manufacturing method of the display substrate according to any one of the embodiments of the present disclosure, and the manufacturing method comprises: providing the base substrate; and forming the first gate driving circuit and the plurality of signal lines on the base substrate; forming the first gate driving circuit and the plurality of signal lines on the base substrate comprises: sequentially forming a semiconductor layer, a first insulating layer, a first conductive layer, a second insulating layer, a second conductive layer, a third insulating layer, and a third conductive layer in a direction perpendicular to the base substrate; an active layer of each transistor in each shift register unit is in the semiconductor layer, a gate electrode of each transistor and a first electrode of each capacitor are in the first conductive layer, a second electrode of each capacitor is in the second conductive layer, and the plurality of signal lines are at least in the third conductive layer; and respective transistors and respective capacitors are connected to each other and connected to the plurality of signal lines through via holes penetrating the first insulating layer, the second insulating layer or the third insulating layer.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

Figure 1A:
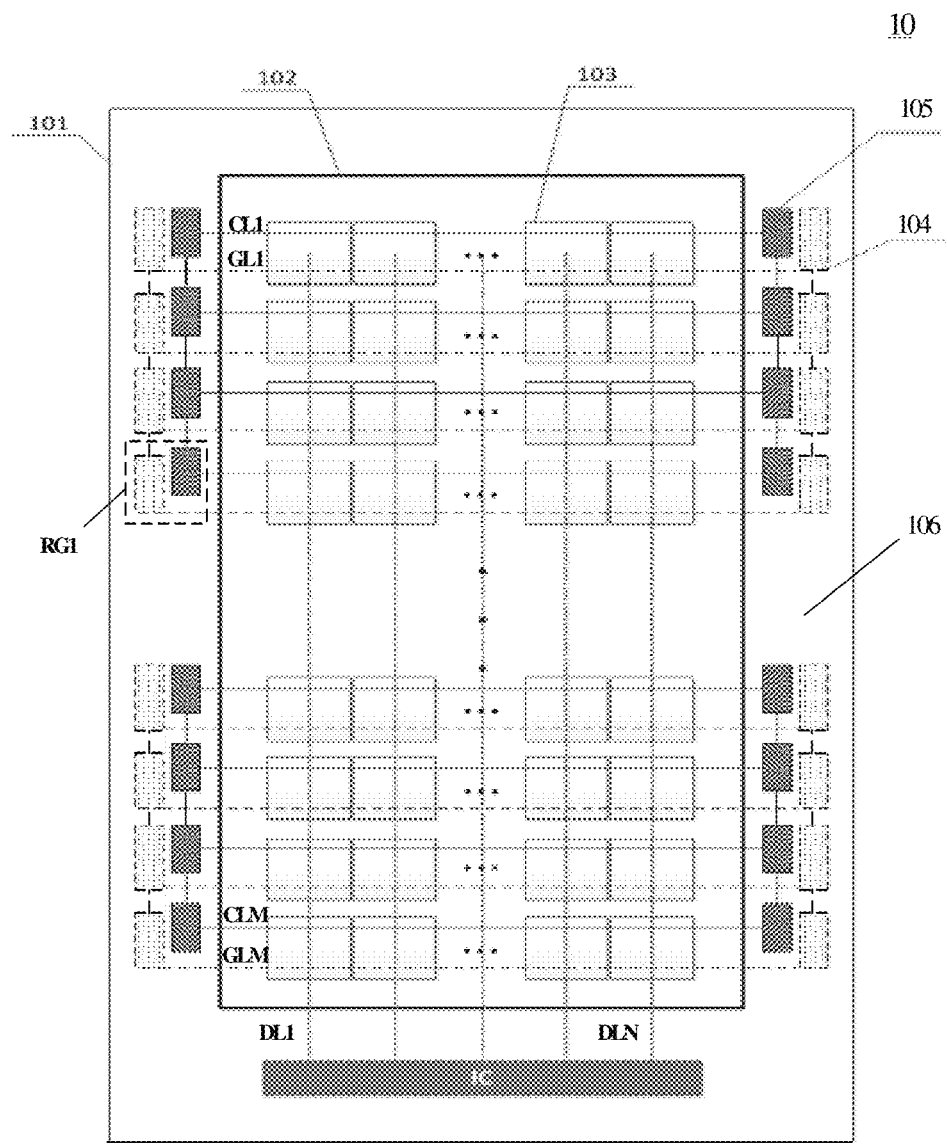
FIG. 1A is a schematic diagram of an overall circuit architecture of a display substrate provided by at least one embodiment of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect," "connected," "coupled," etc., are not intended to define a physical connection or mechanical connection, but may include an electrical connection, directly or indirectly. "On," "under," "right," "left," and the like are only used to indicate relative position relationship, and when the position of the object which is described is changed, the relative position relationship may be changed accordingly.

In the following, the present disclosure is described through several specific embodiments. In order to keep the following description of the embodiments of the present disclosure clear and concise, detailed descriptions of known functions and known components may be omitted. In the case that any component of an embodiment of the present disclosure appears in more than one drawing, the component is represented by the same reference numeral in each drawing.

During the preparation process of display product, an organic insulating film layer in the display product may release a large amount of gas during the formation process, and the released gas will easily lift other film layers or structures such as a metal film layer above the organic insulating film layer. Therefore, part of the organic insulating film layer is usually removed to form a groove-shaped opening, so that the gas released during the preparation process of the organic insulating film layer can be discharged through the groove-shaped opening, thus avoiding damage or adverse effects on other film layers or structures above the organic insulating film layer.

At present, for the market, the display product with a narrow frame may have more competitive advantages and may also be favored by more consumers. However, in general, because a large area of the organic insulating film layer needs to be formed in the frame region of the display product, in order to ensure the exhaust effect of the organic insulating film layer, it is necessary to form a large-sized groove-shaped opening in the organic insulating film layer in the frame region, which leads to a large layout space in the frame region of the display product and is not conducive to the narrow frame design of the display product.

At least one embodiment of the present disclosure provides a display substrate, and the display substrate includes: a base substrate, including a display region and a peripheral region on at least one side of the display region; and a first gate driving circuit and a plurality of signal lines electrically connected to the first gate driving circuit in the peripheral region of the base substrate. The first gate driving circuit includes a plurality of cascaded shift register units, and the plurality of signal lines are configured to respectively provide a trigger signal, at least one clock signal, and at least one power signal to the cascaded shift register units; each of the plurality of signal lines includes a first conductive portion; for at least one signal line in the plurality of signal lines, the display substrate includes a multi-layer insulating pattern on a side of the first conductive portion of each signal line away from the base substrate, and at least one insulating pattern in the multi-layer insulating pattern covers a surface of a side of the first conductive portion away from the base substrate; the multi-layer insulating pattern includes at least one first insulating pattern, the first insulating pattern includes at least one hollow, and an orthographic projection of the at least one hollow on the base substrate is at least partially in a region surrounded by an orthographic projection of the first conductive portion on the base substrate; and a material of the first insulating pattern includes an organic insulating material.

At least one embodiment of the present disclosure further provides a display device corresponding to the above display substrate and a manufacturing method of the display substrate.

In the display substrate provided by the above embodiment of the present disclosure, the orthographic projection of the hollow in the first insulating pattern on the base substrate is partially or completely located in the region surrounded by the orthographic projection of the first conductive portion of the signal line on the base substrate, so that the hollow in the first insulating pattern at least partially overlaps with the first conductive portion of the signal line in the direction perpendicular to a main surface of the base substrate. Therefore, the gas released by the organic insulating material in the first insulating pattern during the preparation process can be discharged through the hollow, and the space occupied by the hollow in the first insulating pattern in the plane parallel to the main surface of the base substrate can also be reduced, so that the layout space occupied by the hollow in the first insulating pattern in the peripheral region of the base substrate can be reduced, which is beneficial to the narrow frame design of the display substrate.

Hereinafter, the embodiments of the present disclosure will be described in detail with reference to the accompanying drawings. It should be noted that the same reference numerals in different drawings will be used to refer to the same described elements.

Figure 1B:
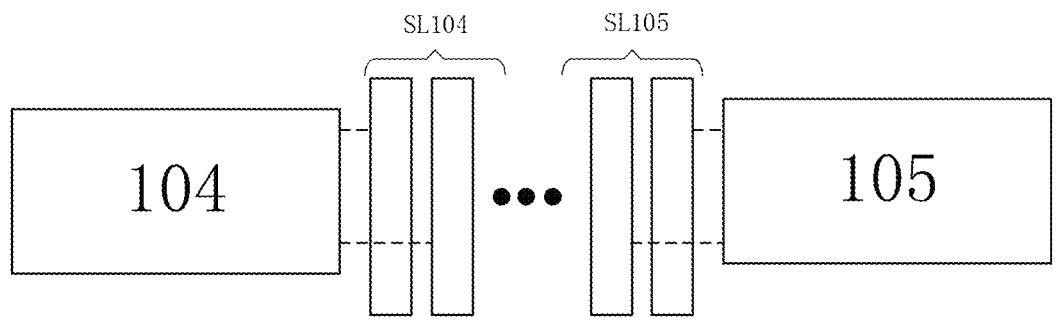
FIG. 1B is a partially enlarged schematic diagram of an example of a region RG1 illustrated in FIG. 1A.

FIG. 1A is a schematic diagram of an overall circuit architecture of a display substrate provided by at least one embodiment of the present disclosure, and FIG. 1B is a partially enlarged schematic diagram of an example of a region RG1 illustrated in FIG. 1A.

For example, as illustrated in FIG. 1A, 101 denotes an overall outline of the display substrate 10. The display substrate 10 includes a display region 102 (for example, the display region 102 may also be referred to as a pixel array region) and a peripheral region 106 located on at least one side of the display region 102. The display region 102 includes a plurality of pixel units 103 arranged in an array. For example, each of the pixel units 103 includes a pixel circuit and for example, may further include a light-emitting element (not shown). The peripheral region 106 includes a plurality of cascaded first shift register units 105 and a plurality of cascaded second shift register units 104, or may further include a plurality of cascaded third shift register units, fourth shift register units, or the like (not shown). For example, in some embodiments, the third shift register unit may be located on a side of the first shift register unit 105 and the second shift register unit 104 close to the display region 102; alternatively, in some embodiments, the third shift register unit may also be located on a side of the first shift register unit 105 and the second shift register unit 104 away from the display region 102; alternatively, in some embodiments, the third shift register unit may also be located between the first shift register unit 105 and the second shift register unit 104; and the embodiments of the present disclosure are not limited in this aspect.

For example, taking the first shift register unit 105 and the second shift register unit 104 as an example, the plurality of cascaded first shift register units 105 form a corresponding gate driving circuit array (e.g., the first gate driving circuit), and the plurality of cascaded second shift register units 104 form a corresponding gate driving circuit array (e.g., the second gate driving circuit). For example, the output terminals of the first shift register unit 105 and the second shift register unit 104 are electrically connected to pixel circuits in each row of pixel units 103 in the display region 102, respectively, to provide corresponding output signals to the pixel circuits in each row of pixel units 103, so as to drive the light-emitting elements connected to the pixel circuits to emit light through the pixel circuits. For example, the pixel circuit may be a pixel circuit in the art, including circuit structures, such as 7T1C, 2T1C, 4T2C, 8T2C, etc., and details are not described here.

The first shift register unit 105 and the second shift register unit 104 (as well as the third shift register unit, the fourth shift register unit, etc.) may be one of shift register units for realizing different functions or operations, such as a scan driving shift register unit, a light-emitting control shift register unit, a reset control shift register unit, or the like. For example, the plurality of cascaded scan driving shift register units constitute a gate scan driving circuit (Gate GOA) for providing such as a row-by-row shifted gate scanning signal to the pixel units 103 arranged in an array in the display region 102 of the display substrate 10; the plurality of cascaded reset control shift register units constitute a reset control driving circuit array for providing such as a row-by-row shifted reset control signal to the pixel units 103 arranged in an array in the display region 102 of the display substrate 10, that is, the gate driving circuit for outputting the reset control signal; and the plurality of cascaded light-emitting control shift register units constitute a light-emitting control driving circuit array for providing such as a row-by-row shifted light-emitting control signal to the pixel units 103 arranged in an array in the display region 102 of the display substrate 10, that is, the gate driving circuit for outputting the light-emitting control signal.

For example, in some embodiments, the first shift register unit 105 is a scan driving shift register unit or a reset control shift register unit, and the second shift register unit 104 is a reset control shift register unit or a scan driving shift register unit. For example, in some embodiments, the first shift register unit 105 is a scan driving shift register unit or a light-emitting control shift register unit, and the second shift register unit 104 is a light-emitting control shift register unit or a scan driving shift register unit. For example, in some embodiments, the first shift register unit 105 is a light-emitting control shift register unit or a reset control shift register unit, and the second shift register unit 104 is a reset control shift register unit or a light-emitting control shift register unit. Alternatively, the first shift register unit 105 and the second shift register unit 104 may also be shift register units for implementing other different functions or operations, and the embodiments of the present disclosure are not limited in this aspect.

As illustrated in FIG. 1A, a plurality of data lines DL1 to DLN (N is an integer greater than 1) connected to a data driving chip IC longitudinally pass through the display region 102 to provide data signals for the pixel units 103 arranged in an array. A plurality of groups of gate lines CL1 to CLM (M is an integer greater than 1) and GL1 to GLM (M is an integer greater than 1) connected to the output terminal of the first shift register unit 105 and the output terminal of the second shift register unit 104 transversely pass through the display region 102 to provide, for example, a gate scanning signal, a reset control signal, a light-emitting control signal, or the like for the pixel units 103 arranged in an array. For example, each pixel unit 103 may include a light-emitting element and a pixel circuit with a circuit structure of such as 7T1C, 8T2C, 4T1C, or the like in the art. The pixel circuit operates under the control of a data signal transmitted through the data line and a gate scanning signal, a reset control signal, a light-emitting control signal or the like transmitted through the gate line, so as to drive the light-emitting element to emit light, thereby realizing display and other operations. The light-emitting element may be, for example, an organic light-emitting diode (OLED) or a quantum dot light-emitting diode (QLED).

For example, as illustrated in FIG. 1A and FIG. 1B, the plurality of signal lines SL105 and SL104 are arranged between the first shift register unit 105 and the second shift register unit 104. The plurality of signal lines SL105 are electrically connected to the plurality of cascaded first shift register units 105, and are configured to provide required signals to the plurality of cascaded first shift register units 105, such as a trigger signal, a clock signal, a power signal, etc., so that the plurality of cascaded first shift register units 105 provide required output signals to the pixel units 103 in the display region 102 through the plurality of groups of gate lines CL1~CLM under the control of the signals provided by the plurality of signal lines SL105. The plurality of signal lines SL104 are electrically connected to the plurality of cascaded second shift register units 104, and are configured to provide required signals to the plurality of cascaded second shift register units 104, such as a trigger signal, a clock signal, a power signal, etc., so that the plurality of cascaded second shift register units 104 provide required output signals to the pixel units 103 in the display region 102 through the plurality of groups of gate lines GL1~GLM under the control of the signals provided by the plurality of signal lines SL104.

The following embodiments of the present disclosure take the case that the first shift register unit 105 is a reset control shift register unit as an example, and specifically describe the technical solutions provided by the embodiments of the present disclosure based on the plurality of signal lines SL105 electrically connected to the plurality of cascaded first shift register units 105. However, it should be noted that this case does not constitute a limitation on the embodiments of the present disclosure, which include but are not limited to this case. For example, the second shift register unit 104 may be a scan driving shift register unit, a light-emitting control shift register unit, or the like, and the embodiments of the present disclosure are not particularly limited in this aspect. For convenience and conciseness, in the following, the first shift register unit 105 will be simply referred to as the shift register unit for description.

Figure 2A:
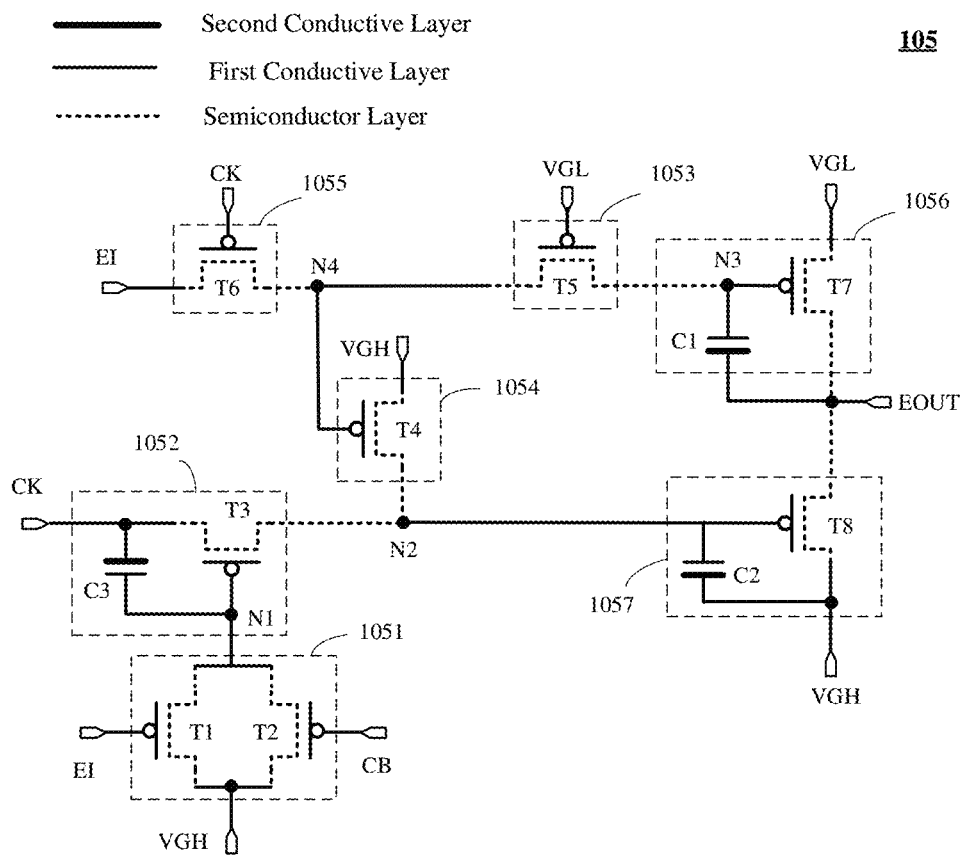
FIG. 2A is a circuit diagram of an example of a shift register unit in a display substrate provided by at least one embodiment of the present disclosure.
Figure 3:
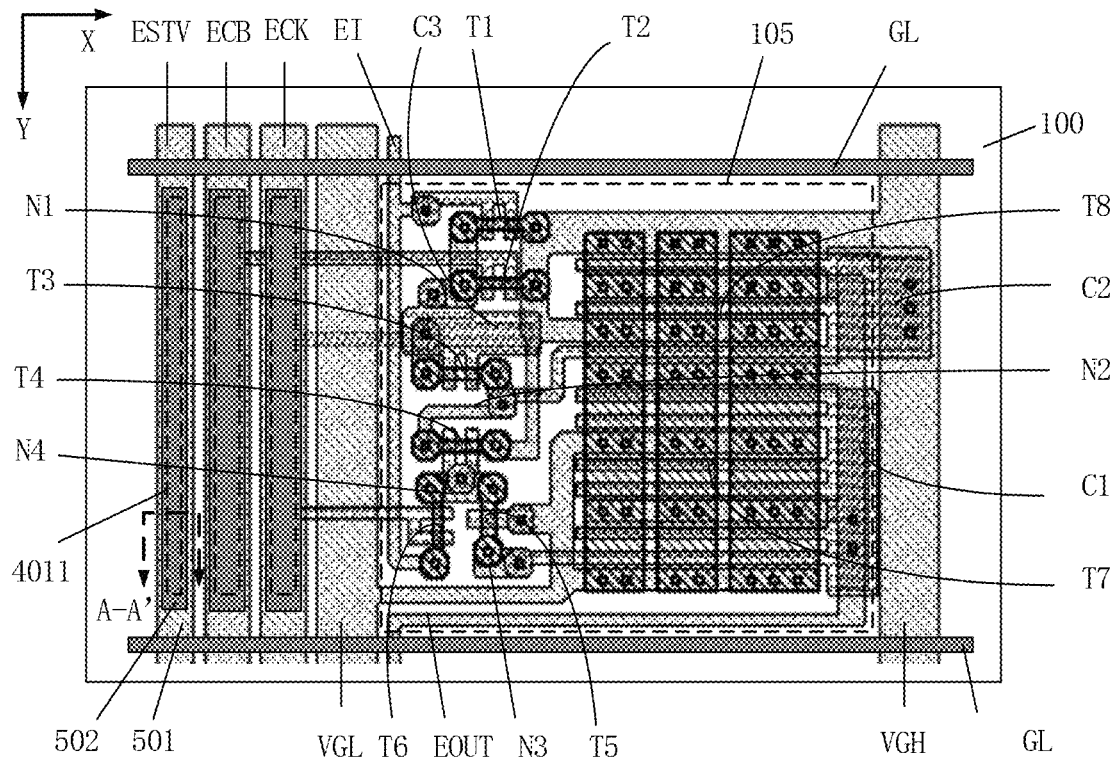
FIG. 3 is a schematic layout diagram of a display substrate provided by at least one embodiment of the present disclosure.

In order to more clearly describe the technical solutions of the embodiments of the present disclosure, the embodiments of the present disclosure take the circuit structure and layout structure of the shift register unit 105 illustrated in FIG. 2A and FIG. 3 as an example to describe the display substrate provided by the embodiments of the present disclosure. However, it should be noted that the circuit structure and layout structure of the shift register unit 105 include, but are not limited to, this case. In other words, the shift register unit 105 may also adopt other suitable circuit structures or layout structures, and the embodiments of the present disclosure are not limited in this aspect.

Figure 2B:
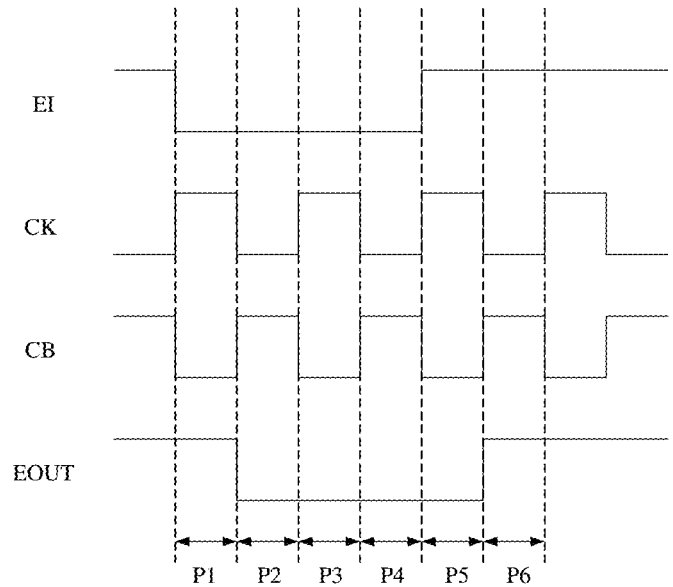
FIG. 2B is a signal timing diagram of the shift register unit illustrated in FIG. 2A in operation.

For example, FIG. 2A is a circuit diagram of an example of a shift register unit in a display substrate provided by at least one embodiment of the present disclosure, and FIG. 2B is a signal timing diagram of the shift register unit illustrated in FIG. 2A in operation. In the following, the circuit structure and working process of the shift register unit 105 (for example, a reset control shift register unit) will be briefly introduced with reference to FIG. 2A and FIG. 2B. It should be noted that the circuit structure illustrated in FIG. 2A is only an example of the implementation of the shift register unit 105, the shift register unit 105 may also adopt other suitable circuit structures, and the embodiments of the present disclosure are not limited in this aspect.

For example, as illustrated in FIG. 2A, in some examples, the shift register unit 105 includes a first node control circuit 1051, a second node control circuit 1052, a third node control circuit 1053, a second node noise reduction circuit 1054, an input circuit 1055, an output circuit 1056, and an output control circuit 1057.

For example, a first clock signal terminal CK in the shift register unit 105 is connected to a first clock signal line or a second clock signal line to receive a first clock signal. For example, in the case where the first clock signal terminal CK is connected to the first clock signal line, the first clock signal line provides the first clock signal; and in the case where the first clock signal terminal CK is connected to the second clock signal line, the second clock signal line provides the first clock signal. Details depend on the actual situation, and the embodiments of the present disclosure are not limited in this aspect. Similarly, a second clock signal terminal CB in the shift register unit 105 is connected to the second clock signal line or the first clock signal line to receive a second clock signal. The following is described by taking the case that the first clock signal terminal CK is connected to the first clock signal line to receive the first clock signal, and the second clock signal terminal CB is connected to the second clock signal line to receive the second clock signal as an example. However, it should be noted that the embodiments of the present disclosure are not particularly limited to this case. For example, the first clock signal and the second clock signal may be pulse signals with a duty ratio greater than 50% and may differ from each other, for example, by half a cycle.

For example, VGL may represent a first power signal line and a first voltage provided by the first power signal line, VGH may represent a second power signal line and a second voltage provided by the second power signal line, and the second voltage is greater than the first voltage. For example, the first voltage may be a direct-current low level, and the second voltage may be a direct-current high level. For example, N1, N2, N3 and N4 respectively represent a first node, a second node, a third node, and a fourth node in the circuit diagram.

The first node control circuit 1051 is configured to input the second voltage to the first node N1 under the control of the input signal and the second clock signal, thereby controlling the level of the first node N1. For example, the first node control circuit 1051 is connected to the second power signal line VGH, the input terminal EI, the second clock signal terminal CB, and the first node N1, and is configured to be turned on under the control of the input signal received by the input terminal EI and the second clock signal received by the second clock signal terminal CB, so that the second power signal line VGH is connected to the first node N1 to input the second voltage provided by the second power signal line VGH to the first node N1, thereby controlling the level of the first node N1.

The second node control circuit 1052 is configured to input the first clock signal to the second node N2 in response to the level of the first node N1, thereby controlling the level of the second node N2. For example, the second node control circuit 1052 is connected to the first clock signal terminal CK, the first node N1, and the second node N2, and is configured to be turned on under the control of the level of the first node N1 to input the first clock signal to the second node N2, so as to control the level of the second node N2.

It should be noted that the second node control circuit 1052 is not limited to being connected to the first node N1 and may also be connected to another independent voltage terminal (for example, a signal terminal providing the same voltage as that of the first node N1) or a separately provided circuit which is identical to the first node control circuit 1051, and the embodiments of the present disclosure are not limited in this aspect.

The output control circuit 1057 is configured to output the second voltage to the output terminal EOUT in response to the level of the second node N2. For example, the output control circuit 1057 is connected to the second node N2, the second power signal line VGH, and the output terminal EOUT, and is configured to be turned on under the control of the level of the second node N2, so that the second power signal line VGH is connected to the output terminal EOUT, thereby outputting the second voltage as the output signal at the output terminal EOUT.

It should be noted that the output control circuit 1057 is not limited to being connected to the second node N2 and may also be connected to another independent voltage terminal (for example, a signal terminal providing the same voltage as that of the second node N2) or a separately provided circuit which is identical to the second node control circuit 1052, and the embodiments of the present disclosure are not limited in this aspect.

The input circuit 1055 is configured to input the input signal to the fourth node N4 in response to the first clock signal. For example, the input circuit 1055 is connected to the input terminal EI, the fourth node N4, and the first clock signal terminal CK, and is configured to be turned on under the control of the first clock signal received by the first clock signal terminal CK to connect the input terminal EI to the fourth node N4, thereby inputting the input signal received by the input terminal EI to the fourth node N4. For example, in the case where the shift register unit 105 is a first-stage shift register unit, the input terminal EI is connected to the trigger signal line to receive the trigger signal; and in the case where the shift register unit 105 is a shift register unit at other stages except for the first-stage shift register unit, the input terminal EI is connected to an output terminal EOUT of the shift register unit at a previous stage.

The second node noise reduction circuit 1054 is configured to input the second voltage to the second node N2 in response to the level of the fourth node N4 to reduce the noise of the second node N2. For example, the second node noise reduction circuit 1054 is connected to the second power signal line VGH, the second node N2, and the fourth node N4, and is configured to be turned on under the control of the level of the fourth node N4, so that the second node N2 is connected to the second power signal line VGH, thereby maintaining the voltage of the second node N2 at a high level to reduce the noise of the second node N2.

It should be noted that the second node noise reduction circuit 1054 is not limited to being connected to the fourth node N4, and may also be connected to other independent voltage terminals (for example, a signal terminal that provides the same voltage as that of the fourth node N4) or a separately provided circuit that is the same as the input circuit 1055. The embodiments of the present disclosure are not limited in this aspect.

The third node control circuit 1053 is configured to control the level of the third node N3 under the control of the first voltage. For example, the third node control circuit 1053 is connected to the first power signal line VGL, the third node N3, and the fourth node N4, and is configured to be turned on under the control of the first voltage provided by the first power signal line VGL to input the level of the fourth node N4 to the third node N3.

It should be noted that the third node control circuit 1053 is not limited to being connected to the fourth node N4 and may also be connected to other independent voltage terminals (for example, a signal terminal providing the same voltage as that of the fourth node N4) or a separately provided circuit which is identical to the input circuit 1055, and the embodiments of the present disclosure are not limited in this aspect.

The output circuit 1056 is configured to output the first voltage to the output terminal EOUT in response to the level of the third node N3. For example, the output circuit 1056 is connected to the third node N3, the output terminal EOUT, and the first power signal line VGL, and is configured to be turned on under the control of the level of the third node N3, so that the first power signal line VGL and the output terminal EOUT are connected, thereby outputting the first voltage as an output signal at the output terminal EOUT.

It should be noted that the output circuit 1056 is not limited to being connected to the third node N3 and may also be connected to other independent voltage terminals (for example, a signal terminal providing the same voltage as that of the third node N3) or a separately provided circuit which is identical to the third node control circuit 1053, and the embodiments of the present disclosure are not limited in this aspect.

For example, as illustrated in FIG. 2A, the first node control circuit 1051 may be implemented as a first control transistor T1 and a second control transistor T2. A gate electrode of the first control transistor T1 is connected to the input terminal EI, a first electrode of the first control transistor T1 is connected to the second power signal line VGH to receive the second voltage, and a second electrode of the first control transistor T1 is connected to the first node N1. For example, in the case where the shift register unit 105 is a first-stage shift register unit, the input terminal EI is connected to the trigger signal line to receive the trigger signal; and in the case where the shift register unit 105 is a shift register unit at other stages except for the first-stage shift register unit, the input terminal EI is connected to the output terminal EOUT of the shift register unit at the previous stage. A gate electrode of the second control transistor T2 is connected to the second clock signal terminal CB to receive the second clock signal, a first electrode of the second control transistor T2 is connected to the second power signal line VGH to receive the second voltage, and a second electrode of the second control transistor T2 is connected to the first node N1.

For example, the second node control circuit 1052 may be implemented as a third control transistor T3 and a third capacitor C3. A gate electrode of the third control transistor T3 is connected to the first node N1, a first electrode of the third control transistor T3 is connected to the first clock signal terminal CK to receive the first clock signal, and a second electrode of the third control transistor T3 is connected to the second node N2. A first electrode of the third capacitor C3 is connected to the first node N1, and a second electrode of the third capacitor C3 is connected to the first clock signal terminal CK to receive the first clock signal.

For example, the output control circuit 1057 may be implemented as an output control transistor T8 and a second capacitor C2. A gate electrode of the output control transistor T8 is connected to the second node N2, a first electrode of the output control transistor T8 is connected to the second power signal line VGH to receive the second voltage, and a second electrode of the output control transistor T8 is connected to the output terminal EOUT. A first electrode of the second capacitor C2 is connected to the second node N2, and a second electrode of the second capacitor C2 is connected to the second power signal line VGH to receive the second voltage.

For example, the input circuit 1055 may be implemented as an input transistor T6. A gate electrode of the input transistor T6 is connected to the first clock signal terminal CK to receive the first clock signal, a second electrode of the input transistor T6 is connected to the input terminal EI, and a first electrode of the input transistor T6 is connected to the fourth node N4. For example, in the case where the plurality of shift register units 105 are cascaded to constitute the first gate driving circuit, the second electrode of the input transistor T6 in the first-stage shift register unit 105 is connected to the input terminal EI, and the input terminal EI is configured to be connected to the trigger signal line to receive the trigger signal as the input signal, while the second electrode of the input transistor T6 in the shift register unit 105 at other stages is electrically connected to the output terminal EOUT of the shift register unit 105 at the previous stage to receive the output signal output by the output terminal EOUT of the shift register unit 105 at the previous stage as the input signal, thereby realizing shift output, so as to provide a reset control signal, such as row-by-row shift, to the pixel units 103 arranged in the array in the display region 102 of the display substrate 10.

For example, the second node noise reduction circuit 1054 may be implemented as a fourth control transistor T4.

A gate electrode of the fourth control transistor T4 is connected to the fourth node N4, a first electrode of the fourth control transistor T4 is connected to the second node N2, and a second electrode of the fourth control transistor T4 is connected to the second power signal line VGH to receive the second voltage.

For example, the third node control circuit 1053 may be implemented as a fifth control transistor T5. A gate electrode of the fifth control transistor T5 is connected to the first power signal line VGL to receive the first voltage, a first electrode of the fifth control transistor T5 is connected to the fourth node N4, and a second electrode of the fifth control transistor T5 is connected to the third node N3.

For example, the output circuit 1056 may be implemented as an output transistor T7 and a first capacitor C1. A gate electrode of the output transistor T7 is connected to the third node N3, a first electrode of the output transistor T7 is connected to the first power signal line VGL to receive the first voltage, and a second electrode of the output transistor T7 is connected to the output terminal EOUT. A first electrode of the first capacitor C1 is connected to the third node N3, and a second electrode of the first capacitor C1 is connected to the output terminal EOUT.

The transistors in the shift register unit 105 illustrated in FIG. 2A are all exemplified by P-type transistors, that is, each transistor is turned on when the gate electrode is connected with a low level (a turn-on level) and turned off when the gate electrode is connected with a high level (a turn-off level). In this case, the first electrode of the transistor may be a source electrode, and the second electrode of the transistor may be a drain electrode.

It should be noted that the shift register unit 105 includes, but is not limited to, the configuration illustrated in FIG. 2A. For example, transistors in the shift register unit 105 may also adopt an N-type transistor or a mixture of P-type transistors and N-type transistors, and it is only necessary to connect the electrode polarity of the selected type of transistor according to the electrode polarity of the corresponding transistor in the embodiments of the present disclosure.

It should be noted that the transistors used in the shift register unit 105 may all be thin film transistors, field effect transistors, or other switching devices with the same characteristics, and the thin film transistor is taken as an example here for description. For example, an active layer (a channel region) of the transistor may be made of a semiconductor material, such as polysilicon (e.g., low-temperature polysilicon or high-temperature polysilicon), amorphous silicon, indium gallium tin oxide (IGZO), etc., while the gate electrode, source electrode, drain electrode or the like may be made of a metal material, such as metal aluminum, aluminum alloy, etc. The source electrode and drain electrode of the transistor used here can be symmetrical in structure, so the source electrode and drain electrode can be indistinguishable in structure. In the embodiments of the present disclosure, in order to distinguish the two electrodes of the transistor except for the gate electrode, one of them is directly described as the first electrode and the other is the second electrode. In addition, in the embodiments of the present disclosure, the electrode of the capacitor may be a metal electrode, or one of the electrodes may use a semiconductor material (for example, doped polysilicon).

The operation process of the shift register unit 105 will be described in detail with reference to FIG. 2A and FIG. 2B. For example, the working principle of the first-stage shift register unit 105 is taken as an example for description, the working principle of the shift register unit 105 at other stages is similar to that, and details are not repeated here.

As illustrated in FIG. 2B, the operation process of the shift register unit 105 includes six phases, namely, a first phase P1, a second phase P2, a third phase P3, a fourth phase P4, a fifth phase P5, and a sixth phase P6. FIG. 2B shows the timing waveforms of signals in each phase.

In the first phase P1, as illustrated in FIG. 2B, the first clock signal line provides a high level, therefore the first clock signal terminal CK connected to the first clock signal line receives a high-level first clock signal, and the input transistor T6 is turned off. Due to the storage effect of the first capacitor C1, the level of the third node N3 can be kept at a high level, so that the output transistor T7 is turned off. The fifth control transistor T5 is turned on in response to the second voltage with a low level, so that the level of the fourth node N4 becomes a high level, and the fourth control transistor T4 is turned off. The trigger signal line provides a low level, therefore the input terminal EI connected to the trigger signal line receives a low-level trigger signal, and the first control transistor T1 is turned on. The second clock signal line provides a low level, therefore the second clock signal terminal CB connected to the second clock signal line receives the second clock signal with a low level, and the second control transistor T2 is turned on. The high-level second voltage is transmitted to the first node N1 through the first control transistor T1 and the second control transistor T2 which are turned on, so that the level of the first node N1 becomes a high level and the third control transistor T3 is turned off. Due to the storage effect of the second capacitor C2, the level of the second node N2 can be kept at a low level, so that the output control transistor T8 is turned on. The high-level second voltage is transmitted to the output terminal EOUT through the turned-on output control transistor T8. Therefore, in the first phase P1, the output signal output by the output terminal EOUT of the shift register unit 105 is at a high level.

In the second phase P2, as illustrated in FIG. 2B, the input terminal EI receives a low-level trigger signal provided by the trigger signal line, and the first control transistor T1 is turned on. The second clock signal terminal CB receives a high-level second clock signal provided by the second clock signal line, and the second control transistor T2 is turned off. The high-level second voltage is transmitted to the first node N1 through the turned-on first control transistor T1, so that the level of the first node N1 becomes a high level, and the third control transistor T3 is turned off. The first clock signal terminal CK receives a low-level first clock signal provided by the first clock signal line, and the input transistor T6 is turned on. Because the input terminal EI receives the low-level trigger signal provided by the trigger signal line, the level of the fourth node N4 becomes a low level, so that the fourth control transistor T4 is turned on. The high-level second voltage is transmitted to the second node N2 through the turned-on fourth control transistor T4, so that the output control transistor T8 is turned off. The fifth control transistor T5 is turned on in response to the low-level first voltage, so that the level of the third node N3 becomes a low level. Therefore, the output transistor T7 is turned on, and the low-level first voltage is transmitted to the output terminal EOUT through the turned-on output transistor T7. Therefore, in the second phase P2, the output signal output by the output terminal EOUT of the shift register unit 105 is at a low level.

In the third phase P3, as illustrated in FIG. 2B, the input terminal EI receives a low-level trigger signal provided by the trigger signal line, and the first control transistor T1 is turned on. The second clock signal terminal CB receives a low-level second clock signal provided by the second clock signal line, and the second control transistor T2 is turned on. The high-level second voltage is transmitted to the first node N1 through the first control transistor T1 and the second control transistor T2 which are turned on, so that the level of the first node N1 becomes a high level and the third control transistor T3 is turned off. Due to the storage function of the second capacitor C2, the level of the second node N2 can be kept at a high level, so that the output control transistor T8 is turned off. The first clock signal terminal CK receives a high-level first clock signal provided by the first clock signal line, and the input transistor T6 is turned off. Due to the storage function of the first capacitor C1, the level of the third node N3 can be kept at a low level, so that the output transistor T7 is turned on, and the low-level first voltage is transmitted to the output terminal EOUT through the turned-on output transistor T7. At the same time, the level of the third node N3 is further pulled down below the first voltage, so that the fifth control transistor T5 is turned off. Therefore, in the third phase P3, the output signal output by the output terminal EOUT of the shift register unit 105 is at a low level.

In the fourth phase P4, as illustrated in FIG. 2B, the input terminal EI receives a low-level trigger signal provided by the trigger signal line, and the first control transistor T1 is turned on. The second clock signal terminal CB receives a high-level second clock signal provided by the second clock signal line, and the second control transistor T2 is turned off. The high-level second voltage is transmitted to the first node N1 through the turned-on first control transistor T1, so that the level of the first node N1 becomes at a high level, and the third control transistor T3 is turned off. The first clock signal terminal CK receives a low-level first clock signal provided by the first clock signal line, and the input transistor T6 is turned on. Because the input terminal EI receives the low-level trigger signal provided by the trigger signal line, the level of the fourth node N4 becomes a low level, so that the fourth control transistor T4 is turned on. The high-level second voltage is transmitted to the second node N2 through the turned-on fourth control transistor T4, so that the output control transistor T8 is turned off. Due to the storage function of the first capacitor C1, the level of the third node N3 can be kept at a low level, so that the output transistor T7 is turned on, and the low-level first voltage is transmitted to the output terminal EOUT through the turned-on output transistor T7. At the same time, the level of the third node N3 is further pulled down below the first voltage, so that the fifth control transistor T5 is turned off. Therefore, in the fourth phase P4, the output signal output by the output terminal EOUT of the shift register unit 105 is at a low level.

In the fifth phase P5, as illustrated in FIG. 2B, the input terminal EI receives a high-level trigger signal provided by the trigger signal line, and the first control transistor T1 is turned off. The second clock signal terminal CB receives a low-level second clock signal provided by the second clock signal line, and the second control transistor T2 is turned on. The high-level second voltage is transmitted to the first node N1 through the turned-on second control transistor T2, so that the level of the first node N1 becomes a high level, and the third control transistor T3 is turned off. Due to the storage function of the second capacitor C2, the level of the second node N2 can be kept at a high level, so that the output control transistor T8 is turned off. The first clock signal terminal CK receives a high-level first clock signal provided by the first clock signal line, and the input transistor T6 is turned off. Due to the storage function of the first capacitor C1, the level of the third node N3 can be kept at a low level, so that the output transistor T7 is turned on, and the low-level first voltage is transmitted to the output terminal EOUT through the turned-on output transistor T7. At the same time, the level of the third node N3 is further pulled down below the first voltage, so that the fifth control transistor T5 is turned off. Therefore, in the fifth phase P5, the output signal output by the output terminal EOUT of the shift register unit 105 is at a low level.

In the sixth phase P6, as illustrated in FIG. 2B, the first clock signal terminal CK receives a low-level first clock signal provided by the first clock signal line, and the input transistor T6 is turned on. Because the input terminal EI receives a high-level trigger signal provided by the trigger signal line, the level of the fourth node N4 becomes a high level, so that the fourth control transistor T4 is turned off. The fifth control transistor T5 is turned on in response to the low-level first voltage, so that the level of the third node N3 becomes a high level, and therefore, the output transistor T7 is turned off. The input terminal EI receives the high-level trigger signal provided by the trigger signal line, and the first control transistor T1 is turned off. The second clock signal terminal CB receives a high-level second clock signal provided by the second clock signal line, and the second control transistor T2 is turned off. Due to the storage function of the third capacitor C3, the level of the first node N1 becomes a low level under the action of the low-level first clock signal received by the first clock signal terminal CK, so that the third control transistor T3 is turned on. The low level received by the first clock signal terminal CK is transmitted to the second node N2 through the turned-on third control transistor T3, so that the output control transistor T8 is turned on. The high-level second voltage is transmitted to the output terminal EOUT through the turned-on output control transistor T8. Therefore, in the sixth phase P6, the output signal output by the output terminal EOUT of the shift register unit 105 is at a high level.

It should be noted that the embodiments of the present disclosure only show two clock signal lines (the first clock signal line ECK and the second clock signal line ECB) schematically, and the display substrate provided by the embodiments of the present disclosure may also include more clock signal lines, for example, four, six, eight or the like, and the embodiments of the present disclosure are not limited in this aspect. Correspondingly, when the number of clock signal lines changes, the connection relationship between the shift register unit 105 and the clock signal lines in the display substrate 10 also changes accordingly. The details may refer to the conventional design in the art and will not be repeated here.

FIG. 3 is a schematic layout diagram of a display substrate provided by at least one embodiment of the present disclosure. It should be noted that the layout structure of the shift register unit 105 includes, but is not limited to, this case. In other words, the shift register unit 105 may also adopt other suitable layout structures, and the embodiments of the present disclosure are not limited to this case.

For example, as illustrated in FIG. 1A to FIG. 3, the display substrate 10 includes a base substrate 100, and a first gate driving circuit and a plurality of signal lines SL105 electrically connected to the first gate driving circuit which are disposed on the base substrate 100. The base substrate 100 (or the display substrate 10) includes a display region 102 and a peripheral region 106 located on at least one side of the display region 102. For example, the peripheral region 106 partially or completely surrounds the display region 102, and the first gate driving circuit and the plurality of signal lines SL105 are disposed in the peripheral region 106.

The first gate driving circuit includes the plurality of cascaded shift register units 105, and the plurality of signal lines SL105 are configured to provide a trigger signal, at least one clock signal, and at least one power signal to the cascaded shift register units 105, respectively. For example, the plurality of signal lines SL105 may include a first power signal line VGL, a second power signal line VGH, a first clock signal line ECK, a second clock signal line ECB, and a trigger signal line ESTV. For example, the trigger signal line ESTV is configured to be connected to the first-stage shift register unit 105 among the plurality of cascaded shift register units 105 to provide the above-mentioned trigger signal to the first-stage shift register unit 105. The at least one clock signal may include the first clock signal CK or the second clock signal CB provided by the first clock signal line ECK and the second clock signal line ECB to the shift register unit 105 at each stage. The at least one power signal may include a first power signal VGL and a second power signal VGH provided by the first power signal line VGL and the second power signal line VGH to the shift register unit 105 at each stage. For example, the first power signal VGL is the first voltage, the second power signal VGH is the second voltage, and the second voltage is greater than the first voltage. For example, the first voltage is at a direct-current low level, and the second voltage is at a direct-current high level. The specific connection relationship of the first power signal line VGL, the second power signal line VGH, the first clock signal line ECK, the second clock signal line ECB, and the trigger signal line ESTV with the shift register unit 105 may refer to the previous or later description of the circuit connection and layout structure of the shift register unit 105, which will not be repeated here.

Figure 4A:
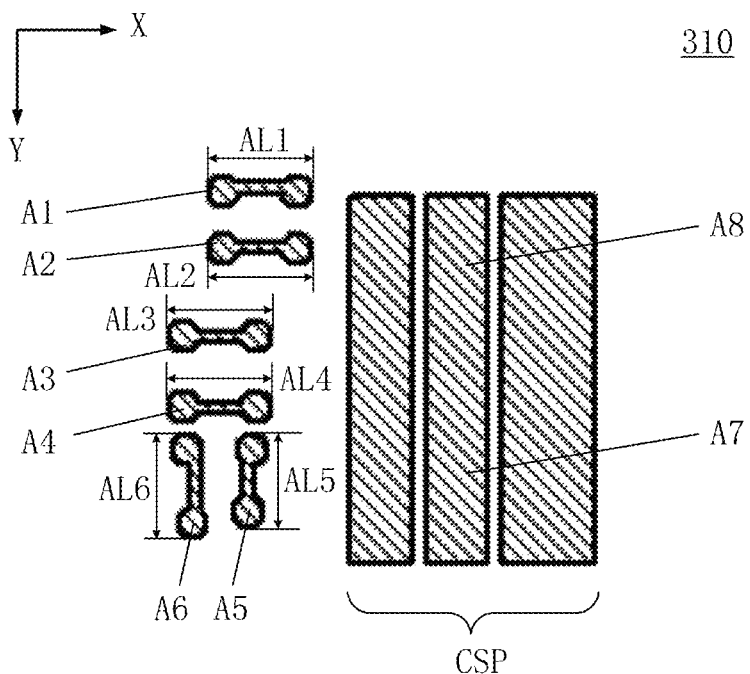
FIG. 4A is a planar view of a semiconductor layer of a display substrate provided by at least one embodiment of the present disclosure.
Figure 4B:
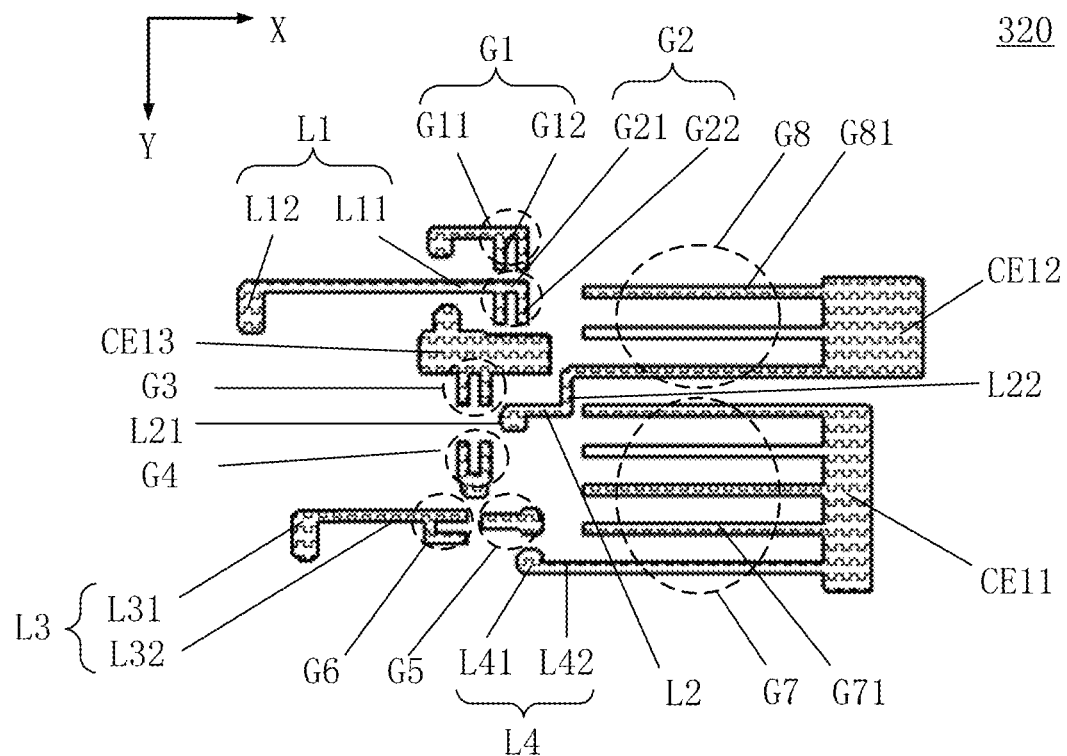
FIG. 4B is a planar view of a first conductive layer of a display substrate provided by at least one embodiment of the present disclosure.
Figure 4C:
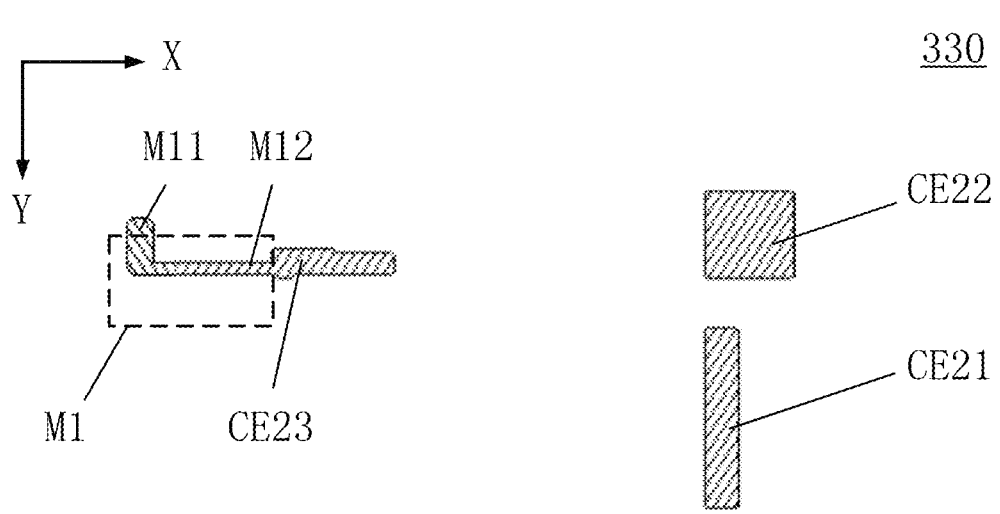
FIG. 4C is a planar view of a second conductive layer of a display substrate provided by at least one embodiment of the present disclosure.
Figure 4D:
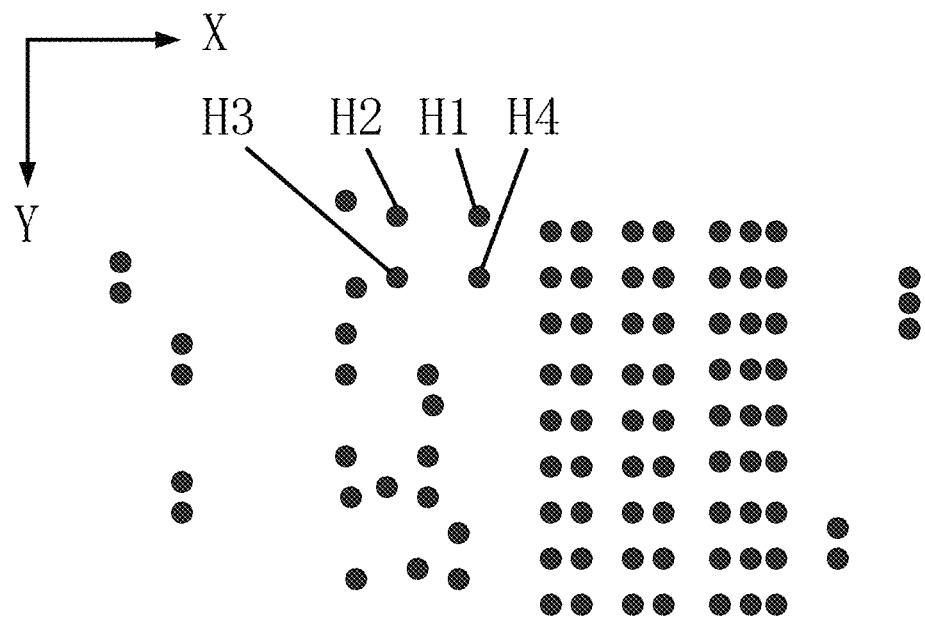
FIG. 4D is a diagram of via hole distribution of a display substrate provided by at least one embodiment of the present disclosure.
Figure 4E:
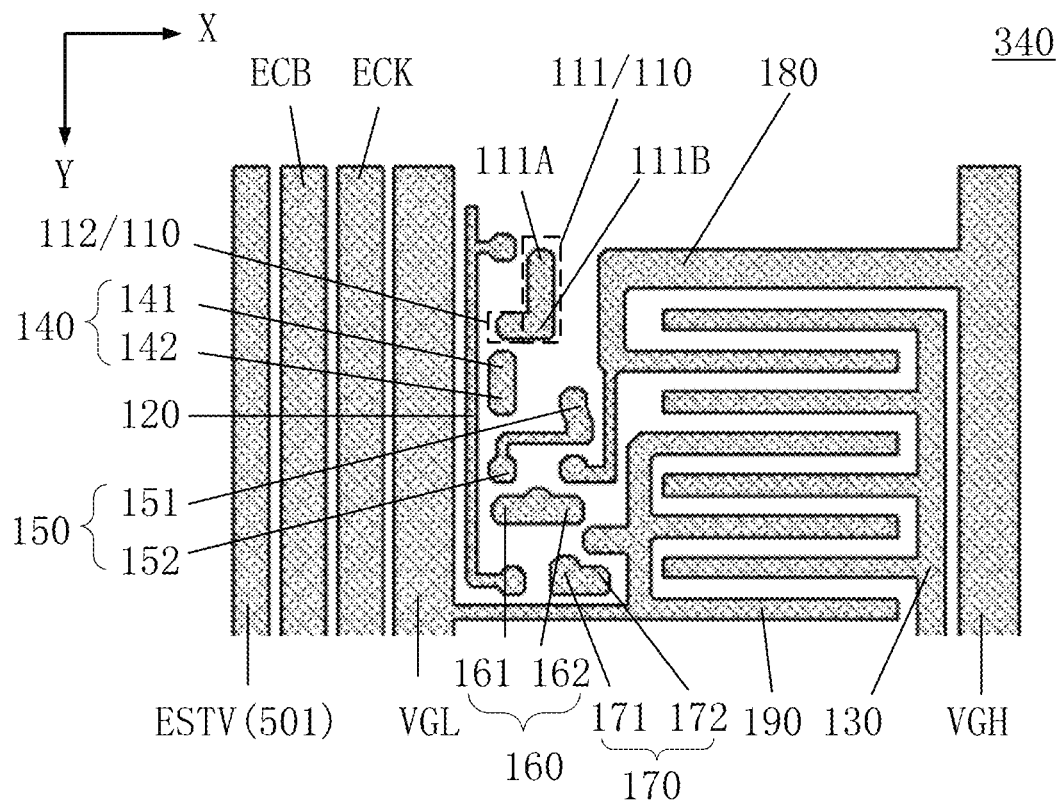
FIG. 4E is a planar view of a third conductive layer of a display substrate provided by at least one embodiment of the present disclosure.
Figure 4F:
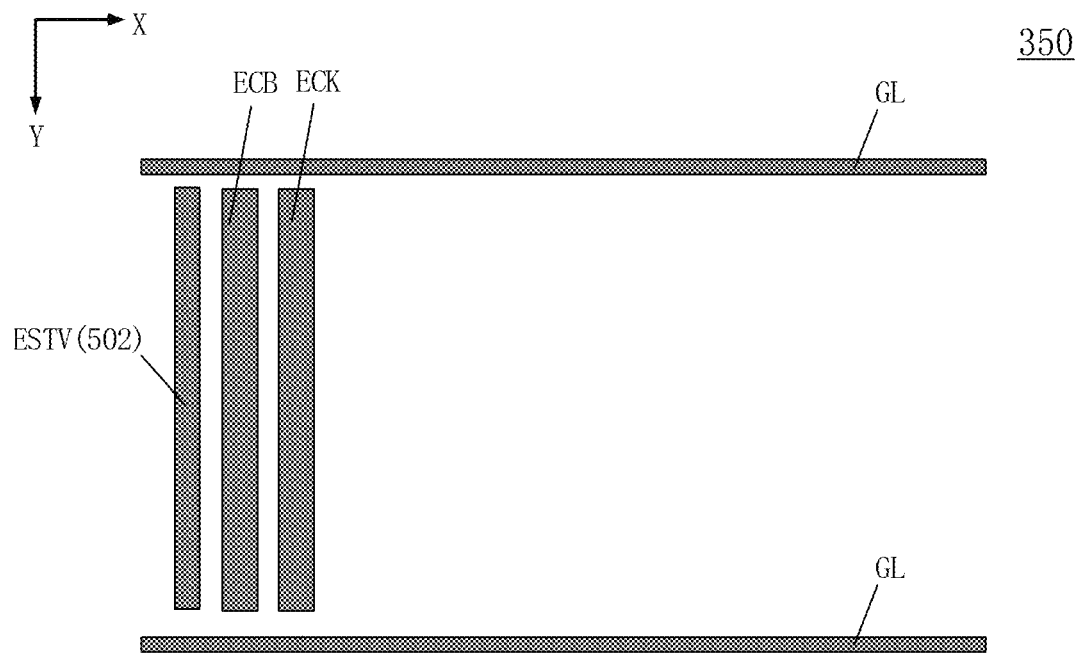
FIG. 4F is a planar view of a fourth conductive layer of a display substrate provided by at least one embodiment of the present disclosure.
Figure 5:
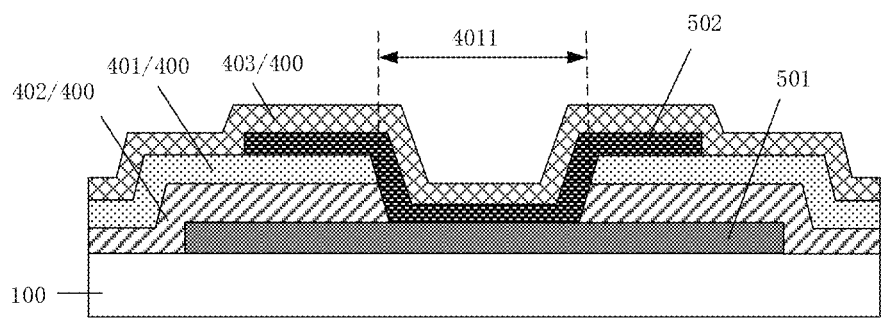
FIG. 5 is a cross-sectional view of an example of the display substrate illustrated in FIG. 3 along a direction A-A'.

FIG. 5 is a cross-sectional view of an example of the display substrate illustrated in FIG. 3 along a direction A-A'. For example, as illustrated in FIG. 1A to FIG. 5, each signal line SL105 among the plurality of signal lines SL105 includes a first conductive portion, such as the first conductive portion 501 of the trigger signal line ESTV illustrated in FIG. 3 and FIG. 5. For at least one signal line SL105 among the plurality of signal lines SL105, for example, the at least one signal line SL105 may include a trigger signal line ESTV, a first clock signal line ECK, and a second clock signal line ECB illustrated in FIG. 3, taking the trigger signal line ESTV as an example, the display substrate 10 includes a multi-layer insulating pattern 400 located on a side of the first conductive portion 501 of the trigger signal line ESTV away from the base substrate 100. At least one insulating pattern (for example, the third insulating pattern 403 illustrated in FIG. 5) in the multi-layer insulating pattern 400 covers a surface of the side of the first conductive portion 501 away from the base substrate 100, for example, the above at least one insulating pattern covers the entire surface of the side of the first conductive portion 501 away from the base substrate 100. The multi-layer insulating pattern 400 includes at least one first insulating pattern 401, and the first insulating pattern 401 includes at least one hollow 4011. The orthographic projection of the at least one hollow 4011 on the base substrate 100 is at least partially located (for example, all located) in the region surrounded by the orthographic projection of the first conductive portion 501 on the base substrate 100. For example, the hollow 4011 at least partially overlaps with the first conductive portion 501 in the direction perpendicular to the main surface of the base substrate 100. The material of the first insulating pattern 401 includes an organic insulating material.

In the display substrate 10 provided by the above embodiments of the present disclosure, the orthographic projection of the hollow 4011 in the first insulating pattern 401 on the base substrate 100 is partially or completely located in the region surrounded by the orthographic projection of the first conductive portion of the signal line SL105 on the base substrate 100, so that the hollow 4011 in the first insulating pattern 401 at least partially overlaps with the first conductive portion of the signal line SL105 in the direction perpendicular to the main surface of the base substrate 100. Therefore, the gas released by the organic insulating material in the first insulating pattern 401 during the preparation process can be discharged through the hollow 4011, and the space occupied by the hollow 4011 in the first insulating pattern 401 in the plane parallel to the main surface of the base substrate 100 can also be reduced, thereby reducing the layout space occupied by the hollow 4011 in the first insulating pattern 401 in the peripheral region 106 of the base substrate 100, which is beneficial to the narrow frame design of the display substrate 10.

In the following, the embodiments of the present disclosure take the trigger signal line ESTV as an example to specifically describe the structure of the signal line SL105, such as the first conductive portion 501, and the positional relationship between the signal line SL105 and the multi-layer insulating pattern 400. For example, as illustrated in FIG. 3, the arrangement of the conductive portions in the first clock signal line ECK and the second clock signal line ECB and the positional relationship with the multi-layer insulating pattern 400 may be provided in a similar structure design to that of the trigger signal line ESTV, which will not be described here.

For example, in the embodiment illustrated in FIG. 3 of the present disclosure, taking the trigger signal line ESTV as an example, in the region corresponding to a shift register unit 105 at one stage, a hollow 4011 is included in the first insulating pattern 401 in the multi-layer insulating pattern 400 on a side of the first conductive portion 501 of the trigger signal line ESTV away from the base substrate 100; alternatively, in some other embodiments of the present disclosure, in the region corresponding to a shift register unit 105 at one stage, the first insulating pattern 401 in the multi-layer insulating pattern 400 located on a side of the first conductive portion 501 of the trigger signal line ESTV away from the base substrate 100 may also include a plurality of hollows 4011. For example, the plurality of hollows 4011 may be arranged in parallel and spaced apart from each other along an extending direction (e.g., the first direction Y) of the trigger signal line ESTV on the base substrate 100. For example, the plurality of hollows 4011 may be spaced apart along the extending direction of the trigger signal line ESTV on the base substrate 100, which is not limited by the embodiments of the present disclosure.

It should be noted that FIG. 3 only shows the region of the display substrate 10 corresponding to one shift register unit 105. For example, for the trigger signal line ESTV, only one hollow 4011 in the first insulating pattern 401 at the position corresponding to the trigger signal line ESTV in this partial region is shown. In some embodiments of the present disclosure, taking the trigger signal line ESTV as an example, the first insulating pattern 401 of the display substrate 10 may include a plurality of hollows 4011 at different positions corresponding to the trigger signal line ESTV. For example, in the region corresponding to the shift register unit 105 at each stage, the first insulating pattern 401 in the multi-layer insulating pattern 400 located on the side of the first conductive portion 501 of the trigger signal line ESTV away from the base substrate 100 may include the hollow 4011 such as illustrated in FIG. 3; alternatively, in the region corresponding to the shift register unit 105 at each even-numbered or odd-numbered stage, the first insulating pattern 401 in the multi-layer insulating pattern 400 located on the side of the first conductive portion 501 of the trigger signal line ESTV away from the base substrate 100 may include the hollow 4011 as illustrated in FIG. 3. The embodiments of the present disclosure are not particularly limited to this case.

In some embodiments of the present disclosure, in the plane parallel to the main surface of the base substrate 100, the size of the hollow in the second direction X different from the first direction Y (e.g., the first direction Y is perpendicular to the second direction X) is greater than or equal to 2 microns, thus facilitating the enhancement of the exhaust effect of the organic insulating material in the first insulating pattern 401 through the hollow.

In some embodiments of the present disclosure, each signal line SL105 extends on the base substrate 100 approximately in the first direction Y, and the ratio between the size of the hollow in the first direction Y and the size of one shift register unit 105 (that is, the shift register unit 105 at one stage) in the first gate driving circuit in the first direction Y ranges from ¼ to 1. For example, in some examples, the size of the hollow in the first direction Y may be set to be approximately equal to the size of one shift register unit 105 in the first gate driving circuit in the first direction Y, thereby not only reducing or avoiding the mutual interference or adverse influence between the signal line SL105 and other signal lines (for example, the output signal transmitting line GL of the second gate driving circuit) or conductive structures in the display substrate 10, but also improving the stability of the display substrate 10 and further improving the exhaust effect of the organic insulating material in the first insulating pattern 401.

For example, taking the trigger signal line ESTV as an example, for the trigger signal line ESTV, the ratio between the size of the hollow 4011 in the first direction Y and the size of one shift register unit 105 in the first gate driving circuit in the first direction Y may range from ⅓ to ½, so as to reduce or avoid the mutual interference or adverse influence between the trigger signal line ESTV and the output signal transmitting line GL of the second gate driving circuit or other conductive structures in the display substrate 10.

For example, taking the first clock signal line ECK as an example, for the first clock signal line ECK, the ratio between the size of the hollow in the first direction Y and the size of one shift register unit 105 in the first gate driving circuit in the first direction Y ranges from ¾ to 1. For example, the size of the hollow in the first direction Y may be set to be approximately equal to the size of one shift register unit 105 in the first gate driving circuit in the first direction Y, thereby facilitating the enhancement of the exhaust effect of the organic insulating material in the first insulating pattern 401 in the case of the realization of the narrow frame design of the display substrate 10.

For example, taking the second clock signal line ECB as an example, for the second clock signal line ECB, the ratio between the size of the hollow in the first direction Y and the size of one shift register unit 105 in the first gate driving circuit in the first direction Y ranges from ¾ to 1. For example, the size of the hollow in the first direction Y may be set to be approximately equal to the size of one shift register unit 105 in the first gate driving circuit in the first direction Y, thereby facilitating the enhancement of the exhaust effect of the organic insulating material in the first insulating pattern 401 in the case of the realization of the narrow frame design of the display substrate 10.

In some embodiments of the present disclosure, for example, as illustrated in FIG. 3 and FIG. 5, the hollow 4011 is an opening penetrating through the first insulating pattern 401, that is, the hollow 4011 penetrates through the first insulating pattern 401, so that an opening is formed in the first insulating pattern 401 at a position corresponding to the hollow 4011. Thus, the gas released by the organic insulating material in the first insulating pattern 401 during the preparation process can be better discharged through the opening, and the exhaust effect of the first insulating pattern 401 is further improved.

In some embodiments of the present disclosure, for example, as illustrated in FIG. 3 and FIG. 5, the orthographic projection of the hollow 4011 on the base substrate 100 is located in the region surrounded by the orthographic projection of the first conductive portion 501 on the base substrate 100, that is, in the direction perpendicular to the main surface of the base substrate 100, the hollow 4011 is located in the region surrounded by the first conductive portion 501. Therefore, the hollow 4011 does not need to occupy additional space in the plane parallel to the main surface of the base substrate 100, thus further reducing the space occupied by the hollow 4011 formed in the first insulating pattern 401 in the plane parallel to the main surface of the base substrate 100, and further reducing the layout space occupied by the hollow 4011 in the first insulating pattern 401 in the peripheral region 106 of the base substrate 100, which is beneficial to realizing the narrow frame design of the display substrate 10.

In some embodiments of the present disclosure, for example, as illustrated in FIG. 3 and FIG. 5, taking the trigger signal line ESTV as an example, the trigger signal line ESTV further includes a second conductive portion 502, and the second conductive portion 502 is located on the side of the first conductive portion 501 away from the base substrate 100 and is configured to be electrically connected to the first conductive portion 501. At least one insulating pattern (e.g., the third insulating pattern 403) in the multi-layer insulating pattern 400 covers the surface of the side of the second conductive portion 502 away from the base substrate 100. Therefore, by adopting the double-layer conductive structure of the trigger signal line ESTV, the signal transmission load on the trigger signal line ESTV can be reduced, and the signal voltage drop on the trigger signal line ESTV can be reduced, thereby improving the signal transmission effect on the trigger signal line ESTV.

For example, as illustrated in FIG. 3 and FIG. 5, the second conductive portion 502 of the trigger signal line ESTV is located on the side of the first insulating pattern 401 away from the first conductive portion 501, and the second conductive portion 502 and the hollow 4011 in the first insulating pattern 401 at least partially overlap, for example, may completely overlap in the direction perpendicular to the base substrate 100, so that the space occupied by the hollow 4011 in the first insulating pattern 401 in the plane parallel to the main surface of the base substrate 100 can be better reduced. In addition, in the case where the hollow 4011 is an opening penetrating the first insulating pattern 401, the second conductive portion 502 may be electrically connected to the first conductive portion 501 through the opening, so that the opening in the first insulating pattern 401 can be used to realize the electrical connection between the first conductive portion 501 and the second conductive portion 502 while reducing the space occupied by the opening in the plane parallel to the main surface of the base substrate 100, thereby optimizing the layout structure in the display substrate 10.

For example, as illustrated in FIG. 3 and FIG. 5, the orthographic projection of the hollow 4011 on the base substrate 100 is located in the region surrounded by the orthographic projection of the second conductive portion 502 on the base substrate 100, that is, in the direction perpendicular to the main surface of the base substrate 100, the hollow 4011 is located in the region surrounded by the second conductive portion 502. Therefore, it is possible to better achieve the effect that the hollow 4011 does not need to occupy additional space in the plane parallel to the main surface of the base substrate 100, which is conducive to the narrow frame design of the display substrate 10. Furthermore, when the hollow 4011 is an opening penetrating the first insulating pattern 401, all regions of the opening overlap with the first conductive portion 501 and the second conductive portion 502 respectively in the direction perpendicular to the main surface of the base substrate 100, so that the electrical connection effect between the first conductive portion 501 and the second conductive portion 502, such as the stability of electrical connection, can be further enhanced through the opening, thereby improving the overall performance of the display substrate 10.

For example, as illustrated in FIG. 3 and FIG. 5, the orthographic projection of the second conductive portion 502 of the trigger signal line ESTV on the base substrate 100 is located in the region surrounded by the orthographic projection of the first conductive portion 501 on the base substrate 100, so that the first conductive portion 501 and the second conductive portion 502 can reduce the signal transmission load on the trigger signal line ESTV and further facilitate reducing the layout space that the trigger signal line ESTV needs to occupy in the peripheral region 106 of the display substrate 10, thereby further facilitating the realization of the narrow frame design of the display substrate 10.

It should be noted that, in the display substrate 10 provided by other embodiments of the present disclosure, for example, two, three or more layers of the first insulating pattern 401 may be disposed between the first conductive portion 501 and the second conductive portion 502, and the embodiments of the present disclosure do not limit the specific number of layers of the first insulating pattern 401 in the display substrate 10.

For example, as illustrated in FIG. 3 and FIG. 5, the multi-layer insulating pattern 400 may further include a second insulating pattern 402 and a third insulating pattern 403. For example, the second insulating pattern 402 and the third insulating pattern 403 may include an organic insulating material, an inorganic insulating material, or other suitable insulating materials, and the embodiments of the present disclosure are not particularly limited to this case.

For example, the second insulating pattern 402 includes an opening region for realizing the electrical connection between the first conductive portion 501 and the second conductive portion 502. The embodiments of the present disclosure are not limited to the specific size of the opening area in the second insulating pattern 402, as long as the electrical connection between the first conductive portion 501 and the second conductive portion 502 is realized. For example, the actual size of the opening area in the second insulating pattern 402 may be smaller than that of the opening in the first insulating pattern 401, or may be larger than that of the opening in the first insulating pattern 401.

It should be noted that, in the display substrate 10 provided by other embodiments of the present disclosure, for example, a plurality of layers of second insulating patterns 402 may be provided between the first conductive portion 501 and the second conductive portion 502, or there may also be no second insulating pattern 402 provided between the first conductive portion 501 and the second conductive portion 502. The embodiments of the present disclosure are not limited to this case.

For example, the third insulating pattern 403 covers all the surfaces of the side of the first conductive portion 501 and the second conductive portion 502 away from the base substrate 100, so that it is possible to avoid other conductive film layers or structures located above the trigger signal line ESTV from adversely affecting the signal transmission on the trigger signal line ESTV. It should be noted that the display substrate 10 provided by other embodiments of the present disclosure may also include, for example, two, three or more layers of the third insulating patterns 403, and the embodiments of the present disclosure are not limited to the specific number of layers of the third insulating patterns 403 in the display substrate 10.

Figure 9:
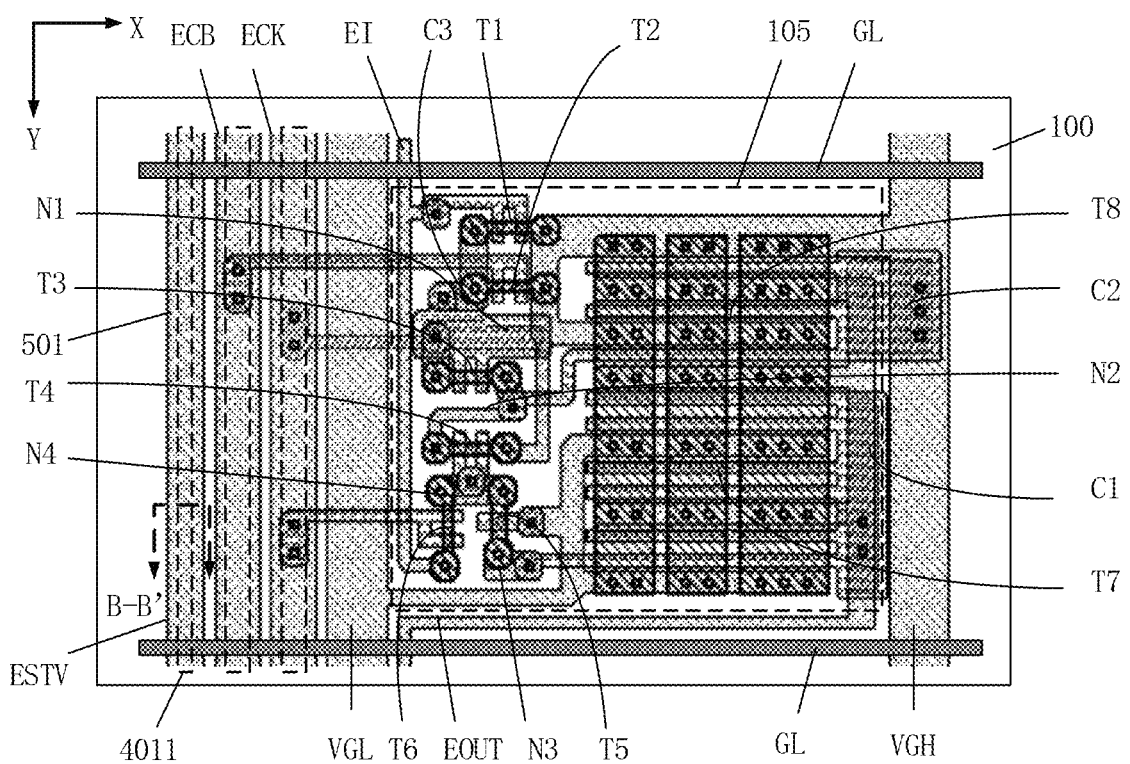
FIG. 9 is a schematic layout diagram of further still another display substrate provided by at least one embodiment of the present disclosure.
Figure 10A:
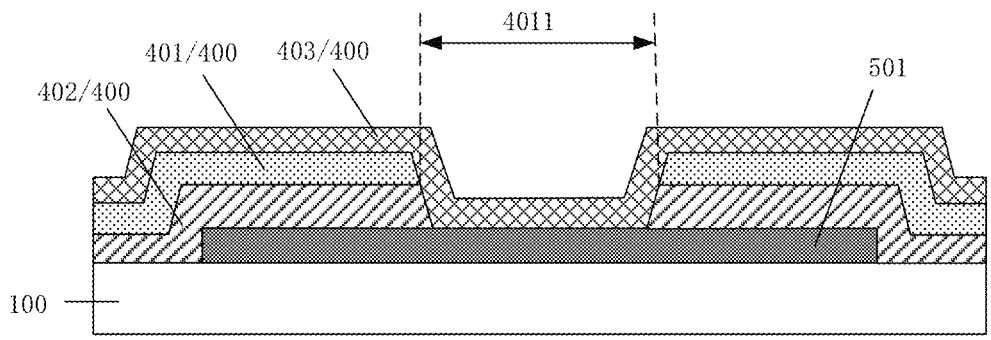
FIG. 10A is a cross-sectional view of an example of the display substrate illustrated in FIG. 9 along a direction B-B'.
Figure 10B:
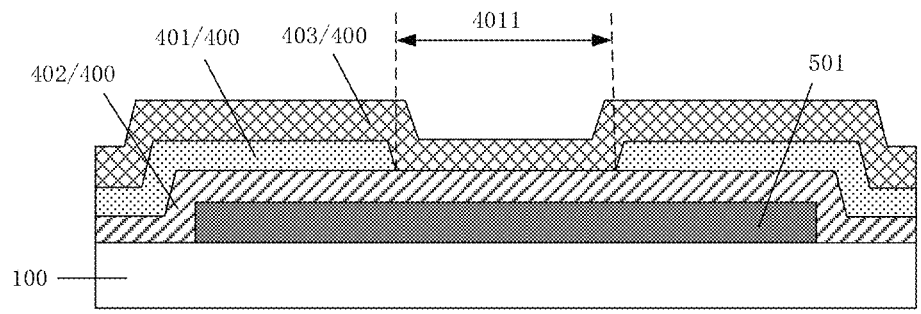
FIG. 10B is a cross-sectional view of another example of the display substrate illustrated in FIG. 9 along the direction B-B'.

In some embodiments of the present disclosure, for example, as illustrated in FIG. 9, FIG. 10A and FIG. 10B, the trigger signal line ESTV in the display substrate 10 may also adopt a conductive structure with a single-layer conductive portion, for example, the trigger signal line ESTV may only include the first conductive portion 501 but not the second conductive portion 502, thereby simplifying the manufacturing process of the display substrate 10 and reducing the manufacturing cost.

For example, in an example in which the trigger signal line ESTV includes only the first conductive portion 501, the second insulating layer 402 in the display substrate 10 may have an opening region corresponding to the hollow 4011 in the first insulating pattern 401 (for example, an opening penetrating the first insulating pattern 401) as illustrated in FIG. 10A; alternatively, as illustrated in FIG. 10B, the second insulating layer 402 in the display substrate 10 may not be provided with an opening region corresponding to the hollow 4011 in the first insulating pattern 401, and the embodiments of the present disclosure are not particularly limited to this case.

In some embodiments of the present disclosure, for example, as illustrated in FIG. 1A to FIG. 5, the display substrate 10 further includes a second gate driving circuit disposed in the peripheral region 106 of the base substrate 100. For example, the plurality of cascaded second shift register units 104 form the second gate driving circuit. The display substrate 10 further includes at least one output signal transmitting line GL, such as a plurality of output signal transmitting lines GL1 to GLM (i.e., a plurality of gate lines GL1 to GLM) illustrated in FIG. 1A, disposed in the peripheral region 106 of the base substrate 100 and electrically connected to the second gate driving circuit. The orthographic projection of the plurality of signal lines SL105 on the base substrate 100 is located between the orthographic projection of the first gate driving circuit on the base substrate 100 and the orthographic projection of the second gate driving circuit on the base substrate 100. The output signal transmitting line GL is configured to transmit the output signal of the second gate driving circuit to the display region 102, and each output signal transmitting line GL is insulated from any signal line SL105 among the plurality of signal lines SL105.

For example, taking the trigger signal line ESTV as illustrated in FIG. 3 and one output signal transmitting line GL corresponding to the second shift register unit 104 in the second gate driving circuit as an example, the first conductive portion 501 of the trigger signal line ESTV and the output signal transmitting line GL may be located in different conductive layers in the display substrate 10. For example, the first conductive portion 501 of the trigger signal line ESTV and the output signal transmitting line GL may be located in the third conductive layer 340 and the fourth conductive layer 350 (described later), which are spaced apart and insulated from each other in the direction perpendicular to the main surface of the base substrate 100, or in the third conductive layer 340 and the second conductive layer 330 (described later), which are spaced apart and insulated from each other in the direction perpendicular to the main surface of the base substrate 100, so as to ensure that the first conductive portion 501 of the trigger signal line ESTV and the output signal transmitting line GL are insulated from each other. The embodiments of the present disclosure are not particularly limited in this aspect. The second conductive portion 502 of the trigger signal line ESTV may be located in the same conductive layer as the output signal transmitting line GL in the display substrate 10, for example, in the fourth conductive layer 350, and the second conductive portion 502 of the trigger signal line ESTV and the output signal transmitting line GL are spaced apart and insulated from each other in the plane parallel to the main surface of the base substrate 100, thus ensuring that the second conductive portion 502 of the trigger signal line ESTV and the output signal transmitting line GL are insulated from each other. The details of the third conductive layer 340 and the fourth conductive layer 350 may refer to the following detailed description of the layout structure of the shift register unit 105, which will not be repeated here.

Figure 6:
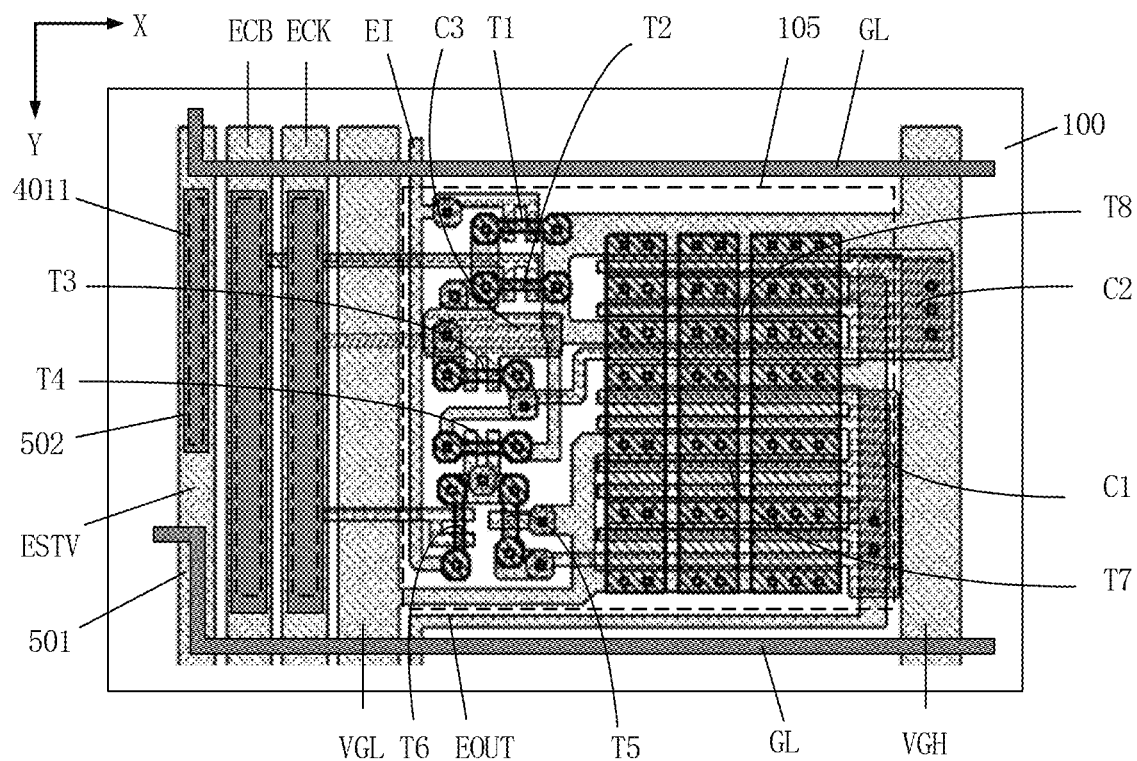
FIG. 6 is a schematic layout diagram of another display substrate provided by at least one embodiment of the present disclosure.

For example, in some examples, as illustrated in FIG. 6, in the case where the second conductive portion 502 of the trigger signal line ESTV and the output signal transmitting line GL are located in the same fourth conductive layer 350 in the display substrate 10, when the output signal transmitting line GL extends such as in a zigzag shape in the plane parallel to the main surface of the base substrate 100, compared with the example illustrated in FIG. 3, the shape, outline, occupied space, position, or the like of the second conductive portion 502 of the trigger signal line ESTV in the plane parallel to the main surface of the base substrate 100 may be adjusted accordingly to ensure that the second conductive portion 502 of the trigger signal line ESTV is spaced apart and insulated from the output signal transmitting line GL in the plane parallel to the main surface of the base substrate 100.

Figure 7:
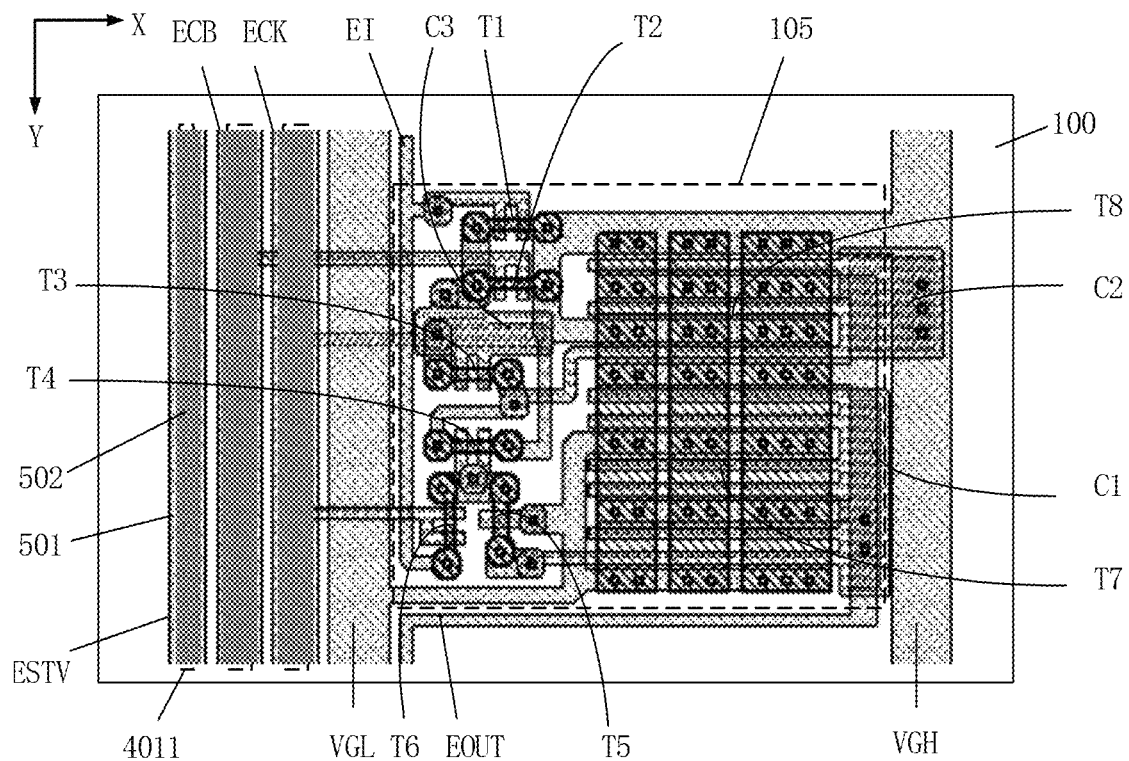
FIG. 7 is a schematic layout diagram of still another display substrate provided by at least one embodiment of the present disclosure.

For example, in some examples, as illustrated in FIG. 7, when the output signal transmitting line GL and the first conductive portion 501 and the second conductive portion 502 of the trigger signal line ESTV are not located in the same conductive layer, for example, in the example illustrated in FIG. 7, the first conductive portion 501 of the trigger signal line ESTV is located in the third conductive layer 340, the second conductive portion 502 of the trigger signal line ESTV is located in the fourth conductive layer 350, the output signal transmitting line GL is located in other conductive layers (not shown) different from the third conductive layer 340 and the fourth conductive layer 350, and the first conductive portion 501 and the second conductive portion 502 of the trigger signal line ESTV may be continuously arranged along the extending direction (e.g., the first direction Y) of the trigger signal line ESTV on the base substrate 100, thereby further reducing the signal transmission load on the trigger signal line ESTV and improving the signal transmission effect on the trigger signal line ESTV. Furthermore, in this example, the hollow 4011 in the first insulating pattern 401 may also be continuously arranged along the extending direction (e.g., the first direction Y) of the trigger signal line ESTV on the base substrate 100 at the position corresponding to the trigger signal line ESTV, so that the gas released by the organic insulating material in the first insulating pattern 401 during the preparation process can be better exhausted through the hollow or opening, and the exhaust effect of the first insulating pattern 401 can be further improved.

For example, the orthographic projection of the output signal transmitting line GL on the base substrate 100 has no overlapping part with the orthographic projection of any hollow 4011 on the base substrate 100, so that the mutual interference between the output signal transmitting line GL and, for example, the trigger signal line ESTV or other signal lines SL105 can be reduced or avoided, and the stability of the display substrate 10 can be improved.

For example, as illustrated in FIG. 1A to FIG. 5, the second gate driving circuit including the plurality of cascaded second shift register units 104 is located on the side of the first gate driving circuit including the plurality of cascaded first shift register units 105 away from the display region 102. Therefore, by forming a hollow in the first insulating pattern 401 at a position corresponding to the signal line SL105 between the first gate driving circuit and the second gate driving circuit, the gas in the organic insulating layer covering the conductive structures or film layers in the first gate driving circuit and the second gate driving circuit can be better discharged, and adverse effects on the conductive structures or film layers in the first gate driving circuit and the second gate driving circuit can be reduced or avoided.

It should be noted that, in some embodiments of the present disclosure, the signal line SL104 electrically connected to the second gate driving circuit can also adopt a structure similar to that of the trigger signal line ESTV described above, that is, one or more hollows are provided in the insulating pattern at the position corresponding to the signal line SL104, which can be more conducive to the discharge of gas released by the organic insulating material during the preparation process and further improve the overall performance of the di splay substrate 10.

In some embodiments of the present disclosure, taking the embodiment illustrated in FIG. 3 as an example, the hollows 4011 are provided in the first insulating pattern 401 at positions corresponding to the trigger signal line ESTV, the first clock signal line ECK, and the second clock signal line ECB, so that the exhaust effect of the organic insulating material in the first insulating pattern 401 can be further improved on the premise that, for example, the hollow 4011 in the first insulating pattern 401 does not need to occupy extra space in the plane parallel to the main surface of the base substrate 100.

In some embodiments of the present disclosure, the ratio between the width of the first clock signal line ECK in the second direction X different from the first direction Y (for example, the extending direction of the trigger signal line ESTV, the first clock signal line ECK, or the second clock signal line ECB on the base substrate 100) and the width of the trigger signal line ESTV in the second direction X is greater than or equal to 1 and less than or equal to 3, and the ratio between the width of the second clock signal line ECB in the second direction X and the width of the trigger signal line ESTV in the second direction X is greater than or equal to 1 and less than or equal to 3. Therefore, by providing the hollows 4011, at positions corresponding to the first clock signal line ECK and the second clock signal line ECB, in the first insulating pattern 401, the exhaust effect of the organic insulating material in the first insulating pattern 401 can be better improved.

It should be noted that, in some embodiments of the present disclosure, the corresponding hollow 4011 may be provided in the first insulating pattern 401 only at the position corresponding to the first clock signal line ECK or the second clock signal line ECB, or at the positions corresponding to other signal lines SL105. The embodiments of the present disclosure are not particularly limited in this aspect.

Figure 8:
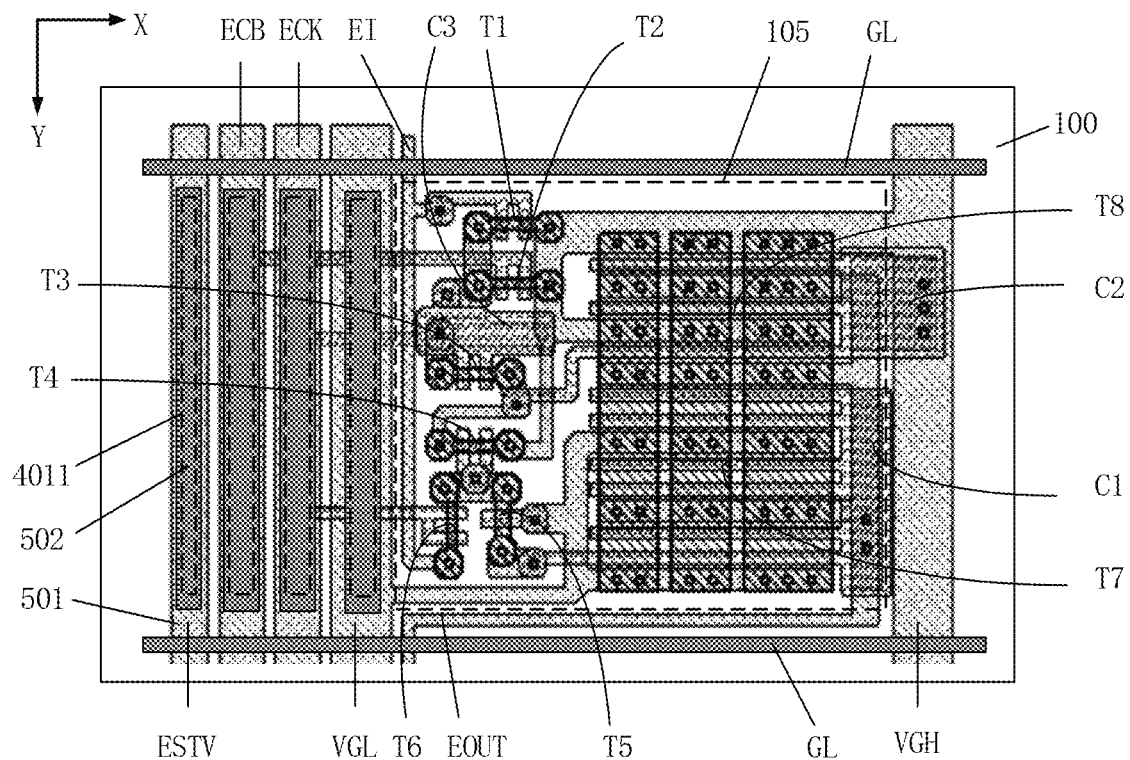
FIG. 8 is a schematic layout diagram of further still another display substrate provided by at least one embodiment of the present disclosure.

In some embodiments of the present disclosure, for example, as illustrated in FIG. 8, the hollow 4011 may be correspondingly provided in the first insulating pattern 401 at the position corresponding to the first power signal line VGL, so that the exhaust effect of the organic insulating material in the first insulating pattern 401 can be further improved on the premise that, for example, the hollow 4011 in the first insulating pattern 401 does not need to occupy additional space in the plane parallel to the main surface of the base substrate 100.

In some embodiments of the present disclosure, the ratio between the width of the first clock signal line ECK in the second direction X different from the first direction Y (for example, the extending direction of the trigger signal line ESTV, the first clock signal line ECK, or the second clock signal line ECB on the base substrate 100) and the width of the first power signal line VGL in the second direction X is greater than or equal to 1 and less than or equal to 3, and the ratio between the width of the second clock signal line ECB in the second direction X and the width of the first power signal line VGL in the second direction X is greater than or equal to 1 and less than or equal to 3. Therefore, the first insulating pattern 401 is provided with hollows 4011 at the positions corresponding to the first clock signal line ECK and the second clock signal line ECB, so that the exhaust effect of the organic insulating material in the first insulating pattern 401 can be better improved.

It should be noted that in the embodiments of the present disclosure, the case that the first clock signal line ECK provides the first clock signal to the shift register unit 105 and the second clock signal line ECB provides the second clock signal to the shift register unit 105 is taken as an example for description. The embodiments of the present disclosure include but are not limited to this case. In other embodiments of the present disclosure, the first clock signal line ECK may provide the second clock signal to the shift register unit 105, and the second clock signal line ECB may provide the first clock signal to the shift register unit 105. The embodiments of the present disclosure are not limited in this aspect.

For example, the first power signal line VGL, the second power signal line VGH, the first clock signal line ECK, the second clock signal line ECB, and the trigger signal line ESTV extend in the first direction Y on the base substrate 100. It should be noted that the first power signal line VGL, the second power signal line VGH, the first clock signal line ECK, the second clock signal line ECB, and the trigger signal line ESTV may extend along the first direction Y and be arranged in parallel with each other, or may cross a certain angle, for example, less than or equal to 20°, which is not specifically limited by the embodiments of the present disclosure.

For example, the first power signal line VGL, the second power signal line VGH, the first clock signal line ECK, the second clock signal line ECB, the trigger signal line ESTV, and the shift register unit 105 are located in the peripheral region 106 of the base substrate 100 and on a side (for example, between the display region 102 and the side of the base substrate 100 as illustrated in FIG. 1A) of the base substrate 100, for example, as illustrated in FIG. 1A, may be located on the left and right sides of the base substrate 100, or may also be located on the left or right side of the base substrate 100, and the embodiments of the present disclosure are not limited in this aspect.

For example, the orthographic projection of the first power signal line VGL on the base substrate 100 and the orthographic projection of the first clock signal line ECK, the second clock signal line ECB and the trigger signal line ESTV on the base substrate 100 are all located on the side of the orthographic projection of the shift register unit 105 on the base substrate 100 away from the display region 102, for example, on the left side of the shift register unit 105 illustrated in FIG. 3 in the second direction X. The orthographic projection of the second power signal line VGH on the base substrate 100 partially overlaps with the orthographic projection of the shift register unit 105 on the base substrate 100, and is located on a side of the orthographic projection of the shift register unit 105 on the base substrate 100 close to the display region 102. For example, in the second direction X, the second power signal line VGH is located on the right side of the shift register unit 105 illustrated in FIG. 3, that is, between the orthographic projection of the shift register unit 105 on the base substrate 100 and the display region 102. That is, the orthographic projection of the shift register unit 105 on the base substrate 100 is located between the orthographic projection of the second power signal line VGH on the base substrate 100 and the orthographic projection of the first power signal line VGL on the base substrate 100.

For example, as illustrated in FIG. 3, the orthographic projection of the first power signal line VGL on the base substrate 100 is located between the orthographic projection of the first clock signal line ECK and the second clock signal line ECB on the base substrate 100 and the orthographic projection of the shift register unit 105 on the base substrate 100. For example, the first clock signal line ECK and the second clock signal line ECB are sequentially arranged on the base substrate 100 along the second direction X from right to left, that is, the orthographic projection of the second clock signal line ECB on the base substrate 100 is located on the side of the orthographic projection of the first clock signal line ECK on the base substrate 100 away from the orthographic projection of the first power signal line VGL on the base substrate 100.

For example, as illustrated in FIG. 3, the orthographic projection of the trigger signal line ESTV on the base substrate 100 may be located on the side of the orthographic projection of the first clock signal line ECK and the second clock signal line ECB on the base substrate 100 away from the orthographic projection of the shift register unit 105 on the base substrate 100, that is, the first clock signal line ECK, the second clock signal line ECB and the trigger signal line ESTV are sequentially arranged on the base substrate 100 along the second direction X from right to left.

It should be noted that the position setting of the above signal lines is only exemplary, as long as it can satisfy the setting of signal lines to facilitate the connection with the shift register unit 105, and the embodiments of the present disclosure are not particularly limited in this aspect.

For example, the angle between the first direction Y and the second direction X ranges from 70° to 90°, and includes 70° and 90°. For example, the included angle between the first direction Y and the second direction X can be 70°, 75°, 80°, 85°, 90° or the like, and the specific value of the included angle may be set according to the actual situation. The embodiments of the present disclosure are not particularly limited in this aspect.

It should be noted that only the shift register unit 105 at the K-th (K is an odd number greater than 1) stage in the first gate driving circuit is illustrated in FIG. 3. For example, the first clock signal terminal CK of the first-stage shift register unit (not shown) is connected to the first clock signal line ECK to receive the first clock signal, the second clock signal terminal CB of the first-stage shift register unit is connected to the second clock signal line ECB to receive the second clock signal, the first clock signal terminal CK of a second-stage shift register unit (not shown) is connected to the second clock signal line ECB to receive the first clock signal, the second clock signal terminal CB of the second-stage shift register unit is connected to the first clock signal line ECK to receive the second clock signal, and so on. By analogy, as illustrated in FIG. 3, the first clock signal terminal CK of the K-th shift register unit 105 is connected to the first clock signal line ECK to receive the first clock signal, the second clock signal terminal CB of the K-th shift register unit 105 is connected to the second clock signal line ECB to receive the second clock signal, the first clock signal terminal CK of the (K+1)-th shift register unit is connected to the second clock signal line ECB to receive the first clock signal, and the second clock signal terminal CB of the (K+1)-th shift register unit is connected to the first clock signal line ECK to receive the second clock signal. It should be noted that the connection method of shift register units at all stages with the clock signal lines may also adopt other connection methods in the art, and the embodiments of the present disclosure are not limited in this aspect. For example, the input terminal EI of the first-stage shift register unit is connected to the trigger signal line ESTV to receive the trigger signal as the input signal, the input terminal EI of the second-stage shift register unit is connected to the output terminal EOUT of the previous-stage shift register unit (i.e., the first-stage shift register unit), and the rest shift register units are connected in a similar way. The following takes the structure of the K-th shift register unit 105 as an example to describe the specific layout design of the shift register unit 105 illustrated in FIG. 3. However, it should be noted that the embodiments of the present disclosure include but are not limited to this case.

FIG. 4A, FIG. 4B, FIG. 4C, FIG. 4E and FIG. 4F respectively show planar views of wiring in respective layers of the display substrate illustrated in FIG. 3. FIG. 4A is a planar view of a semiconductor layer of a display substrate provided by at least one embodiment of the present disclosure, FIG. 4B is a planar view of a first conductive layer of a display substrate provided by at least one embodiment of the present disclosure, FIG. 4C is a planar view of a second conductive layer of a display substrate provided by at least one embodiment of the present disclosure, FIG. 4D is a diagram of via hole distribution of a display substrate provided by at least one embodiment of the present disclosure, FIG. 4E is a planar view of a third conductive layer of a display substrate provided by at least one embodiment of the present disclosure, and FIG. 4F is a planar view of a fourth conductive layer of a display substrate provided by at least one embodiment of the present disclosure. The laminated structure of the display substrate 10 provided in the above embodiments will be described below in detail with reference to FIG. 3 to FIG. 5.

For example, the base substrate 100 can be made of glass, plastic, quartz or other suitable materials, and the embodiments of the present disclosure are not particularly limited in this aspect.

For example, the interlayer insulating structure of the display substrate 10 (e.g., including the first insulating layer, the second insulating layer, the third insulating layer, the fourth insulating layer, etc.) may be located between the layer structures illustrated in FIG. 4A to FIG. 4F.

For example, the first insulating layer is located between the semiconductor layer 310 illustrated in FIG. 4A and the first conductive layer 320 illustrated in FIG. 4B, the second insulating layer is located between the first conductive layer 320 illustrated in FIG. 4B and the second conductive layer 330 illustrated in FIG. 4C, and the third insulating layer is located between the second conductive layer 330 illustrated in FIG. 4C and the third conductive layer 340 illustrated in FIG. 4E. The via hole illustrated in FIG. 4D is a via hole penetrating through one or several layers of the first insulating layer, the second insulating layer and the third insulating layer. The fourth insulating layer is located between the third conductive layer 340 illustrated in FIG. 4E and the fourth conductive layer 350 illustrated in FIG. 4F. For example, the fourth insulating layer may include a first insulating pattern 401 and a second insulating pattern 402 illustrated in FIG. 5.

For example, taking the trigger signal line ESTV in the above embodiments as an example, the first conductive portion 501 of the trigger signal line ESTV is located in the third conductive layer 340 illustrated in FIG. 4E, and the second conductive portion 502 of the trigger signal line ESTV is located in the fourth conductive layer 350 illustrated in FIG. 4F.

For example, as illustrated in FIG. 5, the display substrate 10 further includes a fifth insulating layer on the fourth conductive layer 350 illustrated in FIG. 4F, that is, the fifth insulating layer at least includes a third insulating pattern 403 illustrated in FIG. 5. The fifth insulating layer is located on the side of the fourth conductive layer 350 away from the base substrate 100, so as to protect the fourth conductive layer 350.

For example, the materials of the first insulating layer, the second insulating layer, the third insulating layer, the fourth insulating layer, and the fifth insulating layer may include inorganic insulating materials such as SiNx, SiOx, SiNxOy, or the like, organic insulating materials such as organic resin, or other suitable materials, and the embodiments of the present disclosure are not particularly limited in this aspect. For example, the first insulating layer, the second insulating layer, the third insulating layer, the fourth insulating layer, and the fifth insulating layer may be single-layer insulating patterns composed of the organic insulating material or inorganic insulating material, or may also include multi-layer insulating patterns composed of multiple layers of the organic insulating material and/or inorganic insulating material, which is not limited by the embodiments of the present disclosure.

For example, the active layers A1 to A8 of the first control transistor T1, the second control transistor T2, the third control transistor T3, the fourth control transistor T4, the fifth control transistor T5, the input transistor T6, the output transistor T7, and the output control transistor T8 of the shift register unit 105 illustrated in FIG. 3 may be formed on the semiconductor layer 310 illustrated in FIG. 4A. The semiconductor layer 310 may be patterned using a semiconductor material. For example, as illustrated in FIG. 4A, according to different actual needs, the semiconductor layer 310 may include a short rod-shaped part or a bent part for manufacturing the active layers A1 to A8 of the above-mentioned transistors T1 to T8. The active layer of each transistor may include a source region, a drain region, and a channel region between the source region and the drain region. For example, the channel region has semiconductor characteristics, and the source region and the drain region are on both sides of the channel region and may be doped with impurities, thus having conductivity. For example, the source region is a part of the active layer, and the metal electrode in contact with the source region (for example, in the third conductive layer 340) corresponds to the source electrode (or the first electrode) of the transistor; and the drain region is a part of the active layer, and the metal electrode in contact with the drain region (for example, in the third conductive layer 340) corresponds to the drain electrode (or the second electrode) of the transistor. For example, the source region is connected to its corresponding metal electrode (a source electrode) through via holes penetrating the first, second and third insulating layers, and the drain region is connected to its corresponding metal electrode (a drain electrode) through via holes penetrating the first, second and third insulating layers.

For example, taking the first control transistor T1 and the second control transistor T2 as examples, the first electrode of the first control transistor T1 is connected to the source region of the active layer A1 of the first control transistor T1 through a via hole H1 penetrating the third, second and first insulating layers, and the second electrode of the first control transistor T1 is connected to the drain region of the active layer A1 of the first control transistor T1 through a via hole H2 penetrating the third, second and first insulating layers. The second electrode of the second control transistor T2 is connected to the drain region of the active layer A2 of the second control transistor T2 through a via hole H3 penetrating the third, second and first insulating layers, and the first electrode of the second control transistor T2 is connected to the source region of the active layer A2 of the second control transistor T2 through a via hole H4 penetrating the third, second and first insulating layers.

For example, the material of the semiconductor layer 310 may include an oxide semiconductor, an organic semiconductor, amorphous silicon, polycrystalline silicon, or the like. For example, the oxide semiconductor includes a metal oxide semiconductor (such as indium gallium zinc oxide (IGZO)), the polycrystalline silicon includes low-temperature polycrystalline silicon, high-temperature polycrystalline silicon, or the like, and the embodiments of the present disclosure are not limited in this aspect. It should be noted that the above-mentioned source region and drain region may be regions doped with N-type impurities or P-type impurities, and the embodiments of the present disclosure are not limited in this aspect.

It should be noted that, in other examples, the first electrode and the second electrode of each transistor may also be located in other conductive layers and connected to their corresponding active layers through via holes in the insulating layer between them and the semiconductor layer, and the embodiments of the present disclosure are not limited in this aspect.

FIG. 4B shows the first conductive layer 320 of the display substrate 10. The first conductive layer 320 is disposed on the first insulating layer so as to be insulated from the semiconductor layer 310. For example, the first conductive layer 320 may include the first electrodes CE11, CE12 and CE13 of the first capacitor C1 to the third capacitor C3, the gate electrodes G1-G8 of the transistors T1-T8, and wiring lines (for example, the first connection wiring L1, the second connection wiring L2, the third connection wiring L3, and the fourth connection wiring L4) directly connected to the gate electrodes G1-G8, and correspondingly, the first insulating layer may also serve as a gate insulating layer. As illustrated in FIG. 4B, the gate electrodes G1-G8 of transistors T1-T8 are represented by circular or elliptical dotted lines, that is, the portions where the semiconductor layer structures of respective transistors overlap with the electrodes or wiring in the first conductive layer 320.

FIG. 4C shows the second conductive layer 330 of the display substrate 10. The second conductive layer 330 includes the second electrodes CE21, CE22 and CE23 of the first capacitor C1 to the third capacitor C3, and wiring lines (for example, an electrode connection wiring M1) for connecting with signal lines or transfer electrodes in the third conductive layer 340. For example, the second electrode CE21 at least partially overlaps with the first electrode CE11 to form the first capacitor C1, the second electrode CE22 at least partially overlaps with the first electrode CE12 to form the second capacitor C2, and the second electrode CE23 at least partially overlaps with the first electrode CE13 to form the third capacitor C3.

FIG. 4E shows the third conductive layer 340 of the display substrate 10, and the third conductive layer 340 includes at least parts of some of the plurality of signal lines, such as the first clock signal line ECK, the second clock signal line ECB, and the trigger signal line ESTV, and for example, further includes the second power signal line VGH and the first power signal line VGL. It should be noted that the third conductive layer 340 further includes the first transfer electrode 110, the second transfer electrode 120, the third transfer electrode 130, the fourth transfer electrode 140, the fifth transfer electrode 150, the sixth transfer electrode 160, the seventh transfer electrode 170, the second power signal line transfer electrode 180, the first power signal line transfer electrode 190, and the like, which are connected between transistors, capacitors, and signal lines. For example, the second transfer electrode 120 includes an input terminal EI, and the third transfer electrode 130 includes an output terminal EOUT.

It should be noted that, in the embodiments of the present disclosure, the second transfer electrode 120 located in the third conductive layer 340 can be used to receive the input signal; and in other embodiments of the present disclosure, the input signal of the input terminal EI of the shift register unit 105 may also be received by electrodes located in other layers, that is, the input terminal EI may also be located in other layers different from the third conductive layer 340, such as in the first conductive layer 320 or the second conductive layer 330. The embodiments of the present disclosure are not limited in this aspect.

It should be noted that in the embodiments of the present disclosure, the third transfer electrode 130 located in the third conductive layer 340 can be used to provide an output signal; and in other embodiments of the present disclosure, the output signal of the output terminal EOUT of the shift register unit 105 may also be provided by electrodes located in other layers, that is, the output terminal EOUT may also be located in other layers different from the third conductive layer 340, such as in the first conductive layer 320 or the second conductive layer 330. The embodiments of the present disclosure are not limited in this aspect.

It should be noted that, in the embodiments of the present disclosure, both the second transfer electrode 120 and the third transfer electrode 130 are located in the third conductive layer 340. Therefore, except for the last-stage shift register unit 105, the third transfer electrode 130 for providing an output signal can be connected to the second transfer electrode 120 in the next-stage shift register unit 105 and formed integrally, so as to provide an input signal to the input terminal EI of the next-stage shift register unit 105; and except for the first-stage shift register unit 105, the second transfer electrode 120 for receiving the input signal may be connected to and integrally formed with the third transfer electrode 130 in the previous-stage shift register unit 105, thereby receiving the output signal of the output terminal EOUT of the previous-stage shift register unit 105 as the input signal of the input terminal EI of the current-stage shift register unit 105.

FIG. 4F shows the fourth conductive layer 350 of the display substrate 10, which includes at least parts of some of the plurality of signal lines, such as the first clock signal line ECK, the second clock signal line ECB and the trigger signal line ESTV, and also includes the output signal transmitting line GL electrically connected to the second shift register unit 104.

As illustrated in FIG. 3 to FIG. 5, the first clock signal line ECK, the second clock signal line ECB, the trigger signal line ESTV, the second power signal line VGH and the first power signal line VGL can be connected to the transistors and capacitors in other layers through at least one via hole illustrated in FIG. 4D, and the transistors and capacitors can also be connected through at least one via hole or bridged by a transfer electrode, which will not be repeated here.

For example, the materials of the third conductive layer 340 and the fourth conductive layer 350 may include titanium, titanium alloy, aluminum, aluminum alloy, copper, copper alloy, or any other suitable composite material, and the embodiments of the present disclosure are not particularly limited in this aspect. For example, the materials of the first conductive layer 320 and the second conductive layer 330 may be the same as or similar to the materials of the third conductive layer 340 and the fourth conductive layer 350, which will not be described here.

FIG. 3 is a schematic diagram of the stacking position relationship of the semiconductor layer 310 illustrated in FIG. 4A, the first conductive layer 320 illustrated in FIG. 4B, the second conductive layer 330 illustrated in FIG. 4C, the third conductive layer 340 illustrated in FIG. 4E, and the fourth conductive layer 350 illustrated in FIG. 4F.

For example, as illustrated in FIG. 3 and FIG. 4A, the active layer A1 of the first control transistor T1 and the active layer A2 of the second control transistor T2 respectively extend along the second direction X different from the first direction Y. The orthographic projection of the active layer A1 of the first control transistor T1 on the base substrate 100 and the orthographic projection of the active layer A2 of the second control transistor T2 on the base substrate 100 are located on the side of the orthographic projection of the first clock signal line ECK and the second clock signal line ECB on the base substrate 100 close to the display region 102, that is, in the second direction X, the active layer A1 of the first control transistor T1 and the active layer A2 of the second control transistor T2 are located on the right side of the first clock signal line ECK and the second clock signal line ECB.

For example, as illustrated in FIG. 3 and FIG. 4A, a minimum distance between the orthographic projection of the active layer A1 of the first control transistor T1 on the base substrate 100 and the orthographic projection of the first clock signal line ECK and the second clock signal line ECB on the base substrate 100 in the second direction X is a first distance D1, and a minimum distance between the orthographic projection of the active layer A2 of the second control transistor T2 on the base substrate 100 and the orthographic projection of the first clock signal line ECK and the second clock signal line ECB on the base substrate 100 in the second direction X is a second distance D2. For example, the first distance D1 is a distance in the second direction X between the orthographic projection of the active layer A1 of the first control transistor T1 on the base substrate 100 and an edge of the side of the first clock signal line ECK close to the display region 102, and the second distance D2 is a distance in the second direction X between the orthographic projection of the active layer A2 of the second control transistor T2 on the base substrate 100 and an edge of the side of the first clock signal line ECK close to the display region 102. The difference between the first distance D1 and the second distance D2 is greater than or equal to 0 and less than or equal to a dimension AL1 of the active layer A1 of the first control transistor T1 in the second direction X or a dimension AL2 of the active layer A2 of the second control transistor T2 in the second direction X, that is, $0 \leq |D1-D2| \leq AL1$ or $0 \leq |D1-D2| \leq AL2$. For example, AL1 is a length of the active layer A1 of the first control transistor T1 in the second direction X, and AL2 is a length of the active layer A2 of the second control transistor T2 in the second direction X. Thereby, the active layer A1 of the first control transistor T1 and the active layer A2 of the second control transistor T2 are arranged side by side in the first direction Y.

Therefore, by allowing the difference between the first distance D1 and the second distance D2 to be greater than or equal to 0 and less than or equal to the dimension AL1 of the active layer A1 of the first control transistor T1 in the second direction X or the dimension AL2 of the active layer A2 of the second control transistor T2 in the second direction X, the active layer A1 of the first control transistor T1 and the active layer A2 of the second control transistor T2 can be arranged side by side in the first direction Y, thereby reducing the size of the first control transistor T1 and the second control transistor T2 in the second direction X and optimizing the layout design of the first control transistor T1 and the second control transistor T2 in the shift register unit 105. Furthermore, to some extent, the size of the shift register unit 105 in the second direction X and the space that the shift register unit 105 needs to occupy in the peripheral region 106 of the display substrate are reduced, thereby facilitating achieving the narrow frame design of the display substrate 10 while ensuring the display quality of the display substrate. Furthermore, more sufficient space can be reserved for other transistors, capacitors, wiring lines, or the like in the shift register unit 105, so that the circuit connection and structural layout of the shift register unit 105 can be further optimized.

For example, the first distance D1 may range from 30 microns (μm) to 60 microns, such as 40 microns to 55 microns; and the second distance D2 may range from 30 microns to 60 microns, for example, from 40 microns to 55 microns. Thereby, the layout of the first control transistor T1 and the second control transistor T2 in the first direction Y and the second direction X can be further optimized.

For example, the first distance D1 may be 40 μm, 42 μm, 44 μm, 45 μm, 47 μm, 49 μm, 50 μm, 52 μm, 55 μm, or the like, and the second distance D2 may be 40 μm, 42 μm, 44 μm, 45 μm, 47 μm, 49 μm, 50 μm, 52 μm, 55 μm, or the like.

For example, the size AL1 of the active layer A1 of the first control transistor T1 in the second direction X may be set to be similar to the size AL2 of the active layer A2 of the second control transistor T2 in the second direction X, thereby further optimizing the layout structure of the first control transistor T1 and the second control transistor T2 in the display substrate.

For example, as illustrated in FIG. 3 and FIG. 4B, the gate electrode G1 of the first control transistor T1 and the gate electrode G2 of the second control transistor T2 are parallel to each other in the first direction Y, that is, the gate electrode G1 of the first control transistor T1 and the gate electrode G2 of the second control transistor T2 are arranged side by side in the first direction Y. Therefore, the sizes of the first control transistor T1 and the second control transistor T2 in the second direction X are further reduced, and the layout design of the first control transistor T1 and the second control transistor T2 in the shift register unit 105 is optimized.

For example, as illustrated in FIG. 3 and FIG. 4B, the gate electrode G1 of the first control transistor T1 includes a body portion G11 extending in the second direction X and two sub-gate electrodes G12 (parallel to each other) extending from the body portion G11 of the gate electrode G1 of the first control transistor T1, that is, the first control transistor T1 has a double-gate structure. For example, the two sub-gate electrodes G12 parallel to each other extend along the first direction Y, respectively. The gate electrode G2 of the second control transistor T2 includes a main body portion G21 extending in the second direction X and two sub-gate electrodes G22 (parallel to each other) extending from the main body portion G21 of the gate electrode G2 of the second control transistor T2, that is, the second control transistor T2 has a double-gate structure. For example, the two sub-gate electrodes G22 parallel to each other extend along the first direction Y, respectively.

Therefore, by forming the gate electrode G1 of the first control transistor T1 and the gate electrode G2 of the second control transistor T2 into a U-shaped structure, the stability of the first control transistor T1 and the second control transistor T2 can be improved, and the performance of the first control transistor T1 and the second control transistor T2 can be improved.

It should be noted that, in other embodiments of the present disclosure, taking the first control transistor T1 as an example, the active layer of the first control transistor T1 may have a U-shaped structure, and the gate electrode of the first control transistor T1 may have an I-shaped structure overlapping with the U-shaped active layer, thus forming a double-gate structure, as long as the arrangement of other structures is not affected and the width of the shift register unit is not excessively increased. The embodiments of the present disclosure are not limited in this aspect. It should be noted that a single gate electrode may overlap with the active layer of the first control transistor T1, and the embodiments of the present disclosure are not limited to this case.

For example, as illustrated in FIG. 3, FIG. 4B and FIG. 4E, the display substrate 10 further includes a first connection wiring L1. The first connection wiring L1 extends along the second direction X. The orthographic projection of the first connection wiring L1 on the base substrate 100 is located on the side of the orthographic projection of the gate electrode G2 of the second control transistor T2 on the base substrate 100 away from the display region 102. For example, in the second direction X, the first connection wiring L1 is located on the left side of the gate electrode G2 of the second control transistor T2. A first end L11 of the first connection wiring L1 is connected to the gate electrode G2 of the second control transistor T2, for example, connected to the main body G21 of the gate electrode G2 of the second control transistor T2, thereby simplifying the layout structure of the first connection wiring L1. A second end L12 of the first connection wiring L1 is connected to the second clock signal line ECB through a via hole penetrating the second insulating layer and the third insulating layer to receive the second clock signal provided by the second clock signal line ECB. Therefore, the second clock signal provided by the second clock signal line ECB can be transmitted to the gate electrode G2 of the second control transistor T2 through the first connection wiring L1. The first connection wiring L1 and the gate electrode G2 of the second control transistor T2 can be integrally formed, thereby simplifying the manufacturing process of the display substrate 10 and reducing the manufacturing cost.

For example, as illustrated in FIG. 3 and FIG. 4E, the display substrate further includes a first transfer electrode 110. The first transfer electrode 110 includes a first sub-portion 111 extending in the first direction Y. A first end 111A of the first sub-portion 111 of the first transfer electrode 110 is connected to (for example, integrally formed with) the second electrode of the first control transistor T1, and a second end 111B of the first sub-portion 111 of the first transfer electrode 110 is connected to (for example, integrally formed with) the second electrode of the second control transistor T2, so that the connection between the second electrode of the first control transistor T1 and the second electrode of the second control transistor T2 is achieved through the first transfer electrode 110.

For example, the first transfer electrode 110 may serve as the first node N1 in the circuit structure illustrated in FIG. 2A.

For example, as illustrated in FIG. 3, FIG. 4A and FIG. 4E, the second power signal line VGH extends in the first direction Y, and the orthographic projection of the second power signal line VGH on the base substrate 100 is located on the side of the orthographic projection of the active layer A1 of the first control transistor T1 and the orthographic projection of the active layer A2 of the second control transistor T2 on the base substrate 100 close to the display region 102, that is, in the second direction X, the second power signal line VGH is located on the right side of the active layer A1 of the first control transistor T1 and the active layer A2 of the second control transistor T2. The display substrate further includes a second power signal line transfer electrode 180, which is connected to and integrally formed with the second power signal line VGH to transmit the second voltage provided by the second power signal line VGH. The first electrode of the first control transistor T1 and the first electrode of the second control transistor T2 are respectively connected to the second power signal line transfer electrode 180, preferably for example, integrally formed with the second power signal line transfer electrode 180, so that the first electrode of the first control transistor T1 and the first electrode of the second control transistor T2 are respectively connected to the second power signal line VGH through the second power signal line transfer electrode 180 to receive the second voltage.

For example, the ratio between the width of the second power signal line VGH in the second direction X and the width of the first clock signal line ECK in the second direction X is greater than or equal to 1.2 and less than or equal to 3, that is, the width of the second power signal line VGH in the second direction X may be 1.2 to 3 times that of the first clock signal line ECK in the second direction X; the ratio between the width of the second power signal line VGH in the second direction X and the width of the second clock signal line ECB in the second direction X is greater than or equal to 1.2 and less than or equal to 3, that is, the width of the second power signal line VGH in the second direction X may be 1.2 to 3 times that of the second clock signal line ECB in the second direction X. Therefore, the stability of the signal transmitted on the second power signal line VGH is improved, and the charging time is reduced.

For example, the width of the second power signal line VGH in the second direction X may be 1.1 times, 1.2 times, 1.33 times, 1.5 times, 1.8 times, 2 times, 2.2 times, 2.5 times, 2.7 times or 3 times the width of the first clock signal line ECK in the second direction X, and the width of the second power signal line VGH in the second direction X may be 1.1 times, 1.2 times, 1.33 times, 1.5 times, 1.8 times, 2 times, 2.2 times, 2.5 times, 2.7 times or 3 times the width of the second clock signal line ECB in the second direction X.

For example, as illustrated in FIG. 3, FIG. 4A and FIG. 4E, the display substrate further includes a second transfer electrode 120. The orthographic projection of the second transfer electrode 120 on the base substrate 100 is located on the side of the orthographic projection of the active layer A1 of the first control transistor T1 and the orthographic projection of the active layer A2 of the second control transistor T2 on the base substrate 100 away from the display region 102, that is, in the second direction X, the second transfer electrode 120 is located on the left side of the active layer A1 of the first control transistor T1 and the active layer A2 of the second control transistor T2. The second transfer electrode 120 extends in the first direction Y and is connected to the gate electrode G1 of the first control transistor T1 through a via hole penetrating the second insulating layer and the third insulating layer, for example, connected to the main body G11 of the gate electrode G1 of the first control transistor T1.

For example, in the K-th shift register unit 105, the second transfer electrode 120 is connected to the output terminal EOUT of the shift register unit at the previous stage to receive the input signal.

For example, when the shift register unit 105 is the first-stage shift register unit, the second transfer electrode 120 is connected to the trigger signal line ESTV, so that the trigger signal provided by the trigger signal line ESTV is used as the input signal of the shift register unit at the current stage.

For example, as illustrated in FIG. 3 and FIG. 4A, the orthographic projection of the active layer A7 of the output transistor T7 on the base substrate 100 and the orthographic projection of the active layer A8 of the output control transistor T8 on the base substrate 100 are located on the side of the orthographic projection of the active layer A1 of the first control transistor T1 and the orthographic projection of the active layer A2 of the second control transistor T2 on the base substrate 100 close to the display region 102, and are on the side of the orthographic projection of the second power signal line VGH on the base substrate 100 away from the display region 102. That is, in the second direction X, the active layer A7 of the output transistor T7 and the active layer A8 of the output control transistor T8 are located between the second power signal line VGH and the active layer A1 of the first control transistor T1 as well as the active layer A2 of the second control transistor T2.

For example, as illustrated in FIG. 3 and FIG. 4A, the display substrate includes at least one common semiconductor pattern, for example, the at least one common semiconductor pattern includes a plurality of common semiconductor patterns CSP. The active layer A7 of the output transistor T7 and the active layer A8 of the output control transistor T8 are different parts of the common semiconductor patterns CSP, respectively, thereby improving the stability of the output transistor T7 and the output control transistor T8.

For example, the plurality of common semiconductor patterns CSP are spaced apart from each other in the second direction X and arranged in parallel. Alternatively, in other embodiments of the present disclosure, the plurality of common semiconductor patterns CSP may be continuously arranged in the second direction X to form one common semiconductor pattern, and the embodiments of the present disclosure are not limited to this case.

For example, in the first direction Y, the active layer A7 of the output transistor T7 is located below the active layer A8 of the output control transistor T8, so that the active layer A7 of the output transistor T7 and the active layer A8 of the output control transistor T8 are arranged side by side in the first direction Y, thereby reducing the size of the active layer A7 of the output transistor T7 and the active layer A8 of the output control transistor T8 in the second direction X.

For example, as illustrated in FIG. 3 and FIG. 4B, the gate electrode G7 of the output transistor T7 includes a plurality of sub-gate electrodes G71 connected in parallel, and the sub-gate electrodes G71 of the output transistor T7 are parallel to each other in the first direction Y. For example, each sub-gate electrode G71 of the output transistor T7 extends along the second direction X, so that the gate electrode G7 of the output transistor T7 is comb-shaped in the first direction Y, thereby improving the stability of the output transistor T7. The gate electrode G8 of the output control transistor T8 includes a plurality of sub-gate electrodes G81 connected in parallel, and the sub-gate electrodes G81 of the output control transistor T8 are parallel to each other in the first direction Y. For example, each sub-gate electrode G81 of the output control transistor T8 extends along the second direction X, so that the gate electrode G8 of the output control transistor T8 is comb-shaped in the first direction Y, thereby improving the stability of the output control transistor T8.

For example, as illustrated in FIG. 3, FIG. 4A and FIG. 4E, the display substrate 10 further includes a third transfer electrode 130 and a first power signal line transfer electrode 190. The first power signal line VGL extends in the first direction Y, and the orthographic projection of the first power signal line VGL on the base substrate 100 is located on the side of the orthographic projection of the active layer A1 of the first control transistor T1 and the orthographic projection of the active layer A2 of the second control transistor T2 on the base substrate 100 away from the display region 102, that is, in the second direction X, the first power signal line VGL is located on the left side of the active layer A1 of the first control transistor T1 and the active layer A2 of the second control transistor T2. The first power signal line transfer electrode 190 is connected to and integrally formed with the first power signal line VGL, thereby transmitting the first voltage provided by the first power signal line VGL. The first electrode of the output transistor T7 is connected to the first power signal line VGL through the first power signal line transfer electrode 190 to receive the first voltage. The first electrode of the output control transistor T8 is connected to the second power signal line transfer electrode 180, and is preferably formed integrally with the second power signal line transfer electrode 180, so that the first electrode of the output control transistor T8 is connected to the second power signal line VGH through the second power signal line transfer electrode 180 to receive the second voltage. The second electrode of the output transistor T7 is connected to the third transfer electrode 130, preferably integrally formed, and the second electrode of the output control transistor T8 is connected to the third transfer electrode 130, preferably integrally formed, and the output terminal EOUT includes the third transfer electrode 130, that is, the second electrode of the output transistor T7 and the second electrode of the output control transistor T8 are respectively connected to the output terminal EOUT through the third transfer electrode 130 to provide the output signal.

For example, the ratio between the width of the first power signal line VGL in the second direction X and the width of the first clock signal line ECK in the second direction X is greater than or equal to 1.2 and less than or equal to 3, that is, the width of the first power signal line VGL in the second direction X may be 1.2 to 3 times that of the first clock signal line ECK in the second direction X; the ratio between the width of the first power signal line VGL in the second direction X and the width of the second clock signal line ECB in the second direction X is greater than or equal to 1.2 and less than or equal to 3, that is, the width of the first power signal line VGL in the second direction X may be 1.2 to 3 times that of the second clock signal line ECB in the second direction X. Therefore, the stability of the signal transmitted on the first power signal line VGL is improved, and the charging time is reduced.

For example, the width of the first power signal line VGL in the second direction X may be 1.1 times, 1.2 times, 1.33 times, 1.5 times, 1.8 times, 2 times, 2.2 times, 2.5 times, 2.7 times or 3 times the width of the first clock signal line ECK in the second direction X, and the width of the first power signal line VGL in the second direction X may be 1.1 times, 1.2 times, 1.33 times, 1.5 times, 1.8 times, 2 times, 2.2 times, 2.5 times, 2.7 times or 3 times the width of the second clock signal line ECB in the second direction X.

For example, as illustrated in FIG. 3, FIG. 4A and FIG. 4E, the orthographic projection of the first capacitor C1 on the base substrate 100 is located between the orthographic projection of the active layer A7 of the output transistor T7 on the base substrate 100 and the orthographic projection of the second power signal line VGH on the base substrate 100, and is arranged side by side with the orthographic projection of the active layer A7 of the output transistor T7 on the base substrate 100 in the second direction X, that is, in the second direction X, the first capacitor C1 is located between the active layer A7 of the output transistor T7 and the second power signal line VGH. The orthographic projection of the second capacitor C2 on the base substrate 100 is located between the orthographic projection of the active layer A8 of the output control transistor T8 on the base substrate 100 and the orthographic projection of the second power signal line VGH on the base substrate 100, and is arranged side by side with the orthographic projection of the active layer of the output control transistor T8 on the base substrate 100 in the second direction X, that is, in the second direction X, the second capacitor C2 is located between the active layer A8 of the output control transistor T8 and the second power signal line VGH. For example, the first capacitor C1 and the second capacitor C2 may partially overlap with the second power signal line VGH, respectively. The orthographic projection of the first capacitor C1 on the base substrate 100 and the orthographic projection of the second capacitor C2 on the base substrate 100 are arranged side by side in the first direction Y, that is, the first capacitor C1 and the second capacitor C2 are arranged along the first direction Y. For example, in the first direction Y, the second capacitor C2 is located above the first capacitor C1.

Therefore, by arranging the first capacitor C1 and the second capacitor C2 side by side in the first direction Y, the number of devices arranged side by side in the second direction X can be further reduced, so that the space occupied by the first capacitor C1 and the second capacitor C2 in the second direction X can be reduced, and the size of the shift register unit 105 in the second direction X can be compressed to some extent, which is beneficial to realizing the narrow frame design of the display substrate 10 and ensuring the display quality of the display substrate 10.

For example, as illustrated in FIG. 3, FIG. 4B, and FIG. 4C, the first electrode CE11 of the first capacitor C1 is connected to and integrally formed with the gate electrode G7 of the output transistor T7 to form, for example, a comb structure. The second electrode CE21 of the first capacitor C1 is connected to the third transfer electrode 130 through a via hole penetrating the third insulating layer. The first electrode CE12 of the second capacitor C2 is connected to and integrally formed with the gate electrode G8 of the output control transistor T8 to form, for example, a comb structure. The second electrode CE22 of the second capacitor C2 is connected to the second power signal line VGH through a via hole penetrating the third insulating layer to receive the second voltage.

For example, as illustrated in FIG. 3 and FIG. 4A, the active layer A3 of the third control transistor T3 extends along the second direction X. For example, as illustrated in FIG. 3 and FIG. 4A, the minimum distance in the second direction X between the orthographic projection of the active layer A3 of the third control transistor T3 on the base substrate 100 and the orthographic projection of the first clock signal line ECK and the second clock signal line ECB on the base substrate 100 is a third distance D3. For example, the third distance D3 is a distance in the second direction X between the orthographic projection of the active layer A3 of the third control transistor T3 on the base substrate 100 and the edge of the side of the first clock signal line ECK close to the display region 102. The difference between the first distance D1 and the third distance D3 is greater than or equal to 0 and less than or equal to twice the size AL1 of the active layer A1 of the first control transistor T1 in the second direction X or twice the size AL3 of the active layer A3 of the third control transistor T3 in the second direction X, that is, 0≤|D1−D3|≤2AL1 or 0≤|D1−D3|≤2AL3. The difference between the second distance D2 and the third distance D3 is greater than or equal to 0 and less than or equal to twice the size AL2 of the active layer A2 of the second control transistor T2 in the second direction X or twice the size AL3 of the active layer A3 of the third control transistor T3 in the second direction X, that is, 0≤|D2−D3|≤2AL2 or 0≤|D2−D3|≤2AL3. For example, AL3 is the length of the active layer A3 of the third control transistor T3 in the second direction X. Thereby, the active layer A1 of the first control transistor T1, the active layer A2 of the second control transistor T2 and the active layer A3 of the third control transistor T3 are arranged side by side in the first direction Y.

For example, the orthographic projection of the active layer A3 of the third control transistor T3 on the base substrate 100 is located on the side of the orthographic projection of the first clock signal line ECK and the second clock signal line ECB on the base substrate 100 close to the display region 102. For example, the orthographic projection of the active layer A3 of the third control transistor T3 on the base substrate 100 is located on the side of the orthographic projection of the active layer A2 of the second control transistor T2 on the base substrate 100 away from the orthographic projection of the active layer A1 of the first control transistor T1 on the base substrate 100. That is, the active layer A1 of the first control transistor T1, the active layer A2 of the second control transistor T2, and the active layer A3 of the third control transistor T3 are sequentially arranged in the first direction Y from top to bottom.

Therefore, by arranging the active layer A1 of the first control transistor T1, the active layer A2 of the second control transistor T2, and the active layer A3 of the third control transistor T3 side by side in the first direction Y, the sizes of the active layer A1 of the first control transistor T1, the active layer A2 of the second control transistor T2, and the active layer A3 of the third control transistor T3 in the second direction X can be reduced, thereby optimizing the layout design of the first control transistor T1, the second control transistor T2 and the third control transistor T3 in the shift register unit 105. Furthermore, to some extent, the size of the shift register unit 105 in the second direction X and the space that the shift register unit 105 needs to occupy in the peripheral region 106 of the display substrate 10 can be reduced, which is conducive to realizing the narrow frame design of the display substrate 10 while ensuring the display quality of the display substrate 10. Furthermore, more sufficient space can be reserved for other transistors, capacitors, wiring lines or the like in the shift register unit 105, so that the circuit connection and structural layout of the shift register unit 105 can be further optimized.

For example, as illustrated in FIG. 3 and FIG. 4B, the gate electrode G1 of the first control transistor T1, the gate electrode G2 of the second control transistor T2 and the gate electrode G3 of the third control transistor T3 are parallel to each other in the first direction Y, that is, the gate electrode G1 of the first control transistor T1, the gate electrode G2 of the second control transistor T2, and the gate electrode G3 of the third control transistor T3 are sequentially arranged in the first direction Y from top to bottom. Therefore, the sizes of the first control transistor T1, the second control transistor T2 and the third control transistor T3 in the second direction X are further reduced, and the layout design of the first control transistor T1, the second control transistor T2 and the third control transistor T3 in the shift register unit 105 is optimized.

For example, as illustrated in FIG. 3 and FIG. 4B, the orthographic projection of the third capacitor C3 on the base substrate 100 is located between the orthographic projection of the active layer A3 of the third control transistor T3 on the base substrate 100 and the orthographic projection of the active layer A2 of the second control transistor T2 on the base substrate 100 in the first direction Y. That is, in the first direction Y, the third capacitor C3 is located between the active layer A3 of the third control transistor T3 and the active layer A2 of the second control transistor T2, thereby further reducing the size of the shift register unit 105 in the second direction X to some extent.

For example, as illustrated in FIG. 3, FIG. 4B, FIG. 4C and FIG. 4E, the first transfer electrode 110 further includes a second sub-portion 112 extending in the second direction X, and the end of the second sub-portion 112 of the first transfer electrode 110 is connected to the first electrode CE13 of the third capacitor C3 through a via hole penetrating the second and third insulating layers. The first electrode CE13 of the third capacitor C3 is connected to and integrally formed with the gate electrode G3 of the third control transistor T3, and the second electrode CE23 of the third capacitor C3 is connected to and integrally formed with the electrode connection wiring M1, thereby simplifying the manufacturing process of the display substrate 10 and reducing the manufacturing cost. The electrode connection wiring M1 extends in the second direction X. The first end M11 of the electrode connection wiring M1 is connected to the first clock signal line ECK through a via hole penetrating the third insulating layer to receive the first clock signal; and the second end M12 of the electrode connection wiring M1 is connected to the second electrode CE23 of the third capacitor C3 to transmit the first clock signal provided by the first clock signal line ECK. The display substrate further includes a fourth transfer electrode 140, which extends along the first direction Y to reduce the size in the second direction X. The first end 141 of the fourth transfer electrode 140 is connected to the second end M12 of the electrode connection wiring M1 through a via hole penetrating the third insulating layer, and the second end 142 of the fourth transfer electrode 140 is connected to and for example, preferably integrally formed with the first electrode of the third control transistor T3. Thereby, the first clock signal provided by the first clock signal line ECK is transmitted through the fourth transfer electrode 140 and the electrode connection wiring M1.

For example, as illustrated in FIG. 3 and FIG. 4A, the active layer A4 of the fourth control transistor T4 extends along the second direction X, and the orthographic projection of the active layer A4 of the fourth control transistor T4 on the base substrate 100 is located on the side of the orthographic projection of the active layer A3 of the third control transistor T3 on the base substrate 100 away from the orthographic projection of the active layer A2 of the second control transistor T2 on the base substrate 100 in the first direction Y.

For example, as illustrated in FIG. 3 and FIG. 4A, the minimum distance in the second direction X between the orthographic projection of the active layer A4 of the fourth control transistor T4 on the base substrate 100 and the orthographic projection of the first clock signal line ECK and the second clock signal line ECB on the base substrate 100 is a fourth distance D4. For example, the fourth distance D4 is a distance in the second direction X between the orthographic projection of the active layer A4 of the fourth control transistor T4 on the base substrate 100 and the edge of the side of the first clock signal line ECK close to the display region 102. The difference between the third distance D3 and the fourth distance D4 is greater than or equal to 0 and less than or equal to the dimension AL3 of the active layer A3 of the third control transistor T3 in the second direction X or the dimension AL4 of the active layer A4 of the fourth control transistor T4 in the second direction X, that is, $0 \leq |D3-D4| \leq AL3$ or $0 \leq |D3-D4| \leq AL4$. For example, AL4 is the length of the active layer A4 of the fourth control transistor T4 in the second direction X. Therefore, the active layer A2 of the second control transistor T2, the active layer A3 of the third control transistor T3, and the active layer A4 of the fourth control transistor T4 are sequentially arranged from top to bottom in the first direction Y, thereby further optimizing the layout structure of the second control transistor T2, the third control transistor T3 and the fourth control transistor T4 in the display substrate 10 and reducing the size of the shift register unit 105 in the second direction X to some extent.

For example, as illustrated in FIG. 3, FIG. 4B and FIG. 4E, the display substrate 10 further includes a fifth transfer electrode 150 and a second connection wiring L2. The fifth transfer electrode 150 extends along the second direction X. The first end 151 of the fifth transfer electrode 150 is connected to the second electrode of the third control transistor T3, and is preferably formed integrally, while the second end 152 of the fifth transfer electrode 150 is connected to the first electrode of the fourth control transistor T4, and is preferably formed integrally. The first end L21 of the second connection wiring L2 is connected to the fifth transfer electrode 150 through a via hole penetrating the second insulating layer and the third insulating layer, and the second end L22 of the second connection wiring L2 is connected to the gate electrode G8 of the output control transistor T8. The second connection wiring L2 can be integrally formed with the gate electrode G8 of the output control transistor T8 to simplify the manufacturing process of the display substrate 10. The second electrode of the fourth control transistor T4 is connected to and for example, preferably integrally formed with the second power signal line transfer electrode 180 to receive the second voltage.

For example, as illustrated in FIG. 3 and FIG. 4A, the active layer A6 of the input transistor T6 and the active layer A5 of the fifth control transistor T5 extend in the first direction Y and are arranged side by side in the second direction X, respectively, thereby reducing the size of the active layer A6 of the input transistor T6 and the active layer A5 of the fifth control transistor T5 in the second direction X. The orthographic projection of the active layer A6 of the input transistor T6 on the base substrate 100 and the orthographic projection of the active layer A5 of the fifth control transistor T5 on the base substrate 100 are located on the side of the orthographic projection of the active layer A4 of the fourth control transistor T4 on the base substrate 100 away from the orthographic projection of the active layer A3 of the third control transistor T3 on the base substrate 100. That is, the active layer A6 of the input transistor T6 and the active layer A5 of the fifth control transistor T5 are located below the active layer A4 of the fourth control transistor T4 in the first direction Y.

For example, as illustrated in FIG. 3 and FIG. 4A, the minimum distance in the second direction X between the orthographic projection of the active layer A6 of the input transistor T6 on the base substrate 100 and the orthographic projection of the first clock signal line ECK and the second clock signal line ECB on the base substrate 100 is a fifth distance D5. For example, the fifth distance D5 is a distance in the second direction X between the orthographic projection of the active layer A6 of the input transistor T6 on the base substrate 100 and the edge of the side of the first clock signal line ECK close to the display region 102. The difference between the fourth distance D4 and the fifth distance D5 is greater than or equal to 0 and less than or equal to 1.5 times the size of the active layer A4 of the fourth control transistor T4 in the second direction X, that is, $0 \leq |D4-D5| \leq 1.5AL4$. Thereby, the layout of the input transistor T6 in the first direction Y and the second direction X is further optimized.

For example, as illustrated in FIG. 3 and FIG. 4A, the minimum distance between the orthographic projection of the active layer A6 of the input transistor T6 on the base substrate 100 and the orthographic projection of the active layer A4 of the fourth control transistor T4 on the base substrate 100 in the first direction Y is a sixth distance D6, and the minimum distance between the orthographic projection of the active layer A5 of the fifth control transistor T5 on the base substrate 100 and the orthographic projection of the active layer A4 of the fourth control transistor T4 on the base substrate 100 in the first direction Y is a seventh distance D7. The difference between the sixth distance D6 and the seventh distance D7 is greater than or equal to 0 and less than or equal to the dimension AL6 of the active layer A6 of the input transistor T6 in the first direction Y or the dimension AL5 of the active layer A5 of the fifth control transistor T5 in the first direction Y, that is, $0 \leq |D6-D7| \leq AL5$ or $0 \leq |D6-D7| \leq AL6$. For example, AL5 is the length of the active layer A5 of the fifth control transistor T5 in the first direction Y, and AL6 is the length of the active layer A6 of the input transistor T6 in the first direction Y. Thereby, the layout of the fifth control transistor T5 and the input transistor T6 in the first direction Y is further optimized.

For example, in other embodiments of the present disclosure, the active layer A6 of the input transistor T6 and the active layer A5 of the fifth control transistor T5 may extend along the second direction X and be arranged side by side in the first direction Y, respectively, therefore, the active layer A1 of the first control transistor T1, the active layer A2 of the second control transistor T2, the active layer A3 of the third control transistor T3, the active layer A4 of the fourth control transistor T4, the active layer A6 of the input transistor T6, and the active layer A5 of the fifth control transistor T5 in the shift register unit 105 all extend along the second direction X and are arranged in sequence in the first direction Y, thereby simplifying the manufacturing process of the display substrate 10, for example, simplifying the manufacturing process of the active layer of the display substrate 10 and reducing the manufacturing cost.

For example, in the case that the active layer A6 of the input transistor T6 and the active layer A5 of the fifth control transistor T5 extend along the second direction X, respectively, the active layer A6 of the input transistor T6 may be located above the active layer A5 of the fifth control transistor T5, that is, the orthographic projection of the active layer A5 of the fifth control transistor T5 on the base substrate 100 is located on the side of the orthographic projection of the active layer A6 of the input transistor T6 on the base substrate 100 away from the orthographic projection of the active layer A4 of the fourth control transistor T4 on the base substrate 100; alternatively, the active layer A6 of the input transistor T6 may be located below the active layer A5 of the fifth control transistor T5, that is, the orthographic projection of the active layer A5 of the fifth control transistor T5 on the base substrate 100 is located on the side of the orthographic projection of the active layer A6 of the input transistor T6 on the base substrate 100 close to the orthographic projection of the active layer A4 of the fourth control transistor T4 on the base substrate 100. The embodiments of the present disclosure are not limited in this aspect.

For example, as illustrated in FIG. 3, FIG. 4B and FIG. 4E, the display substrate 10 further includes a sixth transfer electrode 160, a seventh transfer electrode 170, a third connection wiring L3, and a fourth connection wiring L4. The first electrode of the input transistor T6 is connected to the first end 161 of the sixth transfer electrode 160, and is preferably formed integrally, while the second electrode of the input transistor T6 is connected to the second transfer electrode 120, and is preferably formed integrally. The third connection wiring L3 extends along the second direction X, and the first end L31 of the third connection wiring L3 is connected to the first clock signal line ECK through a via hole penetrating the second and third insulating layers to receive the first clock signal provided by the first clock signal line ECK. The second end L32 of the third connection wiring L3 is connected to the gate electrode G6 of the input transistor T6 to transmit the first clock signal. The third connection wiring L3 is integrally formed with the gate electrode G6 of the input transistor T6, thereby simplifying the manufacturing process of the display substrate 10 and reducing the manufacturing cost. The gate electrode G5 of the fifth control transistor T5 is connected to the first power signal line transfer electrode 190 through a via hole penetrating the second insulating layer and the third insulating layer to receive the first voltage. The first electrode of the fifth control transistor T5 is connected to the second end 162 of the sixth transfer electrode 160, and is preferably formed integrally. The second electrode of the fifth control transistor T5 is connected to the first end 171 of the seventh transfer electrode 170, which is preferably formed integrally. The second end 172 of the seventh transfer electrode 170 is connected to the first end L41 of the fourth connection wiring L4 through a via hole penetrating the second and third insulating layers, and the second end L42 of the fourth connection wiring L4 is connected to the gate electrode G7 of the output transistor T7. For example, the fourth connection wiring L4 can be integrally formed with the gate electrode G7 of the output transistor T7 to simplify the manufacturing process.

For example, as illustrated in FIG. 4E, the sixth transfer electrode 160 extends along the second direction X, so that the layout design between the first electrode of the fifth control transistor T5 and the first electrode of the input transistor T6 can be optimized. For example, in some embodiments of the present disclosure, the width of the line in each layer is generally 3 microns, and the distance between lines in the same layer is greater than, for example, 3 microns. For example, the distance between lines is related to the accuracy of the exposure machine, and the higher the accuracy of the exposure machine, the smaller the distance, which can be determined according to the actual situation. The embodiments of the present disclosure are not limited in this aspect. In the embodiments of the present disclosure, a necessary distance must be left between lines in the same layer to avoid wiring sticking, signal short circuit, or the like in the actual process.

The distance between the orthographic projection of each wiring line of the first conductive layer 320 on the base substrate 100 and the orthographic projection of each wiring line of the second conductive layer 330 on the base substrate 100 is generally 1.5 microns, for example, the gate electrode of the transistor in the first conductive layer 320 exceeds its active layer in the semiconductor layer 310 by more than 2 microns. For example, as illustrated in FIG. 3, FIG. 4A and FIG. 4B, the U-shaped double gate electrode of the first control transistor T1 exceeds the active layer of the first control transistor T1 by, for example, more than 2 microns on both sides of the active layer of the first control transistor T1 in the first direction Y. For example, the length of the portion that does not overlap with the active layer of the first control transistor T1 in the first direction Y is more than 2 microns, which is not limited by the embodiments of the present disclosure.

For example, the distance between the orthographic projection of the active layer of each transistor in the semiconductor layer 310 on the base substrate 100 and the orthographic projection of each gate wiring line in the first conductive layer 320 on the base substrate 100 is more than 1.5 microns, so that the channeling effect between the gate wiring and the active layer of each transistor in the semiconductor layer 310 can be avoided. For example, the distance between the orthographic projection of the semiconductor layer 310 on the base substrate 100 and the orthographic projection of the second conductive layer 330 on the base substrate 100 may be unlimited, for example, it may be overlapped. For example, in some embodiments of the present disclosure, a certain distance is reserved (as far as possible) between lines in different layers (this distance is smaller than the distance between lines in the same layer), so that unnecessary overlapping can be reduced to weaken or avoid interference caused by excessive parasitic capacitance.

For example, the width of each wiring line in the third conductive layer 340 should cover (e.g., completely cover) the corresponding via hole, for example, it can exceed the size of the via hole (e.g., the diameter of the via hole) by more than 1 micron. For example, the size of the via hole is 2.0 microns to 2.5 microns, and the width of each wiring line in the third conductive layer 340 covering the via hole is 4 microns to 5 microns. For example, the line widths of the output transistor T7 and the output control transistor T8 corresponding to the via holes are greater than the size of the via hole by the up distance of 1 micron and the down distance of 1 micron, such as 4.0 microns to 4.5 microns. Because there are many via holes corresponding to the output transistor T7 and the output control transistor T8, the width of the wiring line located in the third conductive layer 340 connecting other transistors only needs to meet the requirement of covering the via holes by more than 1 micron at the locations of the via holes. For example, the width of the line between the via holes may be relatively narrow.

For example, the distance between the first clock signal line ECK, the second clock signal line ECB, the second power signal line VGH and the first power signal line VGL, which are at least partially located in the third conductive layer 340, is 3 microns or more. The line widths of the first clock signal line ECK and the second clock signal line ECB are set to 9 microns or more to meet the driving capability requirements, and the line widths of the second power signal line VGH and the first power signal line VGL may be such as 6 microns, 9 microns or 10 microns. The first voltage provided by the first power signal line VGL may be, for example, −7V.

For example, in some examples, the thickness of the first conductive layer 320 and the thickness of the second conductive layer 330 are 2000 angstroms to 3000 angstroms, the thickness of the third conductive layer 340 is 5000 angstroms to 8000 angstroms, and the thickness of the fourth conductive layer 350 is 5000 angstroms to 8000 angstroms. The embodiments of the present disclosure are not particularly limited to this case.

For example, by setting the above-mentioned transfer electrodes, connection wirings, electrode connection wirings, etc., problems such as wiring line adhesion or signal short circuit caused by dense wiring in the same layer can be reduced or avoided. For example, the above-mentioned transfer electrodes, connection wirings and electrode connection wirings can play the role of connection or jumper connection.

The display substrate 10 provided by the above embodiments of the present disclosure further optimizes the circuit connection and structural layout of the shift register unit 105, compresses the size of the shift register unit 105 in the second direction X to a certain extent, and reduces the space that the shift register unit 105 needs to occupy in the peripheral region 106 of the display substrate 10, which is conducive to realizing the narrow frame design by using the display substrate 10, while ensuring the display quality achieved by using the di splay substrate 10.

Figure 11A:
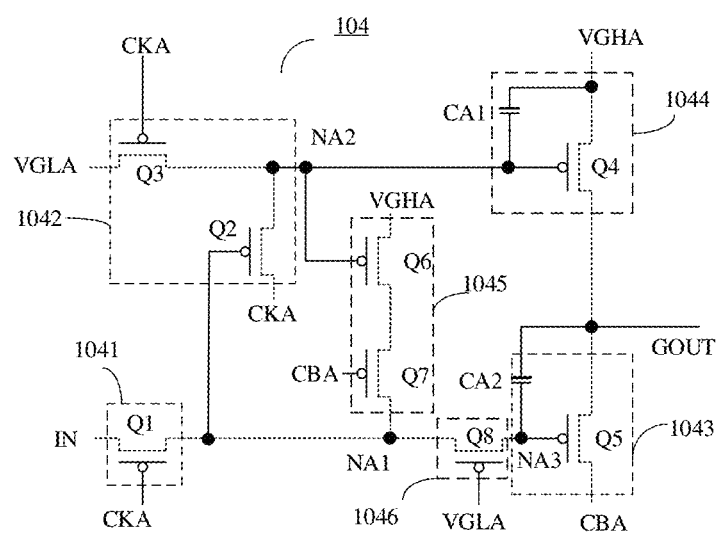
FIG. 11A is a circuit diagram of an example of a shift register unit in another display substrate provided by at least one embodiment of the present disclosure.

FIG. 11A is a circuit diagram of an example of a shift register unit in another display substrate provided by at least one embodiment of the present disclosure. For example, the shift register unit 105 in the above-mentioned first gate driving circuit may also adopt the circuit structure illustrated in FIG. 11A; alternatively, in the case that the shift register unit 105 in the first gate driving circuit adopts the circuit structure illustrated in FIG. 2A, the second shift register unit 104 in the second gate driving circuit may adopt the circuit structure illustrated in FIG. 11A to be used as, for example, a scan driving shift register unit, so that a gate scan driving circuit is composed of a plurality of cascaded scan driving shift register units to be as the second gate driving circuit.

In the following, the embodiments of the present disclosure take the second shift register unit 104, with the circuit structure illustrated in FIG. 11A, in the second gate driving circuit as an example to illustrate the structure and functions of the second shift register unit 104. It should be noted that this does not constitute a limitation on the embodiments of the present disclosure, which include but are not limited to this case. For example, the second shift register unit 104 may also be a reset control shift register unit or a light-emitting control shift register unit, and the embodiments of the present disclosure are not particularly limited to this case. For convenience and conciseness, the second shift register unit 104 will be simply referred to as the shift register unit for description.

Figure 11B:
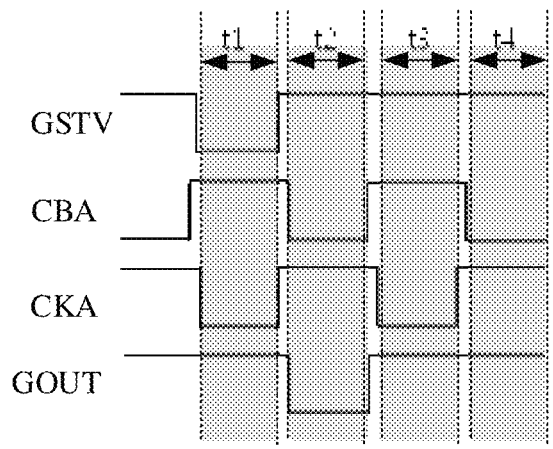
FIG. 11B is a signal timing diagram of the shift register unit illustrated in FIG. 11A in operation.

For example, FIG. 11A is a circuit diagram of an example of a shift register unit in another display substrate provided by at least one embodiment of the present disclosure, and FIG. 11B is a signal timing diagram of the shift register unit illustrated in FIG. 11A during operation. In the following, the circuit structure and working process of the shift register unit 104 (for example, the scan driving shift register unit) will be briefly introduced with reference to FIG. 11A and FIG. 11B. It should be noted that the circuit structure illustrated in FIG. 11A is only one example of the implementation of the shift register unit 104, and the shift register unit 104 may also adopt other suitable circuit structures, which are not limited by the embodiments of the present disclosure.

As illustrated in FIG. 11A, the shift register unit 104 includes eight transistors (an input transistor Q1, a first control transistor Q2, a second control transistor Q3, an output control transistor Q4, an output transistor Q5, a first noise reduction transistor Q6, a second noise reduction transistor Q7, and a voltage stabilization transistor Q8) and two capacitors (a first capacitor CA1 and a second capacitor CA2). For example, when the plurality of shift register units 104 are cascaded, the first electrode of the input transistor Q1 of the first-stage shift register unit 104 is connected to the input terminal IN, which is configured to be connected to the trigger signal line GSTV to receive the trigger signal as an input signal, while the first electrode of the input transistor Q1 in other-stage shift register units 104 is electrically connected to the output terminal of the previous-stage shift register unit 104, so that the output signal output by the output terminal GOUT of the shift register unit 104 at the previous stage is received as the input signal, thereby realizing shift output for scanning the array of pixel units 103 in the display region 102, for example, row by row.

As illustrated in FIG. 11A, the shift register unit 104 further includes a first clock signal terminal CKA and a second clock signal terminal CBA, with GCK representing a first sub-clock signal line and GCB representing a second sub-clock signal line. For example, when the first clock signal terminal CKA is connected to the first sub-clock signal line GCK to receive the first clock signal, the first sub-clock signal line GCK is the first clock signal line; when the first clock signal terminal CKA is connected to the second sub-clock signal line GCB to receive the first clock signal, the second sub-clock signal line GCB is the first clock signal line, which is determined according to the actual case and is not limited by the embodiments of the present disclosure. The second clock signal terminal CBA is connected to the second sub-clock signal line GCB or the first sub-clock signal line GCK to receive the second clock signal. In the following, the first clock signal terminal CKA is connected to the first sub-clock signal line GCK to receive the first clock signal, and the second clock signal terminal CBA is connected to the second sub-clock signal line GCB to receive the second clock signal, that is, the first sub-clock signal line GCK is used as the first clock signal line and the second sub-clock signal line GCB is used as the second clock signal line. The embodiments of the present disclosure are not limited in this aspect. For example, the first clock signal GCK and the second clock signal GCB may be pulse signals with a duty ratio greater than 50%, and the difference between them is, for example, half a cycle. VGHA represents the third power line and the third voltage provided by the third power line, for example, the third voltage is a direct current (DC) high level, and VGLA represents the fourth power line and the fourth voltage provided by the fourth power line, for example, the fourth voltage is a DC low level, and the third voltage is greater than the fourth voltage. NA1, NA2 and NA3 represent the first node, the second node and the third node in the circuit diagram, respectively.

As illustrated in FIG. 11A, a gate electrode of the input transistor Q1 is connected to the first clock signal terminal CKA (the first clock signal terminal CKA is connected to the first sub-clock signal line GCK) to receive the first clock signal, a second electrode of the input transistor Q1 is connected to the input terminal IN, and a first electrode of the input transistor Q1 is connected to the first node NA1. For example, when the shift register unit 104 is a first-stage shift register unit, the input terminal IN is connected to the trigger signal line GSTV to receive the trigger signal, and when the shift register unit 104 is other-stage shift register units except for the first-stage shift register unit, the input terminal IN is connected to the output terminal GOUT of the shift register unit at the previous stage.

A gate electrode of the first control transistor Q2 is connected to the first node NA1, a second electrode of the first control transistor Q2 is connected to the first clock signal terminal CKA to receive the first clock signal, and a first electrode of the first control transistor Q2 is connected to the second node NA2.

A gate electrode of the second control transistor Q3 is connected to the first clock signal terminal CKA to receive the first clock signal, a second electrode of the second control transistor Q3 is connected to the fourth power line VGLA to receive the fourth voltage, and a first electrode of the second control transistor Q3 is connected to the second node NA2.

A gate electrode of the output control transistor Q4 is connected to the second node NA2, a first electrode of the output control transistor Q4 is connected to the third power line VGHA to receive the third voltage, and a second electrode of the output control transistor Q4 is connected to the output terminal GOUT.

A first electrode of the first capacitor CA1 is connected to the second node NA2, and a second electrode of the first capacitor CA1 is connected to the third power line VGHA.

A gate electrode of the output transistor Q5 is connected to the third node NA3, a first electrode of the output transistor Q5 is connected to the second clock signal terminal CBA, and a second electrode of the output transistor Q5 is connected to the output terminal GOUT.

A first electrode of the second capacitor CA2 is connected to the third node NA3, and a second electrode of the second capacitor CA2 is connected to the output terminal GOUT.

A gate electrode of the first noise reduction transistor Q6 is connected to the second node NA2, a first electrode of the first noise reduction transistor Q6 is connected to the third power line VGHA to receive the third voltage, and a second electrode of the first noise reduction transistor Q6 is connected to the second electrode of the second noise reduction transistor Q7.

A gate electrode of the second noise reduction transistor Q7 is connected to the second clock signal terminal CBA (the second clock signal terminal CBA is connected to the second sub-clock signal line GCB) to receive the second clock signal, and a first electrode of the second noise reduction transistor Q7 is connected to the first node NA1.

A gate electrode of the voltage stabilizing transistor Q8 is connected to the fourth power line VGLA to receive the fourth voltage, a second electrode of the voltage stabilizing transistor Q8 is connected to the first node NA1, and a first electrode of the voltage stabilizing transistor Q8 is connected to the third node NA3.

The transistors in the shift register unit 104 illustrated in FIG. 11A are all exemplified by P-type transistors, that is, each transistor is turned on when the gate electrode is connected to the low level (a turn-on level) and turned off when the gate electrode is connected to the high level (a turn-off level). At this time, the first electrode of the transistor may be a source electrode, and the second electrode of the transistor may be a drain electrode.

The shift register unit 104 includes, but is not limited to, the configuration illustrated in FIG. 11A. For example, each transistor in the shift register unit 104 may also adopt an N-type transistor or a mixture of P-type transistors and N-type transistors, and it is only necessary to connect the electrode polarity of the selected type of transistor according to the electrode polarity of the corresponding transistor in the embodiments of the present disclosure.

It should be noted that the transistors used in the shift register unit may all be thin film transistors or field effect transistors or other switching devices with the same characteristics. Here, thin film transistors are taken as examples. For example, the active layer (a channel region) of the transistor is made of a semiconductor material, such as polysilicon (for example, low-temperature polysilicon or high-temperature polysilicon), amorphous silicon, indium gallium tin oxide (IGZO), etc., while the gate electrode, source electrode and drain electrode are made of a metal material, such as aluminum or aluminum alloy. The source electrode and drain electrode of the transistor used here can be symmetrical in structure, so its source electrode and drain electrode can be indistinguishable in structure. In the embodiments of the present disclosure, in order to distinguish the two electrodes of the transistor except for the gate electrode, one of them is directly described as the first electrode and the other is the second electrode. In addition, in the embodiments of the present disclosure, the electrode of the capacitor may be a metal electrode or one of the electrodes may be of a semiconductor material (for example, doped polysilicon).

In the following, for example, the operation principle of the first-stage shift register unit 104 is taken as an example, and the operation principles of the rest shift register units 104 are similar to it, which will not be repeated here. As illustrated in FIG. 11B, the operation process of the shift register unit 104 includes four phases, namely, a first phase t1, a second phase t2, a third phase t3 and a fourth phase t4. FIG. 11B shows the timing waveforms of the signals in each phase.

In the first phase t1, as illustrated in FIG. 11B, the first clock signal terminal CKA receives the low-level first clock signal, and the trigger signal line GSTV provides the low-level trigger signal, so that the input transistor Q1 and the second control transistor Q3 are turned on, and the turned-on input transistor Q1 transmits the low-level trigger signal to the first node NA1, so that the level of the first node NA1 becomes a low level. Therefore, the first control transistor Q2 and the output transistor Q5 are turned on, and because the voltage stabilizing transistor Q8 is always turned on in response to the fourth voltage (a low level) provided by the fourth power line VGLA, the level of the third node NA3 is the same as that of the first node NA1, that is, the low level, and at the same time, the low level is stored in the second capacitor CA2. In addition, the turned-on second control transistor Q3 transmits the low-level fourth voltage VGL to the second node NA2, and the turned-on first control transistor Q2 transmits the low level of the first clock signal to the second node NA2, so that the level of the second node NA2 becomes a low level and is stored in the first capacitor CA1. Therefore, the output control transistor Q4 is turned on in response to the low level of the second node NA2, the high-level third voltage provided by the third power line VGHA is output to the output terminal GOUT, and at the same time, the output transistor Q5 transmits the high-level second clock signal received by the second clock signal terminal CBA to the output terminal GOUT in response to the low-level conduction of the third node NA3, so that the shift register unit 104 outputs a high level in this phase. For example, the output terminal GOUT is connected to the output signal transmitting line GL, and the high level output by the output terminal GOUT can be used to control the operation of the pixel unit 103 illustrated in FIG. 1A.

In the second phase t2, as illustrated in FIG. 11B, the second clock signal terminal CBA receives the second clock signal of a low level, therefore the second noise reduction transistor Q7 is turned on, and the first clock signal terminal CKA receives the first clock signal of a high level, so that the input transistor Q1 and the second control transistor Q3 are turned off. Due to the storage function of the second capacitor CA2, the first node NA1 can keep the low level of the previous phase, so the first control transistor Q2 and the output transistor Q5 are turned on. Because the first control transistor Q2 is turned on, the high-level first clock signal received by the first clock signal terminal CKA is transmitted to the second node NA2, so that the second node NA2 becomes a high level. Therefore, the first noise reduction transistor Q6 and the output control transistor Q4 are turned off, thereby preventing the high level provided by the third power line VGHA from being output to the output terminal GOUT and the first node NA1. Meanwhile, because the output transistor Q5 is turned on, in this phase, the output terminal GOUT outputs the low level received by the second clock signal terminal GB. For example, the output terminal GOUT is connected to the output signal transmitting line GL, and the low level output by the output terminal GOUT can be used to control the operation of the pixel unit 103 illustrated in FIG. 1A.

In the third phase t3, as illustrated in FIG. 11B, the first clock signal terminal CKA receives the low-level first clock signal, so the input transistor Q1 and the second control transistor Q3 are turned on. At this time, the high level provided by the trigger signal line GSTV is transmitted to the first node NA1 and the third node NA3, so the output transistor Q5 and the first control transistor Q2 are turned off. The second clock signal terminal CBA receives the second clock signal with a high level, so the second noise reduction transistor Q7 is turned off. Because the second control transistor Q3 is turned on, the low level provided by the fourth power line VGLA is transmitted to the second node NA2 and stored in the first capacitor CA1. Therefore, the output control transistor Q4 and the first noise reduction transistor Q6 are turned on, so in this phase, the output terminal GOUT outputs the high level provided by the third power line VGHA.

In the fourth phase t4, as illustrated in FIG. 11B, the first clock signal terminal CKA receives the high-level first clock signal, so the input transistor Q1 and the second control transistor Q3 are turned off. The second clock signal terminal CBA receives the second clock signal of a low level, so the second noise reduction transistor Q7 is turned on. Due to the storage function of the second capacitor CA2, the level of the first node NA1 is kept at the high level of the previous phase, so that the first control transistor Q2 and the output transistor Q5 are turned off. Due to the storage function of the first capacitor CAL the second node NA2 continues to maintain the low level of the previous phase, thus making the first noise reduction transistor Q6 turned on, and thus making the high level provided by the third power line VGHA be transmitted to the first node NA1 and the third node NA3 through the turned-on first noise reduction transistor Q6 and the second noise reduction transistor Q7, so as to allow the first node NA1 and the third node NA3 to continue to maintain the high level, which can effectively prevent the output transistor Q5 from being turned on and thus avoid error output.

Figure 12:
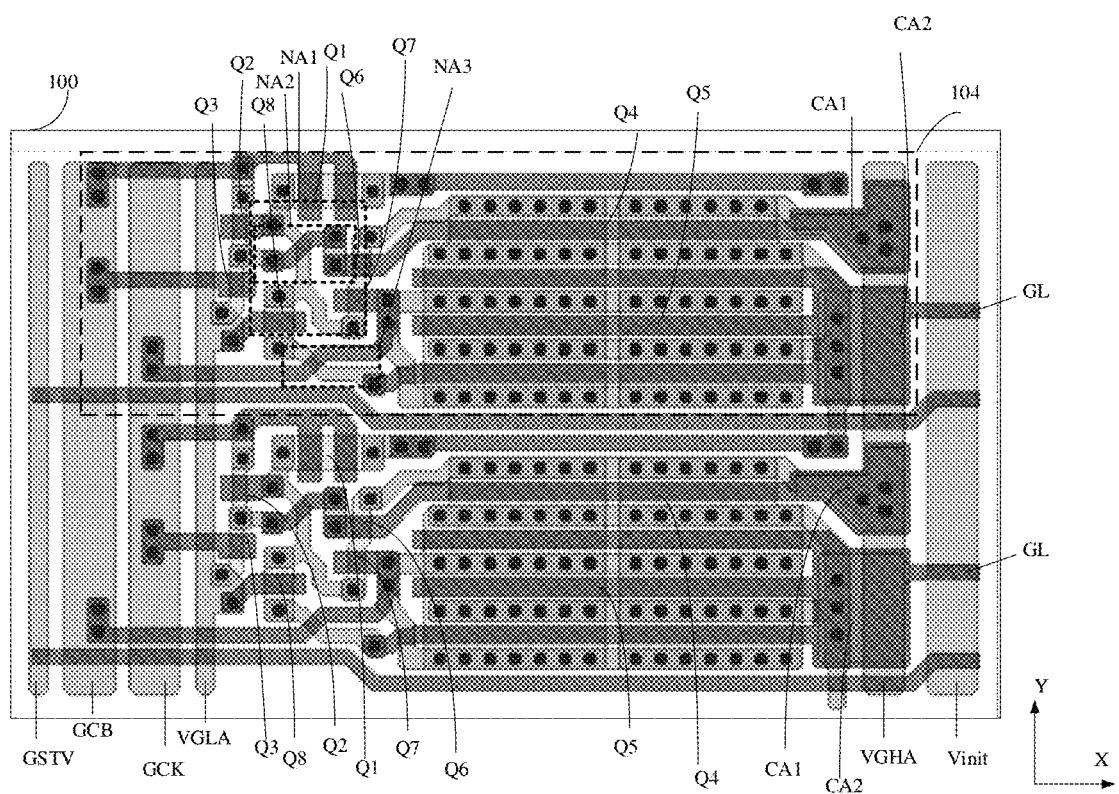
FIG. 12 is a schematic layout diagram of further still another display substrate provided by at least one embodiment of the present disclosure.

In order to more clearly explain the technical scheme of the embodiments of the present disclosure, the embodiments of the present disclosure take the circuit structure and layout structure of the shift register unit 104 illustrated in FIG. 11A and FIG. 12 as an example to further explain the display substrate provided by the embodiments of the present disclosure. However, it should be noted that the circuit structure and layout structure of the shift register unit 104 include, but are not limited to, this case. In other words, the shift register unit 104 may also adopt other suitable circuit structures or layout structures, and the implementation of the present disclosure is not limited to this case.

Figure 13A:
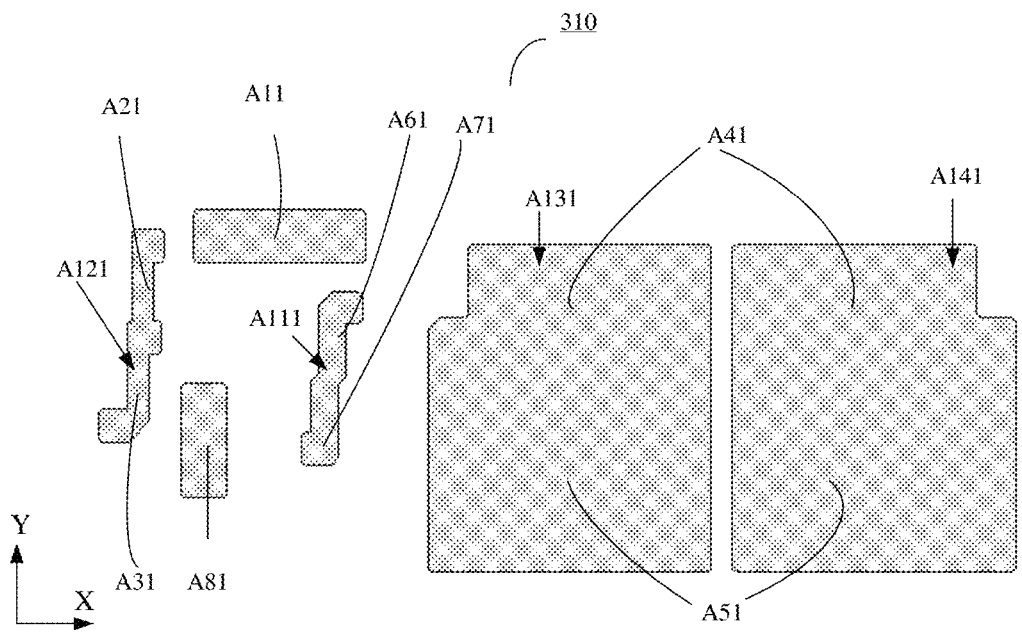
FIG. 13A is a planar view of a semiconductor layer of the display substrate illustrated in FIG. 12.
Figure 13B:
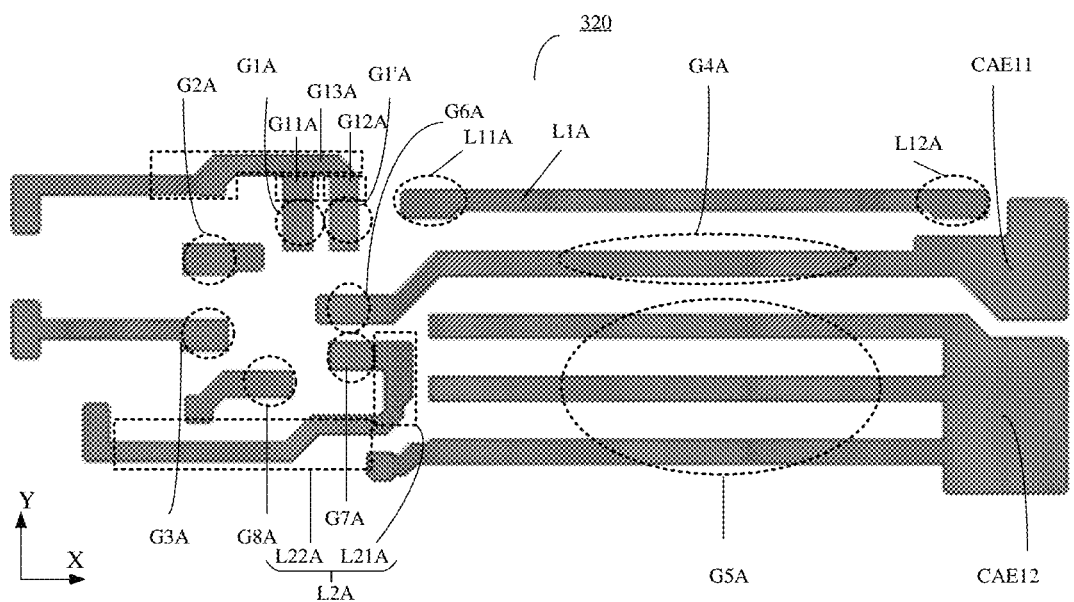
FIG. 13B is a planar view of a first conductive layer of the display substrate illustrated in FIG. 12.
Figure 13C:
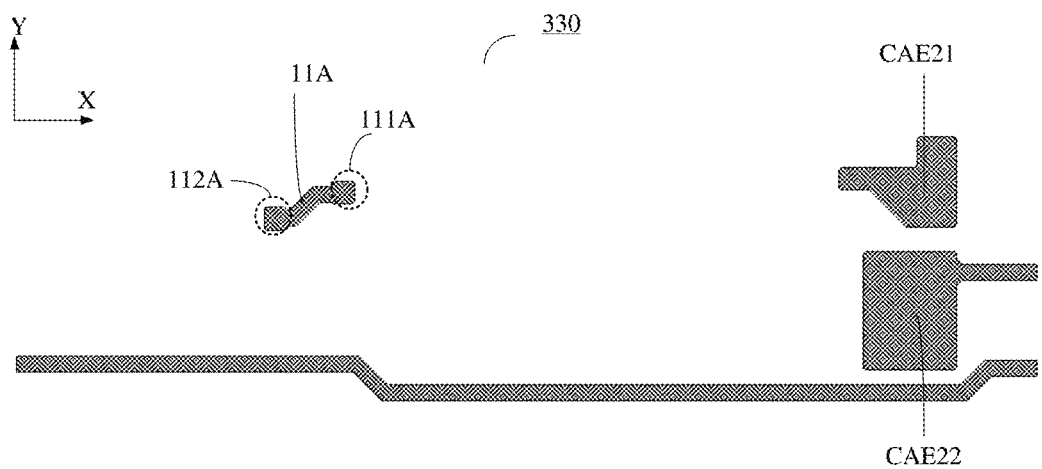
FIG. 13C is a planar view of a second conductive layer of the display substrate illustrated in FIG. 12.
Figure 13D:
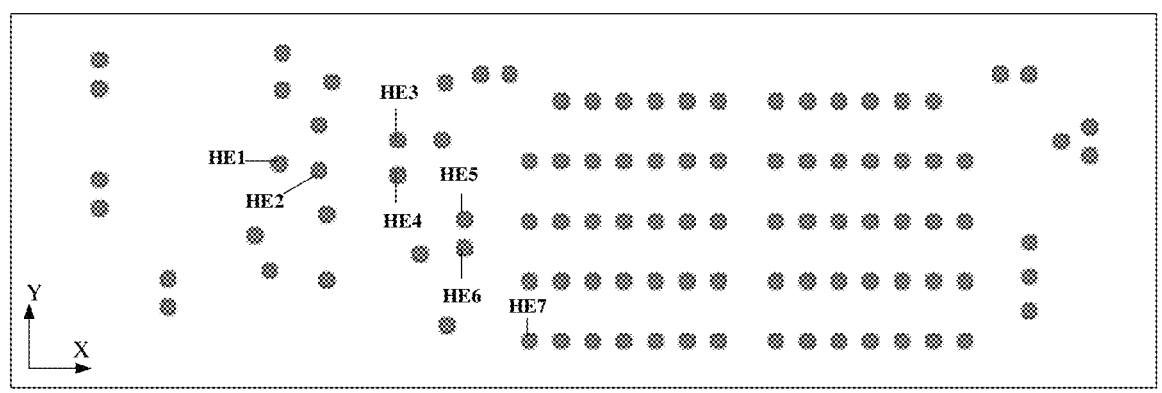
FIG. 13D is a diagram of via hole distribution of the display substrate illustrated in FIG. 12.
Figure 13E:
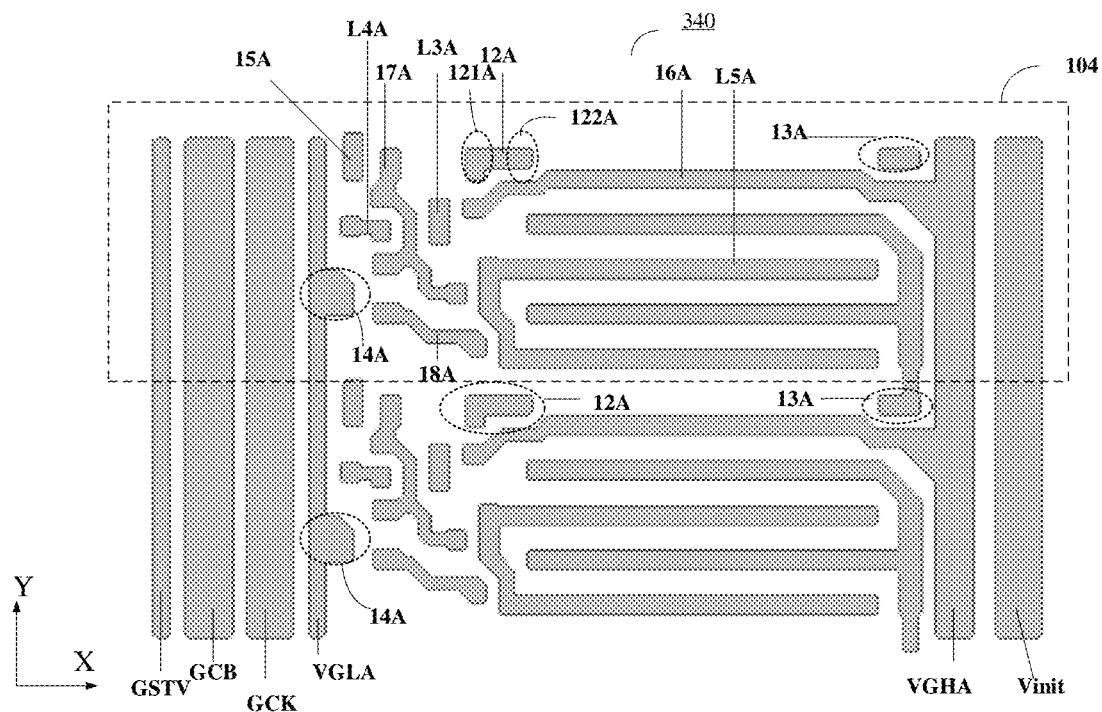
FIG. 13E is a planar view of a third conductive layer of the display substrate illustrated in FIG. 12.

FIG. 12 is a layout diagram of another display substrate provided by at least one embodiment of the present disclosure, for example, an example of a shift register unit 104 is illustrated in FIG. 12. FIG. 13A, FIG. 13B, FIG. 13C and FIG. 13E respectively show planar views of each layer of wiring of the display substrate illustrated in FIG. 12. FIG. 13A is a planar view of the semiconductor layer of the display substrate illustrated in FIG. 12, FIG. 13B is a planar view of the first conductive layer of the display substrate illustrated in FIG. 12, FIG. 13C is a planar view of the second conductive layer of the display substrate illustrated in FIG. 12, FIG. 13D is a via hole distribution diagram of the display substrate illustrated in FIG. 12, and FIG. 13E is a planar view of the third conductive layer of the display substrate illustrated in FIG. 12. Next, the layered structure of the shift register unit 104 in the display substrate provided in the above embodiments will be described in detail with reference to FIG. 12 to FIG. 13E.

It should be noted that in the example illustrated in FIG. 12, the output signal transmitting line GL of the shift register unit 104 is located in the second conductive layer 330; and in other examples of the present disclosure, the output signal transmitting line GL of the shift register unit 104 may also be located in other suitable conductive layers in the display substrate 10, and the embodiments of the present disclosure are not limited to this case.

For example, as illustrated in FIG. 12, the display substrate 10 further includes a shift register unit 104, a third power line VGHA, a fourth power line VGLA, and a plurality of clock signal lines (for example, the first sub-clock signal line GCK, the second sub-clock signal line GCB, and the trigger signal line GSTV illustrated in the figure) disposed on the base substrate 100. For example, the above signal line SL104 may include the third power line VGHA. For example, the third power line VGHA, the fourth power line VGLA, and a plurality of clock signal lines extend in the first direction Y (e.g., the vertical direction illustrated in FIG. 12) on the base substrate 100, and are configured to provide the shift register unit 104 with a third voltage, a fourth voltage, and a plurality of clock signals (e.g., the above-mentioned trigger signal, the first clock signal, or the second clock signal, etc.) respectively.

It should be noted that the third power line VGHA, the fourth power line VGLA, and a plurality of clock signal lines can be arranged in parallel along the first direction Y, or they can cross a certain angle (for example, less than or equal to 20 degrees), which is not limited by the embodiments of the present disclosure.

For example, the third power line VGHA is configured to provide the third voltage to the plurality of cascaded shift register units 104 included in the second gate driving circuit, and the fourth power line VGLA is configured to provide the fourth voltage to the plurality of cascaded shift register units 104 included in the second gate driving circuit. For example, the third voltage is greater than the fourth voltage, for example, the third voltage is a DC high level and the fourth voltage is a DC low level.

For example, the third power line VGHA, the fourth power line VGLA, a plurality of clock signal lines and the shift register unit 104 are located in the peripheral region 106 and on a side of the base substrate 100 (between the pixel array region 102 (i.e., the display region 102) and the side of the base substrate 100 as illustrated in FIG. 1A), for example, on the left and right sides of the base substrate 100 as illustrated in FIG. 1A, and may also be located on the right side or left side of the base substrate 100. The embodiments of the present disclosure are not limited in this aspect.

For example, the fourth power line VGLA and the plurality of clock signal lines are located on a side of the shift register unit 104 away from the pixel array region 102, for example, both are located on the left side of the shift register unit 104 illustrated in FIG. 12, that is, the orthographic projection of the shift register unit 104 on the base substrate 100 is located between the orthographic projection of the fourth power line VGLA and the plurality of clock signal lines on the base substrate 100 and the pixel array region 102. For example, the third power line VGHA is located on a side of the shift register unit 104 close to the pixel array region 102, that is, the orthographic projection of the third power line VGHA on the base substrate 100 is located between the orthographic projection of the shift register unit 104 on the base substrate 100 and the pixel array region 102.

It should be noted that the above-mentioned wiring positions are only exemplary, as long as the wiring settings can be met to facilitate the connection with the shift register unit, the embodiments of the present disclosure are not limited to this case.

For example, the plurality of cascaded shift register units 104 constitute a gate driving circuit, such as the second gate driving circuit. For example, the output terminals GOUT of the plurality of shift register units 104 are respectively connected to the gate scanning signal terminals of the pixel circuits in each row located in the pixel array region 102, and provide output signals (e.g., gate scanning signals) to the pixel circuits in each row through the output signal transmitting lines GL, so as to drive the light-emitting elements to emit light. For example, the pixel circuit may be a pixel circuit in the art, including circuit structures such as 7T1C, 2T1C, 4T2C, 8T2C, etc., which will not be described here.

Only the first-stage shift register unit 104 and the second-stage shift register unit 104 in the gate driving circuit are illustrated in FIG. 12. For example, as illustrated in FIG. 12, the first clock signal terminal CKA (illustrated in FIG. 11A) of the first-stage shift register unit 104 is connected to the second sub-clock signal line GCB to receive the first clock signal, the second clock signal terminal CBA of the first-stage shift register unit 104 is connected to the first sub-clock signal line GCK to receive the second clock signal, the first clock signal terminal CKA of the second-stage shift register unit 104 is connected to the first sub-clock signal line GCK to receive the first clock signal, the second clock signal terminal CBA of the second-stage shift register unit is connected to the second sub-clock signal line GCB to receive the second clock signal, and so on. The first clock signal terminal CKA of an X-th-stage (X is an odd number greater than 1) shift register unit 104 is connected to the second sub-clock signal line GCB to receive the first clock signal, the second clock signal terminal CBA of the X-th-stage shift register unit 104 is connected to the first sub-clock signal line GCK to receive the second clock signal, the first clock signal terminal CKA of an (X+1)-th-stage shift register unit 104 is connected to the first sub-clock signal line GCK to receive the first clock signal, and the second clock signal terminal CBA of the (X+1)-th-stage shift register unit 104 is connected to the second sub-clock signal line GCB to receive the second clock signal. It should be noted that the connection mode between the shift register units 104 at each stage and the clock signal line can also adopt other connection modes in the art, and the embodiments of the present disclosure are not limited to this case. For example, the input terminal of the first-stage shift register unit 104 is connected to the trigger signal line GSTV to receive the trigger signal as an input signal, and the input terminal of the second-stage shift register unit 104 is connected to the output terminal GOUT of the previous-stage shift register unit (i.e., the first-stage shift register unit), and the rest shift register units 104 are connected in a similar way. The following description takes the structure of the first-stage shift register unit 104 as an example, and the embodiments of the present disclosure are not limited to this case.

For example, in the example illustrated in FIG. 12, because the first clock signal terminal CKA of the first-stage shift register unit 104 (as illustrated in FIG. 11A) is connected to the second sub-clock signal line GCB to receive the first clock signal, and the second clock signal terminal CBA of the first-stage shift register unit 104 is connected to the first sub-clock signal line GCK to receive the second clock signal, it is described by taking the case that the second sub-clock signal line GCB is the first clock signal line and the first sub-clock signal line GCK is the second clock signal line as an example in this example, and the embodiment of the present disclosure is not limited to this case.

For example, as illustrated in FIG. 11A, in some examples, the shift register unit 104 includes an input circuit 1041, an output circuit 1043, a first control circuit 1042 and an output control circuit 1044; in other examples, the shift register unit 104 further includes a second control circuit 1045 and a voltage stabilizing circuit 1046.

The input circuit 1041 is configured to input an input signal to the first node NA1 in response to the first clock signal. For example, the input circuit 1041 is connected to the input terminal IN, the first node NA1 and the first clock signal terminal CKA, and is configured to be turned on under the control of the first clock signal received by the first clock signal terminal CKA, so that the input terminal IN is connected to the first node NA1 to input the input signal to the first node NA1. For example, the input circuit 1041 is implemented as the above-mentioned input transistor Q1, and the connection mode of the input transistor Q1 can refer to the above-mentioned description, which is not repeated here.

The output circuit 1043 is configured to output an output signal to the output terminal GOUT. For example, the output circuit 1043 is connected to the third node NA3, the output terminal GOUT and the second clock signal terminal CBA, and is configured to be turned on under the control of the level of the third node NA3, so that the second clock signal terminal CBA is connected to the output terminal GOUT, thereby outputting the second clock signal at the output terminal GOUT, for example, the low level of the second clock signal. For example, the output circuit 1043 is implemented as the above-mentioned output transistor Q5 and the second capacitor CA2, and the connection mode of the output transistor Q5 and the second capacitor CA2 can refer to the above-mentioned description, which is not repeated here.

The first control circuit 1042 is configured to control the level of the second node NA2 in response to the level of the first node NA1 and the first clock signal. For example, the first control circuit 1042 is connected to the first node NA1, the second node NA2 and the first clock signal terminal CKA, and is configured to be turned on under the control of the level of the first node NA1, so that the second node NA2 is connected to the first clock signal terminal CKA, thereby providing the first clock signal provided by the first clock signal terminal CKA to the second node NA2. For example, the first control circuit 1042 is implemented as the first control transistor Q2 and the second control transistor Q3 described above, and the connection mode of the first control transistor Q2 and the second control transistor Q3 can be referred to the above description, which is not repeated here. It should be noted that the first control circuit 1042 is not limited to being connected to the first node NA1, and may also be connected to other independent voltage terminals (providing the same voltage as that of the first node NA1) or a separate circuit which is the same as the input circuit 1041. The embodiment of the present disclosure is not limited to this case. The connections of other circuits in the shift register unit 104 are similar and will not be repeated here.

The output control circuit 1044 is configured to control the level of the output terminal GOUT under the control of the level of the second node NA2. For example, the output control circuit 1044 is connected to the second node NA2, the third power line VGHA and the output terminal GOUT, and is configured to connect the output terminal GOUT with the third power line VGHA under the control of the level of the second node NA2, so as to output the third voltage provided by the third power line VGHA to the output terminal GOUT, so as to control the output terminal GOUT at a high level, thereby avoiding the error output of the shift register unit 104 in the non-output phase. For example, the output control circuit 1044 is implemented as the above-mentioned output control transistor Q4 and the first capacitor CA1, and the connection mode of the output control transistor Q4 and the first capacitor CA1 can refer to the above-mentioned description, which is not repeated here.

The second control circuit 1045 is connected to the first node NA1 and the second node NA2, and is configured to control the level of the first node NA1 under the control of the level of the second node NA2 and the second clock signal. The second control circuit 1045 is connected to the first node NA1, the second node NA2, the third power line VGHA and the second clock signal terminal CBA, and is configured to be turned on under the control of the level of the second node NA2 and the second clock signal received by the second clock signal terminal CBA, so that the third power line VGHA is connected to the first node NA1, thereby charging the potential of the first node NA1 to a high level, so as to prevent the output circuit 1042 from being turned on in the non-output phase, thereby avoiding error output. For example, the second control circuit 1045 is implemented as the first noise reduction transistor Q6 and the second noise reduction transistor Q7 described above, and the connection mode of the first noise reduction transistor Q6 and the second noise reduction transistor Q7 can be referred to the above description, which is not repeated here.

The voltage stabilizing circuit 1046 is connected to the first node NA1 and the third node NA3, and is configured to stabilize the level of the third node NA3. For example, the voltage stabilizing circuit 1046 is connected to the first node NA1, the third node NA3 and the fourth power line VGLA, and is configured to be turned on under the control of the fourth voltage provided by the fourth power line VGLA, so that the first node NA1 and the third node NA3 are connected. For example, the voltage stabilizing circuit 1046 is implemented as a voltage stabilizing transistor Q8. The details can refer to the above description of the voltage stabilizing transistor Q8, which will not be repeated here.

For example, under the control of the fourth voltage supplied by the fourth power line VGLA, the voltage stabilizing transistor Q8 is always in a turn-on state to allow the third node NA3 to be connected to the first node NA1 through the voltage stabilizing transistor Q8, thus preventing the level of the third node NA3 from leaking through the input transistor Q1, the first control transistor Q2 and the second noise reduction transistor Q7 connected to the first node NA1, and further reducing the stress of the level of the third node NA3 on the first control transistor Q1, thus helping to maintain the level of the third node NA3 and allowing the output transistor Q5 to be completely turned on in the output phase.

For example, an interlayer insulating layer (e.g., including a first insulating layer, a second insulating layer, a third insulating layer, etc.) may be located between the layer structures illustrated in FIG. 13A to FIG. 13E. For example, the first insulating layer is located between the semiconductor layer 310 illustrated in FIG. 13A and the first conductive layer 320 illustrated in FIG. 13B, the second insulating layer is located between the first conductive layer 320 illustrated in FIG. 13B and the second conductive layer 330 illustrated in FIG. 13C, and the third insulating layer is located between the second conductive layer 330 illustrated in FIG. 13C and the third conductive layer 340 illustrated in FIG. 13E.

For example, the display substrate further includes a fourth insulating layer on the third conductive layer 340 for protecting the third conductive layer 340.

For example, the materials of the first insulating layer, the second insulating layer, the third insulating layer, and the fourth insulating layer may include inorganic insulating materials, such as $SiN_x$, $SiO_x$, and $SiN_xO_y$, organic insulating materials, such as organic resins, or other suitable materials, and the embodiments of the present disclosure are not limited to this case.

For example, the descriptions of the first insulating layer, the second insulating layer, the third insulating layer, the fourth insulating layer (and the semiconductor layer 310, the first conductive layer 320, the second conductive layer 330, and the third conductive layer 340) or the like can refer to the specific contents in the examples of the shift register unit 105 above, which will not be repeated here.

It should be noted that in the display substrate illustrated in FIG. 12, the layout design of the first two stages of shift register units 104 of the second gate driving circuit and the third power line, the fourth power line and the signal line connected to them is taken as an example for description, and the layout implementation of the rest stages of shift register units 104 can refer to the layout illustrated in FIG. 12, which will not be repeated here. Of course, other layout methods can also be adopted, and the embodiments of the present disclosure are not limited to this case.

For example, the active layers A81 of the input transistor Q1 to the voltage stabilizing transistor Q8 of the shift register unit 104 illustrated in FIG. 12 may be formed in the semiconductor layer 310 illustrated in FIG. 13A. The semiconductor layer 310 may be patterned using a semiconductor material. For example, as illustrated in FIG. 13A, the semiconductor layer 310 may have a short bar shape or a curved or bent shape as required, and may be used to fabricate the active layers A81 of the input transistor Q1 to the voltage stabilizing transistor Q8 mentioned above. Each active layer may include a source region, a drain region, and a channel region between the source region and the drain region. For example, the channel region has semiconductor characteristics; the source region and the drain region are on both sides of the channel region, and may be doped with impurities, and thus have conductivity. For example, the source region is part of the active layer, the metal electrode in contact with the source region (for example, in the third conductive layer 340) corresponds to the source electrode (or called the first electrode) of the transistor, the drain region is part of the active layer, and the metal electrode in contact with the drain region (for example, in the third conductive layer 340) corresponds to the drain electrode (or called the second electrode) of the transistor. For example, the source region is connected to its corresponding metal electrode (first electrode) through via holes penetrating the first, second and third insulating layers, and the drain region is connected to its corresponding metal electrode (second electrode) through via holes penetrating the first, second and third insulating layers.

For example, taking the first control transistor Q2 as an example, the active layer A21 of the first control transistor Q2 includes a source region, a drain region and a channel region, and the first control transistor Q2 also includes a gate electrode G2A, wherein the gate electrode G2A is located in the first conductive layer 320. Other transistors are similar to this, and the details will not be repeated here.

For example, the material of the semiconductor layer 310 may include the oxide semiconductor, organic semiconductor, amorphous silicon, polycrystalline silicon, etc. For example, the oxide semiconductor includes a metal oxide semiconductor (such as indium gallium zinc oxide (IGZO)), and the polycrystalline silicon includes low-temperature polycrystalline silicon or high-temperature polycrystalline silicon, etc. The embodiments of the present disclosure are not limited to this case. It should be noted that the above-mentioned source region and drain region may be regions doped with N-type impurities or P-type impurities, and the embodiments of the present disclosure are not limited to this case.

It should be noted that, in other examples, the first electrode and the second electrode of each transistor may also be located in other conductive layers and connected to corresponding active layers through via holes in the insulating layer between them and the semiconductor layer. The embodiment of the present disclosure is not limited to this case.

FIG. 13B shows the first conductive layer 320 of the display substrate. The first conductive layer 320 is disposed on the first insulating layer so as to be insulated from the semiconductor layer 310. For example, the first conductive layer 320 may include the first electrodes CAE11 and CAE12 of the first capacitor CA1 and the second capacitor CA2, the gate electrodes of the input transistor Q1 to the voltage stabilizing transistor Q8, various wiring lines (e.g., the first connection wiring line L1A and the third connection wiring line L2A) directly connected to the gate electrodes, connection electrodes, etc. Correspondingly, the first insulating layer also serves as a gate insulating layer. As illustrated in FIG. 13B, the gate electrodes of the input transistor Q1 to the voltage stabilizing transistor Q8 are represented by circular or elliptical dotted lines, that is, the portion of the semiconductor layer structure of each transistor overlapping with the wiring in the first conductive layer 320.

FIG. 13C shows the second conductive layer 330 of the display substrate, and the second conductive layer 330 includes the second electrodes CAE21 and CAE22 of the first capacitor CA1 and the second capacitor CA2. The second electrode CAE21 at least partially overlaps with the first electrode CAE11 to form the first capacitor CA1, and the second electrode CAE22 at least partially overlaps with the first electrode CAE12 to form the second capacitor CA2. For example, the second conductive layer 330 illustrated in FIG. 13C further includes an intermediate transfer electrode 11A.

FIG. 13E shows the third conductive layer 340 of the first-stage shift register unit 104 and the second-stage shift register unit 104. The third conductive layer 340 includes a plurality of signal lines (for example, the trigger signal line GSTV connected to the input terminal of the first-stage shift register unit 104, the first sub-clock signal line GCK, and the second sub-clock signal line GCB), the third power line VGHA, the fourth power line VGLA, the reference voltage line Vinit, etc. It should be noted that the third conductive layer 340 further includes a first transfer electrode 17A, a second transfer electrode 18A, a third transfer electrode 16A, a signal input electrode 13A, a second connection wiring (including the first connection sub-wiring L3A and the second connection sub-wiring L4A), a fourth connection wiring L5A, and the like, which connect with the transistors, capacitors, and signal lines.

As illustrated in FIG. 12 to FIG. 13E, the plurality of signal lines, the third power line VGHA and the fourth power line VGLA are connected to transistors and capacitors in other layers through at least one via hole illustrated in FIG. 13D, and the transistors and capacitors are also connected through at least one via hole or bridged by a transfer electrode, which will not be described here.

For example, the material of the third conductive layer 340 may include titanium, titanium alloy, aluminum, aluminum alloy, copper, copper alloy or any other suitable composite material, and the embodiment of the present disclosure is not limited to this case. For example, the materials of the first conductive layer 320 and the second conductive layer 330 may be the same as that of the third conductive layer 340, which will not be described here.

FIG. 12 is a schematic diagram of the stacking position relationship of the semiconductor layer 310 illustrated in FIG. 13A, the first conductive layer 320 illustrated in FIG.

13B, the second conductive layer 330 illustrated in FIG. 13C, and the third conductive layer 340 illustrated in FIG. 13E.

As illustrated in FIG. 12 and FIG. 13A, in at least one example, the active layer A11 of the input transistor Q1 has a strip shape extending along the second direction X, which is different from the first direction Y. For example, the angle between the first direction Y and the second direction X ranges from 70° to 90°, and includes 70° and 90°. For example, the angle between the first direction Y and the second direction X is 70°, 90°, 80°, or the like, which can be set according to the actual situation, and the embodiment of the present disclosure is not limited to this case. For example, in some examples, the channel region of the active layer A11 of the input transistor Q1 has an "I" shape on the base substrate 100, and the channel length direction of the channel region is the second direction X perpendicular to the first direction Y (for example, the lateral direction in the figure). Of course, the embodiment of the present disclosure is not limited to this case, as long as the length of the display substrate 10 in the first direction Y can be reduced. For example, the channel length direction is the direction in which carriers flow from the first electrode to the second electrode of the input transistor Q1. Two parallel (and, for example, electrically connected to each other) gate electrodes are respectively overlapped with the strip-shaped active layer (I-shaped active layer) of the input transistor Q1, thereby obtaining an I-shaped double-gate transistor. Of course, it is also possible that a single gate electrode overlaps with the strip-shaped active layer of the input transistor Q1, and the embodiment of the present disclosure is not limited to this case.

For example, as illustrated in FIG. 13A, the active layer A61 of the first noise reduction transistor Q6 and the active layer A71 of the second noise reduction transistor Q7 are formed (i.e., integrated) by a continuous noise reduction semiconductor layer A111, which extends along the first direction Y and is arranged side by side with the active layer A11 of the input transistor Q1 in the first direction Y, that is, the input transistor Q1, the first noise reduction transistor Q6 and the second noise reduction transistor Q7 are arranged side by side up and down in the first direction Y. For example, the active layer A11 of the input transistor Q1 is located on an imaginary line where the active layer A61 of the first noise reduction transistor Q6 and the active layer A71 of the second noise reduction transistor Q7 extend along the first direction Y.

For example, as illustrated in FIG. 12 and FIG. 13A, the active layer A61 of the first noise reduction transistor Q6 may partially overlap (as illustrated in FIGS. 12 and 13A) or completely overlap with the active layer A71 of the second noise reduction transistor Q7 in the first direction Y, that is, the active layer A61 of the first noise reduction transistor Q6 may be on an imaginary line where the active layer A71 of the second noise reduction transistor Q7 extends in the first direction Y; the active layer A61 of the first noise reduction transistor Q6 may not overlap with the active layer A71 of the second noise reduction transistor Q7 in the first direction Y. For example, as illustrated in FIG. 12 and FIG. 13A, the active layer A61 of the first noise reduction transistor Q6 may be offset from the active layer A71 of the second noise reduction transistor Q7 by a certain distance in the first direction Y, as long as the arrangement of other structures is not affected and the width of the shift register unit 104 is not excessively increased, further as long as the first noise reduction transistor Q6 and the second noise reduction transistor Q7 are located below the input transistor Q1 in the first direction Y, the embodiment of the present disclosure is not limited to this case.

For example, the gate electrode G6A of the first noise reduction transistor Q6 and the gate electrode G7A of the second noise reduction transistor Q7 extend along the second direction X and are arranged side by side in the first direction Y. For example, the gate electrode G6A of the first noise reduction transistor Q6 and the gate electrode G7A of the second noise reduction transistor Q7 may be parallel, for example, both extend along the second direction X. The extending direction of the gate electrode G6A of the first noise reduction transistor Q6 and the extending direction of the gate electrode G7A of the second noise reduction transistor Q7 may also be non-parallel, for example, intersecting at a certain angle, for example, the intersection angle is less than or equal to 20°, or the angle between them and the horizontal line is less than or equal to 20°. The embodiment of the present disclosure is not limited to this case, as long as the first noise reduction transistor Q6 and the second noise reduction transistor Q7 are integrally arranged and are arranged in the first direction Y up and down.

For example, the first electrode of the input transistor Q1, the gate electrode of the first control transistor Q2, the first electrode of the second noise reduction transistor Q7 and the second electrode of the voltage stabilizing transistor Q8 described below are all connected to the first node NA1. For example, the first electrode of the input transistor Q1, the gate electrode of the first control transistor Q2, and the first electrode of the second noise reduction transistor Q7 are connected through via holes. The second node NA2 is connected to the gate electrode of the first noise reduction transistor Q6, the gate electrode of the output control transistor Q4, the first electrode of the first control transistor Q2, the first electrode of the first capacitor CA1, and the first electrode of the second control transistor Q3. For example, as illustrated in FIG. 12, the gate electrode of the first noise reduction transistor Q6, the gate electrode of the output control transistor Q4, the first electrode of the first control transistor Q2, the first electrode of the first capacitor CA1, and the first electrode of the second control transistor Q3 are connected by via holes. The third node NA3 is connected to the first electrode of the voltage stabilizing transistor Q8, the gate electrode of the output transistor Q5 and the first electrode of the second capacitor CA2. For example, the first electrode of the voltage stabilizing transistor Q8, the gate electrode of the output transistor Q5 and the first electrode of the second capacitor CA2 are connected through via holes.

For example, as illustrated in FIG. 13E, the shift register unit 104 further includes a first transfer electrode 17A, a second transfer electrode 18A, and a third transfer electrode 16A.

For example, the first transfer electrode 17A is connected to the first electrode of the input transistor Q1, the gate electrode of the first control transistor Q2, the second electrode of the voltage stabilizing transistor Q8, and the first electrode of the second noise reduction transistor Q7. For example, the first transfer electrode 17 is connected to the gate electrode of the first control transistor Q2 through a via hole penetrating through the second insulating layer and the third insulating layer, and the first transfer electrode 17A is located in the same layer as the first electrode of the input transistor Q1, the second electrode of the voltage regulator transistor Q8, and the first electrode of the second noise reduction transistor Q7 (for example, all located in the third conductive layer 340), which are integrally provided.

For example, the first node NA1 includes a first transfer electrode 17A, that is, the first transfer electrode 17A serves as the first node NA1, and connects the corresponding electrodes of the input transistor Q1, the first control transistor Q2, the voltage stabilizing transistor Q8 and the second noise reduction transistor Q7.

For example, the first transfer electrode 17A extends along a broken line in the first direction Y and is located between the first control transistor Q2, the second control transistor Q3, the voltage stabilizing transistor Q8, the first noise reduction transistor Q6 and the second noise reduction transistor Q7. Its starting point is the first electrode of the input transistor Q1, and its ending point is the first electrode of the second noise reduction transistor Q7. Because the first noise reduction transistor Q6 and the second noise reduction transistor Q7 are arranged side by side with the input transistor Q1 along the first direction Y, the first control transistor Q2 and the second control transistor Q3 are also arranged side by side along the first direction Y, that is, the distance between the first noise reduction transistor Q6 and the second noise reduction transistor Q7 and the distance between the first control transistor Q2 and the second control transistor Q3 are relatively small, the extension length of the first transfer electrode 17A in the first direction Y is larger than that in the second direction X, and therefore, the length and the width (in the second direction X) of the first transfer electrode 17A connecting these transistors are reduced, thus facilitating the realization of a narrow frame.

For example, the second transfer electrode 18A is connected to the first electrode of the voltage stabilizing transistor Q8 and the gate electrode G5A of the output transistor Q5. For example, the second transfer electrode 18A is connected to the gate electrode G5A of the output transistor Q5 through a via hole penetrating through the second insulating layer and the third insulating layer, and the second transfer electrode 18A and the first electrode of the voltage stabilizing transistor Q8 are located in the same layer (for example, both are located in the third conductive layer 340) and are integrally provided. For example, the third node NA3 includes the second transfer electrode 18A, that is, the second transfer electrode 18A serves as the third node NA3, and connects the voltage stabilizing transistor Q8 and the output transistor Q5.

For example, as illustrated in FIG. 13B, the input transistor Q1 includes a first gate electrode G1A, a second gate electrode G1'A, and connection electrodes (G11A to G13A) connecting the first gate G1A and the second gate G1'A. The connection electrodes (G11A to G13A) are located in the same layer as the first gate electrode G1A and the second gate electrode G1'A, and include a first portion G1A connected to the first gate electrode G1A and a second portion G12A connected to the second gate electrode G1'A extending along the first direction Y (e.g., the vertical direction as illustrated in FIG. 13B), and a third portion G13A which extends along the second direction X (e.g., the horizontal direction as illustrated in FIG. 13B) and connects the first portion G11A and the second portion G12A. The first gate electrode G1 and the second gate electrode G1'A of the input transistor Q1 are connected to the first clock signal line providing the first clock signal through the third portion G13A of the connection electrode to receive the first clock signal.

For example, the first gate electrode G1A and the second gate electrode G1'A are first connected together through connection electrodes (G11A to G13A) and then connected to the first clock signal line. For example, the gate electrode of the input transistor Q1 and the gate electrode of the second control transistor Q3 may be connected together and then connected to the first clock signal line as a whole. The embodiments of the present disclosure are not limited to this case.

For example, as illustrated in FIG. 12, for the first-stage shift register unit 104, the first clock signal line providing the first clock signal is the second sub-clock signal line GCB, and for the second-stage shift register unit 104, the first clock signal line providing the first clock signal is the first sub-clock signal line GCK, which is not limited by the embodiment of the present disclosure.

For example, in some examples, the second electrode of the first control transistor Q2 can be directly connected to the second sub-clock signal line GCB through the wiring line. For example, as illustrated in FIG. 13E, in other examples, the shift register unit 104 further includes a transfer electrode 15A. In this example, the second electrode of the first control transistor Q2 is not directly connected to the second sub-clock signal line GCB through the wiring line, and may also be connected to the third portion G13A of the connection electrode through the transfer electrode 15A to be connected to the second sub-clock signal line GCB at the same time as the third portion G13A of the connection electrode to receive the first clock signal. The embodiments of the present disclosure are not limited in this aspect.

For example, the active layer A11 of the input transistor Q1 is connected to the signal input electrode through the first connection wiring L1A extending in the second direction X to receive the input signal; the signal input electrode serves as the input terminal IN of the shift register unit 104, for example, the signal input electrode 13A located in the third conductive layer 340 illustrated in FIG. 13E. For example, the signal input electrode 13A may be a separately provided electrode, for example, as illustrated in the third conductive layer 340 of the first-stage shift register unit 104 illustrated in FIG. 13E, or it may be an extended region of the second electrode of the output transistor Q5 (the second electrode of the output transistor Q5 serves as the output terminal GOUT of the output circuit 1043) as the signal input electrode 13A. For example, the second electrode of the output transistor Q5 of the current-stage shift register unit 104 (i.e., the metal electrode connected to the drain region of the active layer A51 of the output transistor Q5) serves as the output terminal GOUT of the output circuit 1043, and is connected to the signal input electrode of the next-stage shift register unit 104 (e.g., the second-stage shift register unit 104) adjacent to the current-stage shift register unit 104 (e.g., the first-stage shift register unit 104) to provide the input signal of the next-stage shift register unit 104. The embodiments of the present disclosure are not limited in this aspect.

For example, as illustrated in FIG. 12, FIG. 13B and FIG. 13E, the shift register unit 104 further includes a wiring transfer electrode 12A. For example, the wiring transfer electrode 12A is located in the third conductive layer 340. For example, the wiring transfer electrode 12A and the active layer A11 of the input transistor Q1 are located in different layers, for example, the first electrode of the input transistor Q1 is electrically connected to the first end 121A of the wiring transfer electrode 12A, for example, the first electrode of the input transistor Q1 and the wiring transfer electrode 12A are located in the same layer and formed integrally. For example, the source region of the active layer A11 of the input transistor Q1 is connected to the first electrode of the input transistor Q1 through via holes penetrating through the first, second and third insulating layers, the second end 122A of the wiring transfer electrode 12A is connected to the first end L11A of the first connection wiring L1A (located in the first conductive layer 320 illustrated in FIG. 13B) which is not in the same layer and extends in the second direction X through the via hole penetrating the second insulating layer and the third insulating layer, and the second end L12A of the first connection wiring L1A extending in the second direction X is electrically connected to the signal input electrode 13A (located in the third conductive layer 340) which is not in the same layer through the via hole penetrating the second insulating layer and the third insulating layer, so as to achieve the connection of the input transistor Q1 and the input terminal IN. For example, the trace transfer electrode 12A and the signal input electrode 13A are located in the same layer.

For example, in some embodiments of the present disclosure, the active layer A21 of the first control transistor Q2 and the active layer A31 of the second control transistor Q3 are formed (i.e., integrated) by a continuous control semiconductor layer A121 that extends along the first direction Y, and the gate electrodes of the first control transistor Q2 and the second control transistor Q3 extend in parallel along the second direction X and overlap with each other in the first direction Y, i.e., the gate electrode of the first control transistor Q2 and the gate electrode G3A of the second control transistor Q3 are arranged up and down along the first direction Y. It should be noted that A111 and A121 may be named as different semiconductor layers for clarity and conciseness, such as a noise reduction semiconductor layer A111 and a control semiconductor layer A121, but it should be noted that both the noise reduction semiconductor layer A111 and the control semiconductor layer A121 are located in the same semiconductor layer 310 illustrated in FIG. 13A.

For example, as illustrated in FIG. 12 and FIG. 13B, the orthographic projection of the second control transistor Q3 on the base substrate 100 and the orthographic projection of the first control transistor Q2 on the base substrate 100 are located on both sides of the second connection sub-wiring L4A in the first direction Y. Of course, the extending direction of the gate electrode of the first control transistor Q2 and the extending direction of the gate electrode G3A of the second control transistor Q3 may not be parallel, for example, they may intersect at a certain angle, for example, the intersection angle is less than or equal to 20°, or the angle between them and the horizontal line is less than or equal to 20°. The embodiment of the present disclosure is not limited to this case.

For example, as illustrated in FIG. 12 and FIG. 13A, the active layer A21 of the first control transistor Q2 may partially overlap with the active layer A31 of the second control transistor Q3 in the first direction Y (as illustrated in FIG. 12 and FIG. 13A) or completely overlap (not shown in the figure), that is, the active layer A21 of the first control transistor Q2 may be on an imaginary line where the active layer A31 of the second control transistor Q3 extends in the first direction Y; the active layer A21 of the first control transistor Q2 may not overlap with the active layer A31 of the second control transistor Q3 in the first direction Y. For example, as illustrated in FIG. 12 and FIG. 13A, the active layer A21 of the first control transistor Q2 and the active layer A31 of the second control transistor Q3 are offset by a certain distance in the first direction Y, as long as the arrangement of other structures is not affected and the width of the shift register unit 104 is not excessively increased, further as long as the active layer A21 of the first control transistor Q2 and the active layer A31 of the second control transistor Q3 are located below the input transistor Q1 in the first direction Y. The embodiment of the present disclosure is not limited to this case.

For example, the active layer A21 of the first control transistor Q2, the active layer A31 of the second control transistor Q3, and the active layer A11 of the input transistor Q1 are arranged side by side in the second direction X. For example, in some examples, the active layer A21 of the first control transistor Q2 and the active layer A31 of the second control transistor Q3 intersect the imaginary line where the active layer A11 of the input transistor Q1 extends in the second direction X, that is, the active layer A21 of the first control transistor Q2 and the active layer A31 of the second control transistor Q3 are located on the imaginary line where the active layer A11 of the input transistor Q1 extends in the second direction X. For example, in the embodiment of the present disclosure, other transistors in the shift register unit 104 except for the first control transistor Q2 and the second control transistor Q3 are not limited, as long as the connection relationship of the circuit can be satisfied.

For example, in some embodiments of the present disclosure, the active layer A11 of the input transistor Q1 is also located on the imaginary line extending along the first direction Y of the active layer A61 of the first noise reduction transistor Q6 and the active layer A71 of the second noise reduction transistor Q7, the active layer A21 of the first control transistor Q2 and the active layer A31 of the second control transistor Q3 are arranged with respect to the active layer A61 of the first noise reduction transistor Q6 and the active layer A71 of the second noise reduction transistor Q7 side by side in the second direction X, so that the distance between the active layer A21 of the first control transistor Q2 and the active layer A31 of the second control transistor Q3 with the active layer A61 of the first noise reduction transistor Q6 and the active layer A71 of the second noise reduction transistor Q7 can be reduced.

For example, in some examples, the shift register unit 104 further includes an intermediate transfer electrode 11A. The gate electrode of the first noise reduction transistor Q6 is connected to the first electrode of the first control transistor Q2 and the first electrode of the second control transistor Q3 through the intermediate transfer electrode 11A in the second conductive layer 330 illustrated in FIG. 13C and the second connection sub-wiring L4A in FIG. 13E, that is, connected to the part between the active layer A21 of the first control transistor Q2 and the active layer A31 of the second control transistor Q3. The orthographic projection of the intermediate transfer electrode 11A on the base substrate 100 does not overlap with the orthographic projection of the active layer A21 of the first control transistor Q2 and the active layer A31 of the second control transistor Q3 on the base substrate 100 in the first direction Y, that is, the orthographic projection of the intermediate transfer electrode 11A on the base substrate 100 is located between the orthographic projection of the active layer A21 of the first control transistor Q2 and the active layer A31 of the second control transistor Q3 on the base substrate 100 and the orthographic projection of the first noise reduction transistor Q6 on the base substrate 100.

Therefore, in the embodiments of the present disclosure, the distance between the orthographic projection of the first noise reduction transistor Q6 on the base substrate 100 and the orthographic projection of the first control transistor Q2 and the second control transistor Q3 on the base substrate 100 is reduced, thereby greatly shortening the length of the wiring (i.e., the intermediate transfer electrode 11A) connecting the gate electrode of the first noise reduction transistor Q6 with the first control transistor Q2 and the second control transistor Q3, and largely alleviating the problem of space congestion caused by dense and long wiring.

For example, in some examples, the intermediate transfer electrode 11A is located in the second conductive layer 330. For example, the first insulating layer is located between the active layer A61 of the first noise reduction transistor Q6 and the gate electrode G6A of the first noise reduction transistor Q6 in the direction perpendicular to the base substrate 100; the second insulating layer is located between the gate electrode G6A of the first noise reduction transistor Q6 and the intermediate transfer electrode 11A in the direction perpendicular to the base substrate 100.

For example, in some examples, the gate electrode of the first noise reduction transistor Q6 is connected to the first end 111A of the intermediate transfer electrode 11A through a via hole penetrating the second insulating layer, and the first electrode of the first control transistor Q2 is located in the same layer as the intermediate transfer electrode 11A and connected to the second end 112A of the intermediate transfer electrode 11A, that is, the intermediate transfer electrode 11A is integrally provided with the first electrode of the first control transistor Q2, so that the gate electrode of the first noise reduction transistor Q6 is connected to the first electrode of the first control transistor Q2. The first electrode of the first control transistor Q2 is connected to the source region of the active layer A21 of the first control transistor Q2 (i.e., the first electrode of the first control transistor Q2) through a via hole penetrating the first insulating layer and the second insulating layer. For example, in some examples, the second node NA2 includes an intermediate transfer electrode 11A. It should be noted that since the first electrode of the first control transistor Q2 is connected to the first electrode of the second control transistor Q3, the first electrode of the second control transistor Q3 is also connected to the second end 112A of the intermediate transfer electrode 11A, and the embodiment of the present disclosure is not limited to this case. The following examples are the same, which will not be described again.

For example, as illustrated in FIG. 13E, in other examples, the shift register unit 104 further includes a second connection wiring, for example, the second connection wiring includes a first connection sub-wiring L3A and a second connection sub-wiring L4A. For example, the third insulating layer is located between the intermediate transfer electrode 11A and the second connection wiring L3A/L4A in the direction perpendicular to the base substrate 100.

For example, the gate electrode G6A of the first noise reduction transistor Q6 is connected to the first connection sub-wiring L3A through a via hole HE4 penetrating the second and third insulating layers, and the first end 111A of the intermediate transfer electrode 11A is connected to the first connection sub-wiring L3A through a via hole HE3 penetrating the third insulating layer.

For example, the source region of the active layer A21 of the first control transistor Q2 is connected to the first electrode of the first control transistor Q2 through a via hole HE1 penetrating through the first, second and third insulating layers, the first electrode of the first control transistor Q2 is connected to the second connection sub-wiring L4A, the first electrode of the first control transistor Q2 and the second connection sub-wiring L4A are located in the same layer and integrally formed, and the second end of the intermediate transfer electrode 11A is connected to the second connection sub-wiring L4A through a via hole HE2 penetrating through the third insulating layer, thereby realizing the connection of the gate electrode of the first noise reduction transistor Q6 and the first electrode of the first control transistor Q2.

For example, in this example, the second node NA2 includes an intermediate transfer electrode 11A and a second connection wiring.

For example, in other examples, the second connection wiring may only include the first connection sub-wiring L3A or the second connection sub-wiring L4A.

For example, in this example, the intermediate transfer electrode 11A may be located in the first conductive layer 320 and formed integrally with the gate electrode of the first noise reduction transistor Q6.

For example, the source region of the active layer A21 of the first control transistor Q2 is connected to the first electrode of the first control transistor Q2 through a via hole HE1 penetrating through the first, second and third insulating layers, the first electrode of the first control transistor Q2 is connected to the second connection sub-wiring L4A, and the first electrode of the first control transistor Q2 and the second connection sub-wiring L4A are located in the same layer and integrally provided. The second end 112A of the intermediate electrode 11A is connected to the second connection sub-wiring L4A through the via hole HE2 penetrating through the third insulating layer, thereby realizing the connection between the gate electrode of the first noise reduction transistor Q6 and the first electrode of the first control transistor Q2.

For example, in this example, the second node NA2 includes an intermediate transfer electrode 11A and a second connection sub-wiring L4A.

For example, as illustrated in FIG. 12, FIG. 13B and FIG. 13E, the fourth power line VGLA includes a protruding portion 14A protruding in the second direction X. The active layer A81 of the voltage stabilizing transistor Q8 is located between the active layer A31 of the second control transistor Q3 and the active layer A71 of the second noise reduction transistor Q7 in the second direction X, and the second electrode of the second control transistor Q3 and the gate electrode G8A of the voltage stabilizing transistor Q8 are both connected to the protruding portion 14A of the fourth power line VGLA. For example, the second electrode of the second control transistor Q3 and the protruding portion 14A of the fourth power line VGLA are located in the same layer and integrally provided. The gate electrode G8A of the voltage stabilizing transistor Q8 is connected to the protruding portion 14A of the fourth power line VGLA which is not in the same layer through, for example, a via hole penetrating the second insulating layer and the third insulating layer to receive the fourth voltage. For example, the via hole for connecting the second electrode of the second control transistor Q3 and the drain region of the active layer A31 of the second control transistor Q3, and the via hole for connecting the gate electrode G8A of the voltage regulator transistor Q8 and the protruding portion 14A overlap with different sides of the protruding portion 14A (for example, the upper side and the lower side of the protruding portion 14A along the first direction Y as illustrated in FIG. 12), for example, they are located at different opposite corners of the protruding portion 14A (for example, as illustrated in FIG. 12, overlapping with the upper left corner and the lower right corner of the protruding portion 14A in the first direction Y, respectively).

In the embodiments of the present disclosure, the first control transistor Q2 and the second control transistor Q3 are arranged up and down along the first direction Y, so that the width of the peripheral region 106 of the display substrate 10 in the second direction X can be reduced, so that the distance between other transistors (for example, the voltage stabilizing transistor Q8) and the fourth power line VGLA can be reduced. Meanwhile, since the second electrode (for example, the source electrode) of the second control transistor Q3 and the gate electrode G8A of the voltage stabilizing transistor Q8 are connected to the protruding portion 14A of the fourth power line VGLA in common, so they are closer in space, thereby reducing the wiring length and facilitating the realization of the narrow frame of the display substrate 10.

For example, as illustrated in FIG. 12 and FIG. 13C, the first and second electrodes CAE11 and CAE12 of the first capacitor CA1 include a notch, and the signal input electrode 13A connected to the first connection wiring L1A extending in the second direction X is formed in the notch of the first capacitor CA1. For example, the orthographic projection of the signal input electrode 13A on the base substrate 100 falls into the notch of the orthographic projection of the first capacitor CA1 on the base substrate 100, so that the shape of the first electrode CAE11 and the second electrode CAE12 of the first capacitor CA1 is complementary to the signal input electrode 13A, and the space of the display substrate 10 is fully utilized, thereby facilitating the narrow frame design of the display substrate 10.

It should be noted that although the shape of the first capacitor CA1 is changed, the size of the first capacitor CA1 generally does not change. For example, the size change can float up and down by 10%-20%, and its specific shape can be designed and arranged according to other structures, which is not limited by the embodiments of the present disclosure.

For example, as illustrated in FIG. 12 and FIG. 13B, the orthographic projection of the third connection wiring L2A (located in the first conductive layer 320) connecting the clock signal line (e.g., the first sub-clock signal line GCK) providing the second clock signal with the gate electrode G7A of the second noise reduction transistor Q7 on the base substrate 100 overlaps with the orthographic projection of the active layer A71 of the second noise reduction transistor Q7 on the base substrate 100 in the first direction Y, and is at least partially parallel to the gate electrode G7A of the second noise reduction transistor Q7, that is, the third connection wiring L2A passes through the side of the active layer A71 of the second noise reduction transistor Q7 away from the signal line (for example, the right side of the active layer A71 of the second noise reduction transistor Q7 as illustrated in FIG. 12).

For example, as illustrated in FIG. 12 and FIG. 13B, the third connection wiring L2A includes a third sub-connection wiring L21A and a fourth sub-connection wiring L22A, the third sub-connection wiring L21A extends in the first direction Y, and is arranged side by side in the second direction X with the orthographic projection of the active layer A71 of the second noise reduction transistor Q7 on the base substrate 100, and the fourth sub-connection wiring L22A is connected to the third sub-connection wiring L21A and extends along the second direction X.

For example, in some examples, as illustrated in FIG. 13B, the third connection wiring L2A is a gate line, that is, the third sub-connection wiring L21A and the fourth sub-connection wiring L2A are directly connected (without via hole connection) and formed integrally. For example, the fourth sub-connection wiring L22A is connected to the first sub-clock signal line GCK that provides the second clock signal.

For example, the third sub-connection wiring L21A connecting the fourth sub-connection wiring L22A with the gate electrode G7A of the second noise reduction transistor Q7 is also connected to the first electrode of the output transistor Q5 which is not in the same layer through a via hole, so as to connect the first electrode of the output transistor Q5 to the second clock signal terminal CBA. For example, the second clock signal terminal CBA is connected to the first sub-clock signal line GCK. For example, the first electrode of the output transistor Q5 is electrically connected to the third sub-connection wiring L21A, which is located on the side of the active layer A71 of the second noise reduction transistor Q7 close to the output transistor Q5. For example, the orthographic projection of the via hole on the base substrate 100 is located between the orthographic projection of the active layer A71 of the second noise reduction transistor Q7 on the base substrate 100 and the orthographic projection of the active layer of the output transistor Q5 on the base substrate 100. For example, the fourth sub-connection wiring L22A is located in the first conductive layer 320, and its orthographic projection on the base substrate 100 is located between the orthographic projection of the voltage stabilizing transistor Q8 of the X-th-stage shift register unit 104 on the base substrate 100 and the orthographic projection of the input transistor Q1 of the (X+1)-th-stage shift register unit 104 on the base substrate 100.

For example, the gate electrode G5A of the output transistor Q5 is electrically connected to the first electrode of the voltage stabilizing transistor Q8, and the second electrode of the output transistor Q5 is connected to the output terminal GOUT.

For example, in some examples, as illustrated in FIG. 12, FIG. 13B and FIG. 13D, the first electrode of the output transistor Q5 is connected to the source region of the output transistor Q5 through a via hole HE7 penetrating the first, second, and third insulating layers, and the first electrode of the output transistor Q5 is connected to the fourth connection wiring L5A. For example, the first electrode of the output transistor Q5 and the fourth connection wiring L5A are in the same layer and formed integrally. The fourth connection wiring L5A is connected to the third sub-connection wiring L21A through the via hole HE5 and the via hole HE6 penetrating the second and third insulating layers, and the third sub-connection wiring L21A is connected to the gate electrode G7A of the second noise reduction transistor Q7 and the fourth sub-connection wiring L22A, so that the first electrode of the output transistor Q5 is connected to the gate electrode G7A of the second noise reduction transistor Q7 and connected to the first sub-clock signal line GCK together to receive the second clock signal.

For example, as illustrated in FIG. 12, FIG. 13A and FIG. 13B, the active layer A41 of the output control transistor Q4 and the active layer A51 of the output transistor Q5 are formed by a first output semiconductor layer A131 and a second output semiconductor layer A141 (that is, the active layer A41 of the output control transistor Q4 and the active layer A51 of the output transistor Q5 are integrally provided) and extend along the first direction Y. For example, the active layer A41 of the output control transistor Q4 is located on the imaginary line of the active layer A51 of the output transistor Q5 in the first direction Y. For example, the active layer A41 of the output control transistor Q4 includes the upper half of the third semiconductor layer A131 and the fourth semiconductor layer A141 in the first direction Y, and the active layer A51 of the output transistor Q5 includes the lower half of the third semiconductor layer A131 and the fourth semiconductor layer A141 in the first direction Y. It should be noted that the ratio of the active layer A41 of the output control transistor Q4 and the active layer A51 of the output transistor Q5 to the third semiconductor layer A131 and the fourth semiconductor layer A141 respectively may be set according to the actual situation, and the embodiment of the present disclosure is not limited to this case.

For example, the gate electrode G4A of the output control transistor Q4 and the gate electrode G5A of the output transistor Q5 extend along the second direction X, for example, the output control transistor Q4 and the output transistor Q5 are arranged up and down along the first direction Y. For example, the gate electrode G4A of the output control transistor Q4 is located on the imaginary line of the gate electrode G5A of the output transistor Q5 in the first direction Y. For example, the first electrode of the output control transistor Q4 is electrically connected to the third power line VGHA.

In the embodiments of the present disclosure, the wiring only passes between the output transistor Q5 and the second noise reduction transistor Q7, so that the wiring complexity is reduced, the problem of space congestion is avoided, and the narrow frame design of the display substrate 10 is facilitated.

For example, in some embodiments of the present disclosure, the line width of the wiring in each layer is generally 3 microns, and the distance between lines in the same layer is greater than such as 3 microns. For example, the wiring pitch is related to the accuracy of the exposure machine, and the higher the accuracy of the exposure machine, the smaller the pitch, which can be determined according to the actual situation. The embodiment of the present disclosure is not limited to this case. In the embodiments of the present disclosure, a necessary distance must be left between lines in the same layer to avoid wiring sticking, signal short circuit or the like in the actual process.

The distance between the orthographic projection of each wiring in the first conductive layer 320 on the base substrate 100 and the orthographic projection of each wiring in the second conductive layer 330 on the base substrate 100 is generally 1.5 microns, for example, the gate electrode of the transistor in the first conductive layer 320 exceeds its active layer on the semiconductor layer 310 by more than 2 microns. For example, as illustrated in FIG. 12, the U-shaped double-gate electrode of the first transistor Q1 exceeds the strip-shaped active layer of the first transistor Q1 by, for example, more than 2 microns on both sides of the strip-shaped active layer of the first transistor Q1 in the first direction Y, for example, the length of the parts that do not overlap with the strip-shaped active layer of the first transistor Q1 (for example, the first portion G11A and the second portion G12A) in the first direction Y is more than 2 microns, which is not limited by the embodiments of the present disclosure.

For example, the distance between the orthographic projection of the active layer of each transistor in the semiconductor layer 310 on the base substrate 100 and the orthographic projection of each gate wiring in the first conductive layer 320 on the base substrate 100 is more than 1.5 microns, so that the channeling effect between the gate wiring and the active layer of each transistor in the semiconductor layer 310 can be avoided. For example, the distance between the orthographic projection of the semiconductor layer 310 on the base substrate 100 and the orthographic projection of the second conductive layer 330 on the base substrate 100 is not limited and may be overlapped. For example, in some embodiments of the present disclosure, keeping a certain distance between lines in different layers as much as possible (this distance is smaller than the distance between lines in the same layer) can reduce unnecessary overlapping and avoid interference caused by excessive parasitic capacitance.

For example, the width of each line in the third conductive layer 340 should cover the corresponding via hole, for example, which can exceed the size of the via hole (for example, the diameter of the via hole) by more than 1 micron, for example, the size of the via hole is 2.0 microns to 2.5 microns, and the width of each line in the third conductive layer 340 covering the via hole is 4 microns to 5 microns. For example, the line width of the line corresponding to the via holes of the output control transistor Q4 and the output transistor Q5 may be 1 micron above and below the size of the via hole, for example, 4.0 microns to 4.5 microns, because there are many via holes corresponding to the output control transistor Q4 and the output transistor Q5, and the width of the line in the third conductive layer 340 connecting other transistors only needs to meet the requirement of covering the via hole by more than 1 micron at the location of the via hole. For example, the line width between the via holes can be thinner.

For example, the space between the first sub-clock signal line GCK, the second sub-clock signal line GCB, the third power line VGHA, the fourth power line VGLA, and the like located in the third conductive layer 340 may be more than 3 microns, and the line widths of the first sub-clock signal line GCK and the second sub-clock signal line GCB are more than 9 microns in order to meet the driving capability requirements. The line widths of the fourth power line VGLA can be 6 microns, 9 microns or 10 microns. For example, the line width of the third power line VGHA is 10 microns, the line width of the reference voltage line Vinit is 15 microns, the fourth voltage provided by the fourth power line VGLA is generally −7V, and the reference voltage provided by the reference voltage line Vinit is −3V, because the reference voltage line Vinit needs to drive the pixel array in the whole display substrate while the third power line VGHA and the fourth power line VGLA only need to drive the gate driving circuit located in the peripheral region of the display substrate, so that the line width of the reference voltage line Vinit is a little wider than that of the third power line VGHA and the fourth power line VGLA.

For example, in some embodiments of the present disclosure, a protruding portion is provided on the fourth power line VGLA to shorten the connection wiring connecting the gate electrode G8A of the voltage stabilizing transistor Q8 and the active layer A31 of the second control transistor Q3. If the active layer A31 of the second control transistor Q3 is too long, the resistance of the doped conductor will be large. For example, in some embodiments of the present disclosure, the shape of the wiring of the first node NA1 in the third conductive layer 340 (i.e., the intermediate transfer electrode 11A) is designed to be arranged at the gap position so as not to overlap with the orthographic projection of other layers of wiring and electrodes on the base substrate 100 as much as possible, thereby avoiding crosstalk caused by wiring overlap.

It should be noted that in the embodiments of the present disclosure, for example, the first transfer electrode 17A, the second transfer electrode 18A, and the third transfer electrode 16A are located in the third conductive layer 340. For example, the first transfer electrode 17A is an electrode for connecting the input transistor Q1, the first control transistor Q2, the second noise reduction transistor Q7, and the voltage stabilizing transistor Q8 illustrated in FIG. 11A, for example, the first node NA1 includes the first transfer electrode 17A. For example, the second transfer electrode 18A is an electrode for connecting the voltage stabilizing transistor Q8 and the output transistor Q5, and the third node NA3 includes the second transfer electrode 18A. For example, the intermediate transfer electrode 11A is an electrode for connecting the first control transistor Q2, the second control transistor Q3 and the first noise reduction transistor Q6, and may be located in the second conductive layer 330 or the first conductive layer 320. For example, the wiring transfer electrode 12A is located in the first conductive layer 320, and is a transfer electrode connected to the first connecting wiring L1A located in the third conductive layer 340, or both of them are located in the same layer, which is not limited by the embodiments of the present disclosure.

Figure 14:
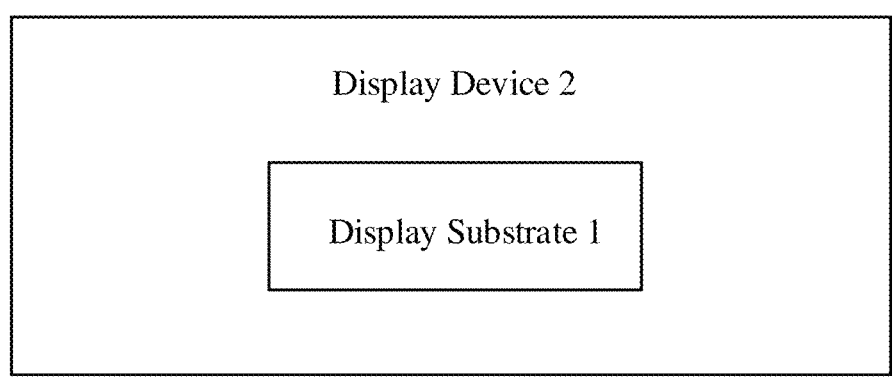
FIG. 14 is a schematic diagram of a display device provided by at least one embodiment of the present disclosure.

At least one embodiment of the present disclosure further provides a display device. FIG. 14 is a schematic diagram of a display device provided by at least one embodiment of the present disclosure. As illustrated in FIG. 14, the display device 2 includes a display substrate 1, which can be a display substrate provided by any embodiment of the present disclosure, such as the display substrate 10 illustrated in the above-mentioned FIG. 1A, FIG. 3, FIG. 6, FIG. 7, FIG. 8 or FIG. 9.

It should be noted that the display device 2 can be any product or component with display functions, such as an OLED panel, an OLED TV, a QLED panel, a QLED TV, a mobile phone, a tablet computer, a notebook computer, a digital photo frame, a navigator, etc. The display device 2 may also include other components, such as a data driving circuit, a timing controller, etc., and the embodiments of the present disclosure are not particularly limited to this case.

It should be noted that, for the sake of clarity and conciseness, the embodiments of the present disclosure do not show all the constituent units of the display device 2. To realize the basic functions of the display device 2, those skilled in the art can provide and set other structures not illustrated according to specific needs, and the embodiments of the present disclosure are not limited to this case.

For the technical effects of the display device 2 provided by the above embodiments, reference can be made to the technical effects of the display substrate provided in the embodiments of the present disclosure (for example, the above-mentioned display substrate 10 illustrated in FIG. 1A, FIG. 3, FIG. 6, FIG. 7, FIG. 8 or FIG. 9), which will not be repeated here.

Figure 15:
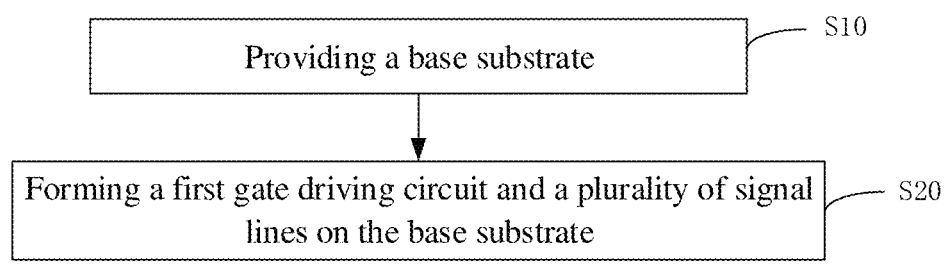
FIG. 15 is a flowchart of a manufacturing method of a display substrate provided by at least one embodiment of the present disclosure.

At least one embodiment of the present disclosure further provides a manufacturing method of the display substrate, such as the manufacturing method for the display substrate provided by any embodiment of the present disclosure. FIG. 15 is a flowchart of a manufacturing method of a display substrate provided by at least one embodiment of the present disclosure. For example, this method can be used to manufacture the display substrate provided by any embodiment of the present disclosure, such as the above-mentioned display substrate 10 illustrated in FIG. 1A, FIG. 3, FIG. 6, FIG. 7, FIG. 8 or FIG. 9.

As illustrated in FIG. 15, the manufacturing method of the display substrate includes the following steps S10 to S20.

Step S10: providing a base substrate.

Step S20: forming a first gate driving circuit and a plurality of signal lines on the base substrate.

For example, forming a semiconductor layer, a first insulating layer, a first conductive layer, a second insulating layer, a second conductive layer, a third insulating layer, a third insulating layer, a fourth insulating layer, a fourth conductive layer, and a fifth insulating layer respectively includes forming corresponding material layers (for example, a semiconductor material layer, an insulating material layer, or a conductive material layer), and then respectively forming corresponding pattern structures (for example, active layers, electrode patterns, wiring, via holes, etc.) using the patterning process. The patterning process is, for example, a photolithography process, which includes, for example, coating a photoresist layer on a material layer to be patterned, exposing the photoresist layer with a mask, developing the exposed photoresist layer to obtain a photoresist pattern, etching the structural layer with the photoresist pattern, and then optionally removing the photoresist pattern.

For example, for manufacturing the display substrate 10 illustrated in FIG. 1A, FIG. 3, FIG. 6, FIG. 7, FIG. 8 or FIG. 9, for Step S10, the base substrate 100 may be made of, for example, glass, plastic, quartz or other suitable materials, and the embodiments of the present disclosure are not particularly limited to this case.

For example, the shift register unit 105, the first power signal line VGL, the second power signal line VGH, the first clock signal line ECK, the second clock signal line ECB, and the trigger signal line ESTV are formed on the base substrate 100.

For step S20, for example, forming the first gate driving circuit and the plurality of signal lines on the base substrate includes sequentially forming the semiconductor layer 310, the first insulating layer, the first conductive layer 320, the second insulating layer, the second conductive layer 330, the third insulating layer, and the third conductive layer 340 in the direction perpendicular to the base substrate 100, and for example, continuously forming the fourth insulating layer, the fourth conductive layer 350, and the fifth insulating layer. The active layer of each transistor is located in the semiconductor layer 310, the gate electrode of each transistor and the first electrode of each capacitor are located in the first conductive layer 320, the second electrode of each capacitor is located in the second conductive layer 330, the plurality of signal lines SL105 are located at least in the third conductive layer 340, and the first and second electrodes of each transistor are located in the third conductive layer 340. For example, at least part of the first power signal line VGL, at least part of the second power signal line VGH, at least part of the first clock signal line ECK, at least part of the second clock signal line ECB, and at least part of the trigger signal line ESTV are located in the third conductive layer 340.

For example, at least a portion of the first power signal line VGL, or at least a portion of the first clock signal line ECK, or at least a portion of the second clock signal line ECB, or at least a portion of the trigger signal line ESTV may also be located in the fourth conductive layer 350.

For example, transistors and capacitors are connected to each other and to the second power signal line VGH, the first power signal line VGL, the first clock signal line ECK, the second clock signal line ECB, and the trigger signal line ESTV through via holes penetrating the first, second, or third insulating layer.

The settings of the transistors and capacitors of the shift register unit 105, the second power signal line VGH, the first power signal line VGL, the first clock signal line ECK, the second clock signal line ECB, and the trigger signal line ESTV, as well as the connection structures can refer to the corresponding descriptions in the embodiments related to the display substrate, which will not be repeated here.

It should be noted that in various embodiments of the present disclosure, the flow of the manufacturing method of the display substrate may include more or less operations, which may be executed sequentially or in parallel. Although the flow of the manufacturing method described above includes a plurality of operations occurring in a specific order, it should be clearly understood that the order of the plurality of operations is not limited. The manufacturing method described above can be performed once or multiple times according to predetermined conditions.

The technical effects of the manufacturing method of the display substrate provided in the above embodiments can refer to the technical effects of the display substrate provided in the embodiments of the present disclosure (for example, the display substrate 10 illustrated in the above-mentioned FIG. 1A, FIG. 3, FIG. 6, FIG. 7, FIG. 8 or FIG. 9), which will not be repeated here.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) In case of no conflict, the embodiments of the present disclosure and features in one embodiment or in different embodiments can be combined to obtain new embodiments.

What have been described above merely are specific implementations of the present disclosure, and the protection scope of the present disclosure is not limited thereto. The protection scope of the present disclosure should be based on the protection scope of the claims.

What is claimed is:

1. A display substrate, comprising:
   a base substrate, comprising a display region and a peripheral region on at least one side of the display region; and
   a first gate driving circuit and a plurality of signal lines electrically connected to the first gate driving circuit in the peripheral region of the base substrate,
   wherein the first gate driving circuit comprises a plurality of cascaded shift register units, and the plurality of signal lines are configured to respectively provide a trigger signal, at least one clock signal, and at least one power signal to the cascaded shift register units;
   each of the plurality of signal lines comprises a first conductive portion;
   for at least one signal line in the plurality of signal lines, the display substrate comprises a multi-layer insulating pattern on a side of the first conductive portion of each signal line away from the base substrate, and at least one insulating pattern in the multi-layer insulating pattern covers a surface of a side of the first conductive portion away from the base substrate;
   the multi-layer insulating pattern comprises at least one first insulating pattern, the first insulating pattern comprises at least one hollow, and an orthographic projection of the at least one hollow on the base substrate is at least partially in a region surrounded by an orthographic projection of the first conductive portion on the base substrate; and
   the at least one signal line in the plurality of signal lines comprises at least one clock signal line for providing the at least one clock signal, and for the at least one clock signal line, a ratio between a size of the hollow in the first direction and a size of a shift register unit in the first gate driving circuit in the first direction ranges from ¾ to 1.

2. The display substrate according to claim 1, wherein the at least one hollow comprises one or more openings penetrating the first insulating pattern.

3. The display substrate according to claim 1, wherein the orthographic projection of the at least one hollow on the base substrate is within the region surrounded by the orthographic projection of the first conductive portion on the base substrate.

4. The display substrate according to claim 1, wherein for the at least one signal line, each signal line further comprises a second conductive portion,
   the second conductive portion is on a side of the first conductive portion away from the base substrate and is configured to be electrically connected to the first conductive portion, and
   at least one insulating pattern in the multi-layer insulating pattern covers a surface of a side of the second conductive portion away from the base substrate.

5. The display substrate according to claim 4, wherein for the at least one signal line, the second conductive portion is on a side of the first insulating pattern away from the first conductive portion, and
   the second conductive portion at least partially overlaps with the at least one hollow in the first insulating pattern in a direction perpendicular to the base substrate.

6. The display substrate according to claim 5, wherein the orthographic projection of the at least one hollow on the base substrate is in a region surrounded by an orthographic projection of the second conductive portion on the base substrate.

7. The display substrate according to claim 4, wherein for the at least one signal line, an orthographic projection of the second conductive portion on the base substrate is within the region surrounded by the orthographic projection of the first conductive portion on the base substrate.

8. The display substrate according to claim 1, wherein the at least one hollow in the first insulating pattern comprises a plurality of hollows, and the plurality of hollows are arranged in parallel and spaced apart from each other along an extending direction of each signal line on the base substrate.

9. The display substrate according to claim 8, wherein each signal line extends on the base substrate approximately in a first direction, and a ratio between a size of the hollow in the first direction and a size of a shift register unit in the first gate driving circuit in the first direction ranges from ¼ to 1.

10. The display substrate according to claim 8, wherein in a plane parallel to a main surface of the base substrate, a size of the hollow in a second direction different from the first direction is greater than or equal to 2 microns.

11. The display substrate according to claim 1, further comprising a second gate driving circuit in the peripheral region of the base substrate and at least one output signal transmitting line electrically connected to the second gate driving circuit,
   wherein an orthographic projection of the plurality of signal lines on the base substrate is between an orthographic projection of the first gate driving circuit on the base substrate and an orthographic projection of the second gate driving circuit on the base substrate,
   the at least one output signal transmitting line is configured to transmit an output signal of the second gate driving circuit to the display region, and
   each output signal transmitting line is insulated from any one of the plurality of signal lines.

12. The display substrate according to claim 11, wherein the second gate driving circuit is on a side of the first gate driving circuit away from the display region.

13. The display substrate according to claim 11, wherein the first conductive portion in each signal line and the at least one output signal transmitting line are respectively in different conductive layers of the display substrate.

14. The display substrate according to claim 11, wherein an orthographic projection of each of the at least one output signal transmitting line on the base substrate has no overlapping part with an orthographic projection of any one of the at least one hollow on the base substrate.

15. The display substrate according to claim 1, wherein the plurality of signal lines comprise a trigger signal line and at least one power signal line;
   the trigger signal line is configured to be connected to a first-stage shift register unit in the plurality of cascaded shift register units to provide the trigger signal to the first-stage shift register unit; and
   the at least one power signal line is configured to provide the at least one power signal to the plurality of cascaded shift register units.

16. The display substrate according to claim 15, wherein the at least one clock signal line comprises a first clock signal line and a second clock signal line, and the first clock signal line and the second clock signal line are respectively configured to provide a first clock signal or a second clock signal to respective shift register units; and
   the trigger signal line, the first clock signal line, and the second clock signal line respectively extend along a first direction on the base substrate and are arranged in parallel along a second direction different from the first direction.

17. The display substrate according to claim 16, wherein an orthographic projection of the trigger signal line on the base substrate is on a side of an orthographic projection of the first clock signal line and the second clock signal line on the base substrate away from the display region;
   the at least one signal line among the plurality of signal lines further comprises the trigger signal line; and
   for the trigger signal line, a ratio between a size of the hollow in the first direction and a size of a shift register unit in the first gate driving circuit in the first direction ranges from ⅓ to ½.

18. The display substrate according to claim 16, wherein a ratio between a width of the first clock signal line in the second direction and a width of the trigger signal line in the second direction is greater than or equal to 1 and less than or equal to 3, and
   a ratio between a width of the second clock signal line in the second direction and a width of the trigger signal line in the second direction is greater than or equal to 1 and less than or equal to 3.

19. The display substrate according to claim 16, wherein an orthographic projection of the at least one power signal line on the base substrate is on a side of an orthographic projection of the first clock signal line and the second clock signal line on the base substrate close to the display region;
   the at least one power signal line comprises a first power signal line extending in the first direction,
   the orthographic projection of the first clock signal line and the second clock signal line on the base substrate is on a side of an orthographic projection of the first gate driving circuit on the base substrate away from the display region, and
   an orthographic projection of the first power signal line on the base substrate is between the orthographic projection of the first gate driving circuit on the base substrate and the orthographic projection of the first clock signal line and the second clock signal line on the base substrate; and
   a ratio between a width of the first clock signal line in the second direction and a width of the first power signal line in the second direction is greater than or equal to 1 and less than or equal to 3, and
   a ratio between a width of the second clock signal line in the second direction and a width of the first power signal line in the second direction is greater than or equal to 1 and less than or equal to 3.

20. The display substrate according to claim 1, wherein a material of the first insulating pattern comprises an organic insulating material.

* * * * *